(12) United States Patent
Fujihara et al.

(10) Patent No.: US 7,267,883 B2
(45) Date of Patent: Sep. 11, 2007

(54) POLYIMIDE FILM AND LAMINATE HAVING METAL LAYER AND SAME

(75) Inventors: Kan Fujihara, Otsu (JP); Kazuhiro Ono, Otsu (JP); Kiyokazu Akahori, Otsu (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 10/667,134

(22) Filed: Sep. 19, 2003

(65) Prior Publication Data

US 2004/0097694 A1 May 20, 2004

(30) Foreign Application Priority Data

| Sep. 25, 2002 | (JP) | ............................. 2002-280018 |
| Sep. 27, 2002 | (JP) | ............................. 2002-283941 |
| Dec. 20, 2002 | (JP) | ............................. 2002-370978 |

(51) Int. Cl.
*B32B 27/06* (2006.01)
*B32B 15/08* (2006.01)

(52) U.S. Cl. .................... 428/473.5; 428/458; 528/170

(58) Field of Classification Search ............. 428/473.5, 428/457, 458; 528/170, 176, 183, 184, 185
See application file for complete search history.

(56) References Cited

U.S. PATENT DOCUMENTS

| 4,426,253 | A |   | 1/1984  | Kreuz et al. |
| 4,568,715 | A |   | 2/1986  | Itatani et al. |
| 5,081,229 | A | * | 1/1992  | Akahori et al. ............. 528/353 |
| 5,166,308 | A |   | 11/1992 | Kreuz et al. |
| 5,203,955 | A |   | 4/1993  | Viehbeck et al. |
| 5,668,247 | A |   | 9/1997  | Furutani et al. |
| 6,340,518 | B1 |  | 1/2002  | Kitahara et al. |
| 6,350,844 | B1 |  | 2/2002  | Ono et al. |
| 6,555,238 | B2 |  | 4/2003  | Uhara et al. |
| 2004/0067349 | A1 | | 4/2004 | Okamura et al. |

FOREIGN PATENT DOCUMENTS

| CN | 85 1 03494 |   | 11/1986 |
| JP | 05-078503 |   | 3/1993 |
| JP | 05-202206 |   | 8/1993 |
| JP | 09-235373 |   | 9/1997 |
| JP | 10-097081 |   | 4/1998 |
| JP | 11-054862 |   | 2/1999 |
| JP | 11-054864 |   | 2/1999 |
| JP | 2000-159887 |   | 6/2000 |
| JP | 2000297163 A | * | 10/2000 |
| JP | 2001-072781 |   | 3/2001 |
| JP | 2001-270034 |   | 10/2001 |
| WO | 02/064363 |   | 8/2002 |

OTHER PUBLICATIONS

Yamada, et al., "Relationship between Structure and Singl Lap Shear Strength of Thermoplastic Polyimides (1)", Japanese Adhesion Society Proceedings, vol. 32, No. 9 (1996), pp. 346-353 (ABSTRACT).

* cited by examiner

*Primary Examiner*—Thao Tran
(74) *Attorney, Agent, or Firm*—Hogan & Hartson LLP

(57) ABSTRACT

A polyimide film of the present invention is a polyimide film having a dynamic viscoelasticity whose tan δ peak is located in a range of not less than 310° C. but not more than 410° C., and whose tan δ value at 300° C. is not more than 0.05, or a polyimide film prepared by copolymerizing (a) an acid dianhydride component including a biphenyltetracarboxylic dianhydride and a pyromellitic dianhydride, and (b) a diamine component, and the polyimide film having such an etching speed that one side thereof is etched with a 1N potassium hydroxide solution at an etching speed of 0.1 μm/minute (one side) or higher. The polyimide film of the present invention possesses film properties that are necessary for use in an electronic raw material for flexible printed circuit boards and the like, and is suitable as an electronic raw material.

23 Claims, 3 Drawing Sheets

POLYIMIDE FILM AND LAMINATE HAVING METAL LAYER AND SAME

FIELD OF THE INVENTION

The present invention relates to a polyimide film that can be suitably used as an electronic material for a flexible printed circuit board, a base film for use in semiconductor packages such as a COF (Chip On Film: semiconductor devices are packaged directly on printed wiring board), a TAB (Tape Automated Bonding) tape, a base film for use in a high density recording medium, a laminate having a metal layer and a polyimide film by using PVD (Physical Vapor Deposition) methods, and the like. The PVD methods include thermal evaporation, electron beam deposition, inductive and/or resistive deposition, ion plating, sputtering, plasma-activated evaporation, reactive evaporation, and activated reactive evaporation, and chemical vapor deposition (CVD). More specifically, the present invention relates to a polyimide film having a low thermal shrinkage rate at a temperature of 300° C., more particularly to a polyimide film having not only a low thermal shrinkage rate at a temperature of 300° C., but also a low coefficient of hygroscopic expansion and water absorption percentage (water absorption in percentage of total weight).

Moreover, the present invention relates to a polyimide film that is very suitable for alkali etching process, and highly stable against harsh environment. More particularly, the present invention relates to a polyimide film that shows a high peel strength in an interface with a metal layer directly laminated thereon, and that retains, with a high retention rates, the peel strength after thermal aging process and after harsh environmental exposure.

Further, the present invention relates to laminate having a metal layer and a polyimide film in which metal layer is formed on the polyimide film.

BACKGROUND OF THE INVENTION

In the electronics field, conventionally, there is a wide use of polyimide resins having various excellent properties, such as high heat resistance, high electric insulating property, and the like. For example, such polyimide resins are used in flexible printed circuit boards, polyimide films for use in semiconductor packages such as, TAB tapes, base films for high-density recording media, laminates having a metal layer and a polyimide film by using PVD methods, and the like. Other than as films, the polyimide resins are used in various forms, such as molded solid forms, coating agents, and the like. In case of the polyimide films, the polyimide films have been used not only solely, but also as a laminate. Such laminates are prepared by: (a) bonding copper foil on a polyimide film via an adhesive agent; (b) metallizing copper directly on the polyimide film by using a sputtering method or the like and then performing electrolytic plating of copper thereon, or (c) casting the polyimide resin on copper foil, or coating the copper foil with the polyimide.

For example, when the polyimide films are used for flexible printed circuit boards, polyimide films for use in semiconductor packages such as COFs, TAB tapes, base films for high-density recording media, laminate having a metal layer and a polyimide film, and the like, the polyimide films should be prepared with high dimensional stability in order to attain necessary properties for the use. For the flexible printed circuit boards, TAB tapes and the like, the polyimide film that has been expanded in heating is bonded with the metal layer via the adhesive agent while still being expanded. For laminates having a metal layer and a polyimide film by using PVD (Physical Vapor Deposition methods, metal is vacuum deposited on a surface of the polyimide film by an evaporative deposition method or a sputtering method. In those cases, therefore, thermal shrinkage is caused after cooling the thus prepared laminate having a metal layer and the polyimide film, thereby causing dimensional changes of the laminate, or residual stress in adhering the metal and the polyimide film causes dimensional changes of the laminate in etching the copper foil. Such dimensional changes lead to misalignment between a copper foil pattern and a circuit pattern. The copper foil pattern being to be associated with an electric/electronic component when the electric/electronic component is mounted after circuit formation and mounting of an IC (integrated circuit) or an LSI (Large Scale Integration), and the circuit pattern being to be associated with a flexible wiring substrate.

In mounting the IC and LSI, the polyimide film on which a metal wiring is formed is soaked, together with the IC and LSI, into a solder bath of a high temperature (about 300° C.) (reflow-soldering step). When the polyimide film is exposed to a high temperature as such, misalignment is caused between the circuit pattern and the wiring pattern of the electric/electronic components (wiring section of the IC and LSI). In response to recent increase in environmental consciousness among companies, use of lead-free solder, which contains no lead and has a high melting point, has been increased, whereby thermal shrinkage property of polyimide film at high temperatures has become a great concern. Because of this, as a target of thermal shrinkage at a high temperature, it is desired that the polyimide has a low thermal shrinkage rate at a temperature of 300° C., for example.

Further, when the polyimide film is exposed to a high temperature in the reflow soldering process, hygroscopic moisture inside the polyimide film is evaporated off from the inside of the polyimide film, the evaporation of the moisture causes such problem that in a polyimide film on which metal is laminated, and the like, foam is produced on that surface of the polyimide film, which faces the metal, a polyimide film having a low coefficient of hygroscopic expansion, and a small water absorption, has been sought for prevention of this problem.

For example, Japanese Publication of Unexamined Patent Application, Tokukai, No. 2001-270034 (published on Oct. 2, 2001) (Publication 1) discloses a thermo compression bonding polyimide film whose thermal shrinkage rate at 300° C. is 0.1% or less. Publication 1 reads that it is possible to use a highly heat tolerant aromatic polyimide film made of pyromellitic acid, paraphenylenediamne, and 4,4'-diaminodiphenyl ether. However, the art described in Publication 1 requires that a thermoplastic resin be laminated on a surface of the polyimide film. However, it is difficult to perform the laminating in a general manufacturing process of polyimide film. Thus, a special manufacturing apparatus for performing the laminating is necessary. Further, in the polyimide film, on the surface of which the thermoplastic resin is laminated, it is a problem that the thermoplastic resin has a high water absorption percentage and a high coefficient of hygroscopic expansion. Further, it is also a problem that the thermoplastic resin is poorly heat tolerant (heat susceptible). Moreover, there has been no art that found and discuss a correlation of thermal shrinkage with (a) a temperature of the film (film temperature) when the film is at tan δ peak, and (b) a tan δ value of the film at 300° C., in order to have a small thermal shrinkage at 300° C.

Moreover, the recent improvement of electronic raw materials and apparatuses requires that the polyimide films for use therein have not only the basic properties such as heat resistance, inductiveness, solvent resistance, but also more complicate various properties.

One of such more complicate various properties is high stability against harsh environments. A main body of the polyimide film should be highly stable against harsh environments (harsh environment), because the polyimide film may be used in a harsh environment. For example, when used in a circuit substrate inside an automobile, or used for covering wiring inside an automobile, the polyimide film is exposed to a high-temperature and highly moist environment. When used for covering wring inside an aero plane, the polyimide film is exposed to an environment in which temperature is largely changed. Here, the stability of the main body of the film against harsh environments refers to, for example, stability against changes (both increase and decrease) in temperatures, stability against a harsh environment such as a high-temperature and highly moist condition, and the like.

Meanwhile, the metal laminated wiring board having a fine pattern, such as a flexible wiring board, is recently so processed that not only the surface of the polyimide film is fabricated so as to form a metal wiring layer thereon, but also the polyimide film itself is finely fabricated. For this reason, it is recently required that the polyimide film itself be suitable for such fine fabrication.

There are various methods of finely fabricating the polyimide film. Examples of such methods of finely fabricating the polyimide film are: stamping (blanking) process; plasma etching process; laser cutting process, alkali etching process, and the like. The alkali etching process, in which the polyimide film is processed with an alkali etching solution, draws an attention because the alkali etching process has low cost, needs only simple facility, and fabrication thereby is so easy.

Conventionally, most of such polyimide films have slow dissolution rate with respect to the alkali etching solution. Thus, there have been studies on use of an alkali etching solution that increases the dissolution rate of the polyimide film in order to improve efficiency of the etching of the polyimide film. Further, for example there have been studied on use of a special alkali etching solution that improves the alkali etching rate. (For example, Japanese Publication of Unexamined Patent Application, Tokukaihei, No. 5-202206 (published on Aug. 10, 1993) (Publication 2), Japanese Publication of Unexamined Patent Application, Tokukaihei, No. 10-97081 (published on Apr. 14, 1998) (Publication 3)). However, no study has been conducted on the polyimide film itself in order to improve efficiency of the etching of the polyimide film. Especially, no study has been carried out, for example, on a polyimide film having an improved alkali etching rate for an alkali etching solution having a low alkali concentration, such as a 1N potassium hydroxide.

On the other hand, Japanese Publication of Unexamined Patent Application, Tokukaihei, No. 5-78503 (published on Mar. 30, 1993) (Publication 4) discloses a polyimide film using biphenyl tetracarboxylic dianhydride and pyromellitic dianhydride. Although Publication 4 notes alkali etching property of this polyimide film, the alkali-etching property thereof is not sufficient. More specifically, an alkali etching rate of this polyimide film is slow with respect to a low-alkali etching solution (having low alkali concentration). Therefore, it is necessary to select an alkali etching solution that is suitable for the polyimide.

Moreover, the recent improvement in the electronic raw materials and electronic apparatuses requires that the polyimide film for use therein be so tolerable against heat and tension that its dimension will not be changed much due to heat and tension. In short, as the electric/electronic apparatuses are downsized, the flexible printed circuit board for use therein should have finer wiring patters accordingly. As a result, polyimide film having no large dimensional change is required. The lower the coefficient of linear expansion, the smaller the heat-causing dimensional change. And, the higher the modulus of elasticity, the smaller the tension-causing dimensional change.

Generally speaking, in order to produce a polyimide film having a high modulus of elasticity and a low coefficient of linear expansion, a monomer containing pyromellitic dianhydride, paraphenylene diamine, or the like is used, for example. Such monomers have high rigidity and linearity. However, a polyimide film prepared from such monomers is so poor in flexibility and a flexible printed circuit board using the polyimide film is not flexible, even though the flexibility is an essential property of the flexible printed circuit board Moreover, besides the poor flexibility, such film has a high water absorption percentage and a high coefficient of hygroscopic expansion. In addition, for use in a semiconductor package, for example, the polyimide film should have a low water absorption percentage and a low coefficient of hygroscopic expansion, besides the properties discussed above.

Furthermore, recently wiring patterns on the polyimide films for use in the flexible printed circuit boards is so fabricated as to be finer. This requires a polyimide film to have such an arrangement that a thin metal film, on which such a fine pattern can be formed, is laminated thereon. Conventionally, the most popular method is to laminate a thin copper foil on a surface of polyimide film via an adhesive agent such as a thermoplastic polyimide-type adhesive agent or an epoxy-type adhesive agent, and the like. However, according to this method, it is difficult to laminate, on the surface of the polyimide film, a thin copper film that is suitable for forming the fine pattern thereon. Such lamination is necessary to satisfy the above-mentioned requirement for forming the fine patterns.

In view of this, a method of manufacturing a laminate having a metal layer and the polyimide film is getting popular recently. In this method, a thin metal film is formed on a surface of the polyimide film by using a sputtering apparatus or a metal vapor depositing apparatus. Then, on top of the thin metal film, copper is plated by using gold as a catalyst, so that copper is laminated thereon. By adopting this method, it is possible to have a metal layer of an arbitrary thickness such as a thickness of less than 1 µm, and a thickness of more than several ten µm. Especially, with this method, it is possible to manufacture a metal layer having an optimum thickness for forming the fine pattern, because a thin laminated film can be realized according to this method.

However, in case where such method of performing vapor deposition or sputtering vapor deposition of metal is adopted, (a) a peel strength at an interface between the metal and the metal layer formed on the polyimide film and (b) a peel strength at an interface between the metal layer and the polyimide film are varied depending on which type of the polyimide film is used or which composition the polyimide film has. In general, therefore, the surface of the polyimide film is modified, as pretreatment prior to the vapor deposition and sputtering of the metal. Examples of the pretreatment are an NaOH treatment, a plasma treatment under vacuum, a plasma treatment under normal pressure, a corona treatment under normal pressure, a sand blast treatment, and the like. However, there is such a drawback that such pretreatment requires a large-scaled apparatus. Further, even though such surface modification is very effective for improving initial peel strength, such surface modification damages the surface of the polyimide film, whereby, the peel strength cannot be maintained stably for a long period. Therefore, there is a strong demand for a polyimide film capable of giving a higher peel strength at an interface of metal and itself, the peel strength maintained even after the surface modification and stably maintained for a long period.

A number of studies have been conducted intensively, in order to obtain a polyimide film having a high modulus of elasticity, a low coefficient of linear expansion, a low water absorption percentage, and a low coefficient of hygroscopic expansion. In order to obtain such polyimide film, for example, it has been studied to produce a polyimide film from a long-chained monomer so that the polyimide film contains a less number of imide groups in its molecular structure.

Japanese Publication of Unexamined Patent Application, Tokukaihei, No. 11-54862 (published on Feb. 26, 1999) (Publication 5) and Japanese Publication of Unexamined Patent Application, Tokukai, No. 2001-72781 (published on Mar. 21, 2001) (Publication 6) disclose polyimide films produced from a p-phenylene bis(trimellitic monoester anhydride). The polyimide films have a low water absorption percentage and a low coefficient of hygroscopic expansion. However, the polyimide films described in Publications 5 and 6 show poor stability in harsh environment resistance tests. Especially, it is a problem that metal adhesive strengths of the polyimide films cannot be retained (poor retention rate of the metal adhesive strength), in case metal is directly laminated on the polyimide films.

Further, Publication 4 and Publication 7, namely, Japanese Publication of Unexamined Patent Application, Tokukaihei, No. 9-235373 (published on Sep. 9, 1997), disclose polyimide films prepared from biphenyl tetracarboxylic dianhydride, pyromellitic dianhydride, p-phenylenediamine, and 4,4'-diaminodiphenyl ether. However, Publications 4 and 7, which discuss about the water absorption percentage, lack description on coefficient of hygroscopic expansion. Publications 4 and 7 face such problems that their polyimide films have a high coefficient of linear expansion at a high temperature.

As discussed thus far, there has been no polyimide film satisfactorily having a low coefficient of hygroscopic expansion, a low coefficient of linear expansion, a high modulus of elasticity, a good metal adhesiveness (property to be adhered with metal), and a good metal adhesion after harsh environment resistance test (property to retain the property to be adhered with metal, even after exposed to a harsh environment).

SUMMARY OF THE INVENTION

The present invention, which has been contrived in view of the aforementioned problems, has an object to provide a polyimide film suitable as an electronic raw material for use in a flexible printed circuit board, a base film for (a) semiconductor packages such as a COF, a TAB tape, (b) a base film for a high density recording medium, (c) laminate having a metal layer and a polyimide film by using PVD (Physical Vapor Deposition) methods (d) the like.

More specifically, the present invention has an object to provide a polyimide film having a low thermal shrinkage rate at a temperature of 300° C., or having an improved alkali etching property and high stability against harsh environment. Furthermore, the present invention also provides a polyimide film having a low coefficient of hygroscopic expansion, a low coefficient of linear expansion, a high modulus of elasticity, a good metal adhesiveness, and a good metal adhesiveness after harsh environment resistance test.

The inventors of the present invention conducted intensive studies on a method of manufacturing a polyimide film compatibly having various excellent properties that are conventionally incompatible. As a result of the intensive studies, the inventors of the present invention found how to attain a polyimide film having excellent properties, thereby accomplishing the present invention. The polyimide film, for example, has properties (1) to (3) listed below:

(1) A polyimide film having a low thermal shrinkage rate at 300° C.;

(2) A polyimide film compatibly having a fast alkali-etching speed and a long-term stability against harsh environment, on contrary to of a conventional polyimide film in which a fast alkali-etching speed is incompatible with stability against harsh environment; and (3) A polyimide film produced from a polyamic acid that is prepared as a precursor of the polyimide film by reacting five or more monomers, whereby the polyimide film compatibly has various properties that has been incompatible conventionally.

More specifically, a first polyimide film of the present invention has a dynamic viscoelasticity whose tan δ peak is located in a range of not less than 310° C. but not more than 410° C., and whose tan δ value at 300° C. is not more than 0.05.

The polyimide film is, specifically, a polyimide film prepared by copolymerizing an acid dianhydride component and a diamine component, the acid dianhydride component including a pyromellitic dianhydride represented by General Formula (1):

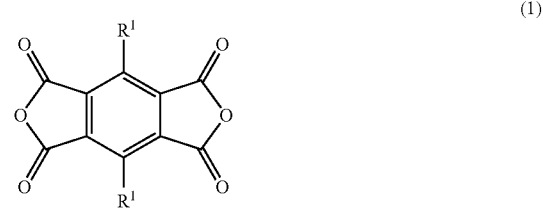

(where $R^1$ is a residue selected from a group consisting of H—, $CH_3$—, $CF_3$—, Cl—, Br—, F—, and $CH_3O$—, and $R^1$ may be the same residues or different residues); and the diamine component including a paraphenylene diamine and a diaminodiphenyl ether, the paraphenylene diamine being represented by Equation (2):

(where R² is a bivalent aromatic group selected from a group consisting of:

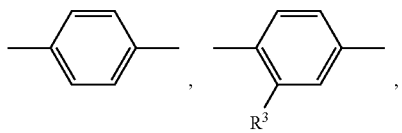

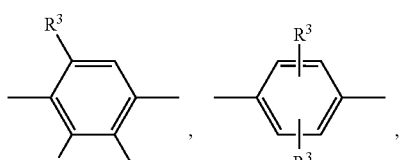

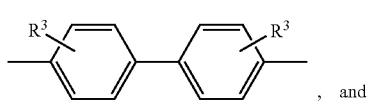

, and

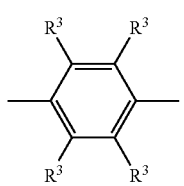

and each R³ in the group is independently any one of —H, —CH₃, —OH, —CF₃, —SO₄, —COOH, —CO—NH₂, —Cl, —Br, —F, and —OCH₃), and the diaminodiphenyl ether being represented by General Formula (3):

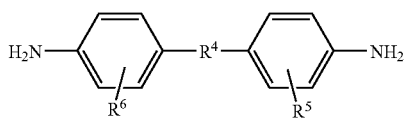

(where R⁴ is a bivalent organic group selected from a group consisting of:

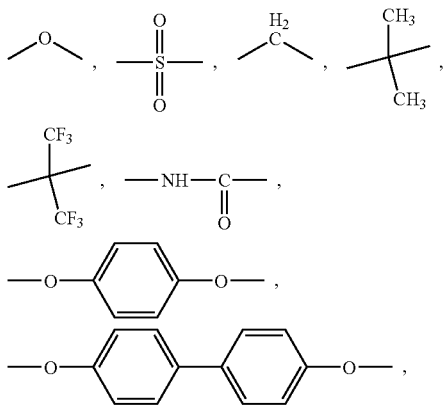

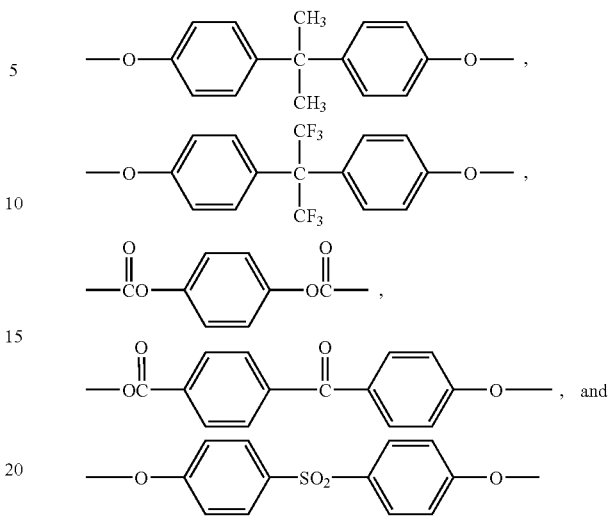

and each R⁵ in the group is independently any one of —H, —CH₃, —OH, —CF₃, —SO₄, —COOH, —CO—NH₂, —Cl, —Br, —F, and —OCH₃).

With this arrangement, it is possible to provide a polyimide film having a low thermal shrinkage at 300° C., for example, it is possible to provide a polyimide film whose thermal shrinkage at 300° C. is 0.3% or less. The first polyimide film is suitable for use in electronic raw materials for flexible printed circuit boards, base films for semiconductor packages such as COF, TAB tapes, base films for high density recording media, and laminates having a metal layer and a polyimide film by using PVD methods, and the like, because the first polyimide film has such low thermal shrinkage rate at such a high temperature, namely, 300° C., and further has such low coefficient of hygroscopic expansion and such low water absorption.

Moreover, a second polyimide film of the present invention is a polyimide film having the properties described in (2). That is, the second polyimide film of the present invention is a polyimide film prepared by copolymerizing an acid dianhydride component and a diamine component, the acid dianhydride component including a pyromellitic dianhydride represented by General Formula (1):

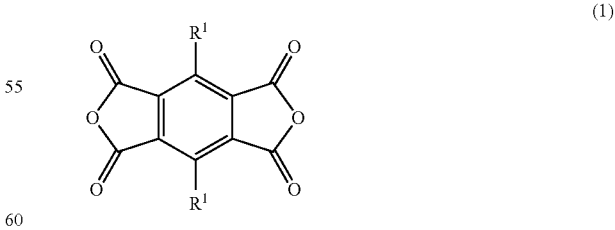

(where R¹ is a residue selected from a group consisting of H—, CH₃—, CF₃—, Cl—, Br—, F—, and CH₃O—, and R¹ may be the same residues or different residues), the biphenyl tetracarboxylic dianhydride being represented by General Formula (5):

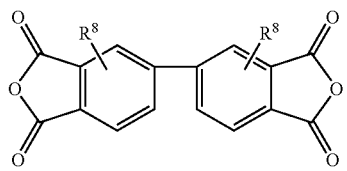

(where $R^8$ is a residue selected from a group consisting of H—, $CH_3$—, Cl—, Br—, F— and $CH_3O$—, and $R^8$ may be the same residues or the different residues).

The polyimide film having such an etching speed that one side thereof is etched with a 1N potassium hydroxide solution at an etching speed of 0.1 μm/minute (one side) or higher.

The second polyimide film includes the biphenyl tetracarboxylic dianhydride. Because of this, the second polyimide film compatibly has a sufficient long-terms stability against harsh environment. It should be noted that it is firstly found by the present inventors that the inclusion of the biphenyl tetracarboxylic dianhydride in the polyimide film gives the polyimide film such a long-term stability against harsh environment. With this arrangement, the polyimide film is suitable for use in electronic raw materials for flexible printed circuit boards, base films for semiconductor packages such as COF, TAB tapes, base films for high density recording media, and laminates having a metal layer and a polyimide film by using PVD methods, and the like.

More specifically, the second polyimide film may be so arranged that the acid dianhydride component includes the pyromellitic dianhydride, represented by the above General Formula (1), in a range of from 30 mole % to 99.9 mole %, the biphenyl tetracarboxylic dianhydride, represented by the above General Formula (5), in a range of from 0.1 mole % to 50 mole %, and the bis(trimellitic monoester anhydride), represented by the following General Formula (4), in a range of from 10 mole % to 50 mole %, and the diamine component includes the paraphenylene diamine, represented by the following General Formula (2), in a range of from 15 mole % to 85 mole %, and diaminodiphenyl ether, represented by the following General Formula (3), in a range of from 15 mole % to 85 mole %, where General Formula (2) is:

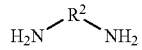

(where $R^2$ is a bivalent aromatic group selected from a group consisting of:

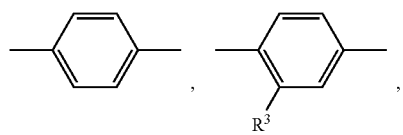

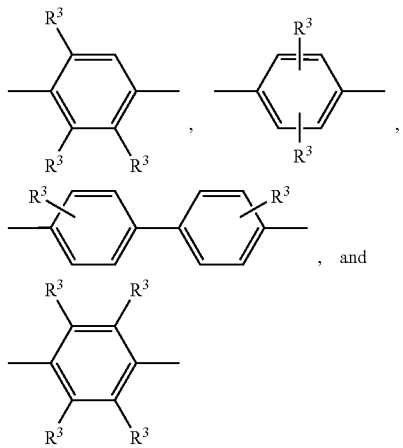

and each $R^3$ in the group is independently any one of —H, —$CH_3$, —OH, —$CF_3$, —$SO_4$, —COOH, —CO—$NH_2$, —Cl, —Br, —F, and —$OCH_3$);

General Formula (3) is:

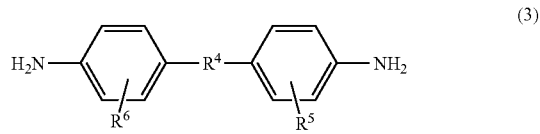

(where $R^4$ is a bivalent organic group selected from a group consisting of:

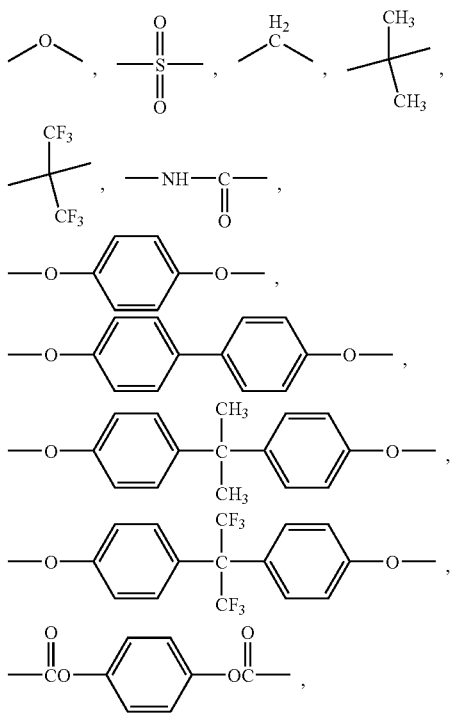

-continued

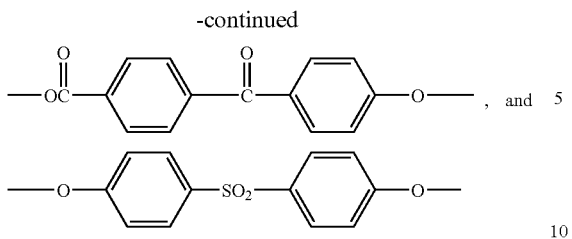, and

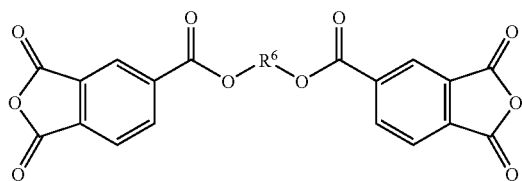

and each $R^5$ in the group is independently any one of —H, —CH$_3$, —OH, —CF$_3$, —SO$_4$, —COOH, —CO—NH$_2$, —Cl, —Br, —F, and —OCH$_3$); and General Formula (4) is:

(4)

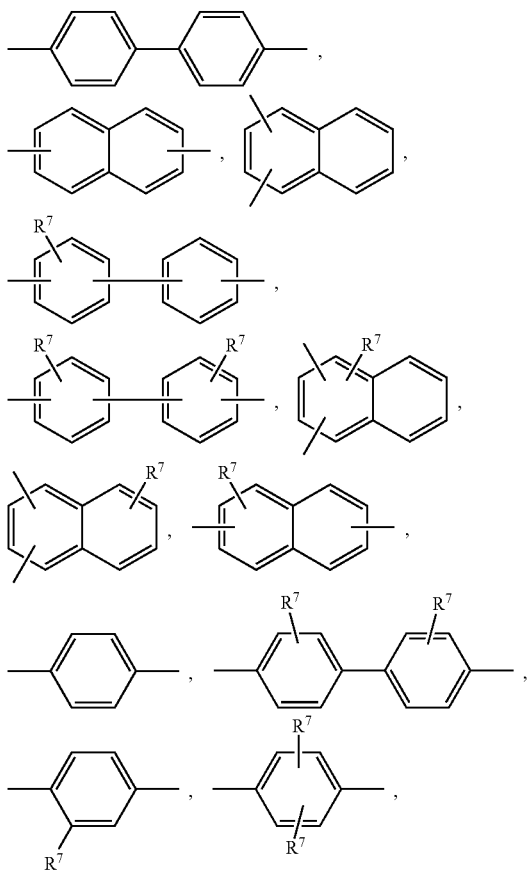

where $R^6$ is a bivalent organic group selected from a group consisting of:

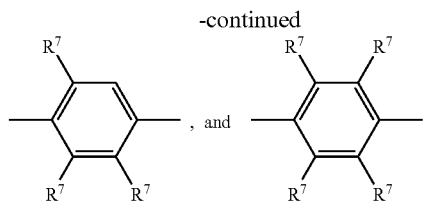, and and each $R^7$ is independently any one of —H, —CH$_3$, —OH, —CF$_3$, —SO$_4$, —COOH, and —CO—NH$_2$).

Moreover, a third polyimide film of the present invention is a polyimide film having the properties described in (3). Specifically, the third polyimide film of the present invention is a polyimide film prepared by copolymerizing an acid anhydride component and a diamine component, and arranged such that the acid dianhydride component includes the pyromellitic dianhydride in a range of from 40 mole % to 80.0 mole %, the biphenyl tetracarboxylic dianhydride in a range of from 1 mole % to 40 mole %, and bis(trimellitic monoester anhydride) in a range of from 20 mole % to 50 mole %, and the diamine component includes the paraphenylene diamine in a range of from 25 mole % to 75 mole %, and diaminodiphenyl ether in a range of from 25 mole % to 75 mole %.

The third polyimide film has a low coefficient of hygroscopic expansion, a high modulus of elasticity, a low coefficient of linear expansion, and a high adhesive strength with respect to metal when the film is directly laminated on metal. Those properties have been incompatible conventionally. Further, the polyimide film can have a good retention rate of the adhesive strength after harsh environmental resistance test and/or thermal aging process (temperature aging).

It should be noted that the polyimide film of the present invention may include, solely or in combination, a compound or compounds belonging to the pyromellitic dianhydrides mentioned above. Similarly, the polyimide film of the present invention includes, solely or in combination, a compound or compounds belonging to the biphenyl tetracarboxylic dianhydrides mentioned above, a compound or compound belonging to the bis(trimellitic monoester anhydride)s mentioned above, a compound or compounds belonging to the paraphenylene diamines mentioned above, a compound or compounds belonging to the diaminodiphenyl ethers mentioned above.

Moreover, laminate having a metal layer and a polyimide film of the present invention includes any one of the polyimide film of the present invention.

For a fuller understanding of the nature and advantages of the invention, reference should be made to the ensuing detailed description taken in conjunction with the accompanying drawings.

DESCRIPTION OF THE EMBODIMENTS

Described below are embodiments of the present invention. Note that the present invention is not limited to those embodiments.

First Embodiment

A first embodiment describes a first polyimide film of the present invention.

Recently there is a demand for a polyimide film having a low thermal shrinkage rate at a high temperature (300° C.), for preventing imperfect connecting in wiring due to heat that is applied in mounting a precision electric apparatus, such as an IC and an LSI, directly on a polyimide film wired board. Thus, for the present invention, in order to attain a polyimide film having a small thermal shrinkage ratio, intensive studies have been carried out, focusing on a relationship between (a) the thermal shrinkage of the film at a temperature of 300° C. and (b) tan δ peak and tan δ value at 300° C. of dynamic viscoelasticity of the polyimide film. As a result of the intensive studies, it is found that a desirably small thermal shrinkage at the temperature of 300° C. can be attained by arranged such that the tan δ peak of dynamic viscoelasticity of the polyimide film is located in a range of not less than 310° C. but not more than 410° C., and tan δ value at 300° C. of the polyimide film is not more than 0.05.

Tan δ Peak

In the present invention, tan δ is a value obtained by measuring a dynamic viscoelastic movement of the polyimide film. The dynamic viscoelastic behavior is measured as follows: a piece of 9 mm width×40 mm height, as a sample, is cut out from the polyimide film, and then the pieces is set on an instrument called DMS 200 (Dynamic Mechanical Spectroscopy 200; made by Seiko Electronic Co. Ltd.). The measurement is carried out in a tension mode under the following conditions described below. The sample of the polyimide film may be cut along either an MD (Machine Draw) direction or a TD (Traverse Draw) direction, where the MD direction is a direction along which the film is transported and the TD direction is a direction that is perpendicular to the MD direction.

[Measurement Conditions]
Profile Temperature: from 20° C. to 400° C. (at a rate of temperature elevation: 3° C./min)
Frequency: 5 Hz
Lamp.: 20 μm
F base (Minimum tension during the measurement): 0 g
F Ogain 3.0

Figure 1:
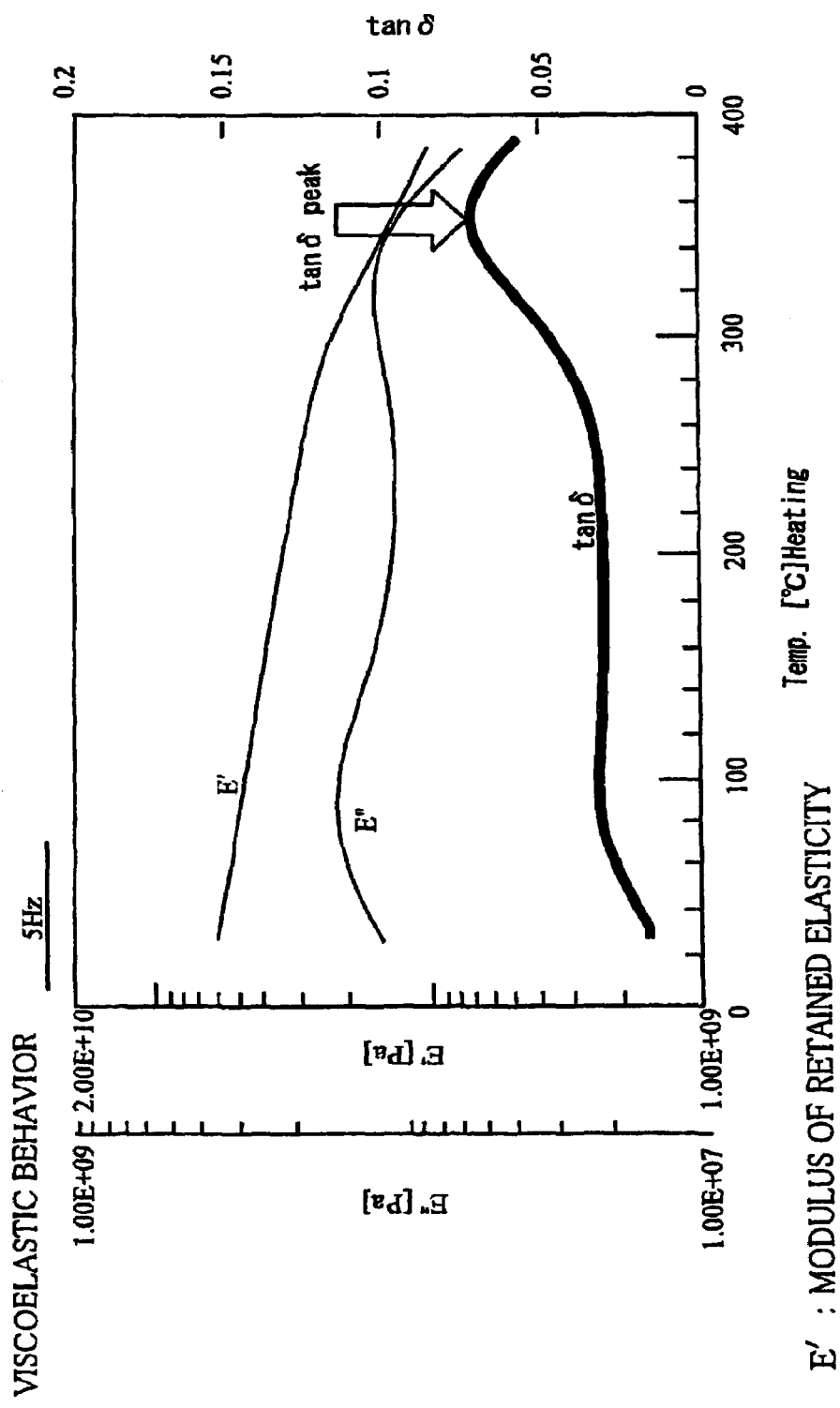
FIG. 1 is a graph showing an example of results of measurements of viscoelastic behavior of a polyimide film against temperature changes, the measurement being for calculating out tan δ peak of the viscoelastic behavior of a polyimide film of the present invention.

The measurement under the above measurement conditions gives a modulus of retained elasticity E' and a modulus of lost elasticity E" at each temperature in the profile temperature. The tan δ value is calculated by dividing the modulus of lost elasticity E" by the modulus of retained E' (that is, tan δ=E"/E'). The tan δ peak is a highest value among values of the tan δ thus obtained. FIG. 1 shows an example of dynamic viscoelasticity of the polyimide film of the present invention measured as such. Some of polyimide films have more than two injection points. In case of such polyimide films, a point at which the highest value of tan δ value is regarded as the tan δ peak. Note that it is preferable to use a polyimide film having not more than one tan δ peak at temperatures not more than 300° C.

The polyimide film of the present embodiment is so arranged that its tan δ peak, which is measured as described above, is located in a range of not less than 310° C. but not more than 410° C. The tan δ peak is preferably located in a range between 320° C. and 400° C., and more preferably in a range between 330° C. and 390° C. The polyimide film whose tan δ peak located in those ranges can have a low thermal shrinkage rate at 300° C. (that is, such polyimide film is not significantly shrieked at a temperature of 300° C.). Such polyimide film is suitable as a heat resistant electronic raw material for flexible printed circuit boards, base films for COFs, TAB tapes and base films for high density recording media.

Tan δ Value at 300° C.

In the present invention, the tan δ value at 300° C. is a value calculated out from two tan δ values by using the following equation, the two tan δ values measured at temperatures of 180° C. and 300° C. by the above-mentioned measurement method, where the tan δ value at 180° C. is considered as a base line:

"tan δ value at 300° C."=(tan δ value measured at 300° C.)−(tan δ value measured at 180° C.)

The polyimide film of the present embodiment is so arranged that its "tan δ value at 300° C." is not more than 0.05. In the polyimide film, the "tan δ value at 300° C." is preferably not more than 0.040, and more preferably not more than 0.038. With this arrangement, it is possible to further reduce the thermal shrinkage rate at a high temperature (300° C.).

Thermal Shrinkage Rate at 300° C.

The following explains the "thermal shrinkage rate at 300° C." of the present invention.

Firstly, a piece is cut, as a sample, out of the polyimide film by cutting the polyimide film by 13 cm in the TD direction and 25 cm in the MD direction (here, the direction of the film cut by 13 cm is referred to as the TD direction whereas the direction of the film cut by 25 cm is referred to as the MD direction). Then, the sample is left for 24 hours in a room in which a temperature of 20° C. and a relative humidity of 60% RH are maintained. After that, four edges of the film are measured. Those two of the four edges that are in the TD direction are respectively referred to as TD1 and TD2, whereas those two of the four edges that are in the MD direction are respectively referred to as MD1 and MD2.

After measuring the lengths of the edges, the film is left in an oven at a temperature of 300° C. The film is covered with an aluminum foil so that the heat is diffused throughout the whole film. Before heating the film, it is checked that the film is placed without overlapping on itself.

After the heating, the film thus heated is left for 30 minutes again in the room in which a temperature of 20° C. and a relative humidity of 60% RH are maintained. Then, the lengths of the four edges are measured. Among the four edges, these two edges in the TD direction are respectively referred to as TD1' and TD2', whereas these two edges in the MD directions are respectively referred to as MD1' and MD2'.

The thermal shrinkage rate at 300° C. (the thermal shrinkage percentages in the TD direction and the MD direction) is obtained by the following equations:

Thermal Shrinkage Rate (%) in the TD direction=
{(TD1−TD1')/TD1+(TD2−TD2')/TD2}/2×100, Thermal Shrinkage Rate (%) in the MD direction=
{(MD1−MD1')/MD1+(MD2−MD2')/MD2}/2×100.

The thermal shrinkage percentages in the TD direction and the MD direction, thus obtained are referred to as the thermal shrinkage rate at 300° C. In short, to have a low thermal shrinkage rate at 300° C. means that both the thermal shrinkage percentages in the TD direction and the MD direction are small at 300° C.

The polyimide film of the present embodiment preferably has a thermal shrinkage rate at 300° C. of 0.3%, more preferably of 0.25%. By having such thermal shrinkage rate in those ranges, the shrinkage rate of the film is within a acceptable range even if the film is heated in mounting, on a fine wiring, an electronic compartment such as an IC or an LSI. This lowers the possibility of imperfect connection of wiring, thereby improving yield ratio.

[Monomers to Compose Polyimide Film]

Monomers constituting the first polyimide film of the present invention is not particularly limited. However as to the polyimide film of the present embodiment, which is one example of the first polyimide film, it is preferable that the polyimide film of the present embodiment is a polyimide film made by copolymerizing an acid dianhydride component and a diamine component.

Here, the pyromellitic dianhydrides discussed above are aromatic tetracarboxylic compounds having a structure containing two dicarboxylic anhydrides represented by the following general formula (1):

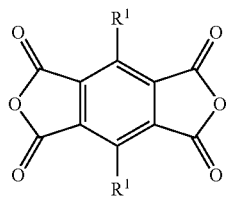

(1)

(where $R^1$ is a residue selected from a group consisting of H—, $CH_3$—, $CF_3$—, Cl—, Br—, F—, and $CH_3O$—, and $R^1$ may be the same residues or different residues).

Especially, pyromellitic dianhydride is specially preferable among the pyromellitic dianhydrides.

Moreover, the paraphenylene diamines discussed above are diamine compounds having a structure represented by the following general formula (2):

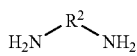

(2)

(where $R^2$ is a bivalent aromatic group selected from a group consisting of:

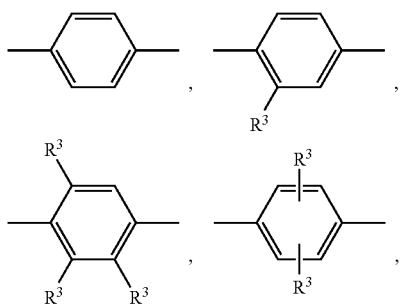

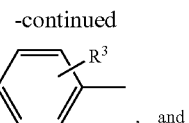

, and

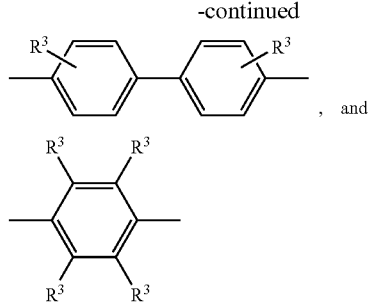

and each $R^3$ in the group is independently any one of —H, —$CH_3$, —OH, —$CF_3$, —$SO_4$, —COOH, —CO—$NH_2$, —Cl, —Br, —F, and —$OCH_3$).

Moreover, the diaminodiphenyl ethers are diamine compounds having a structure represented by the following General Formula (3):

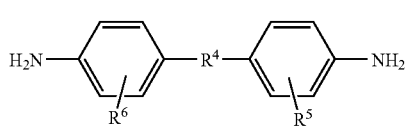

(3)

(where $R^4$ is a bivalent organic group selected from a group consisting of:

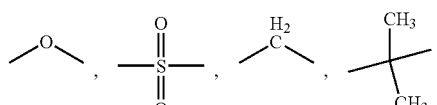

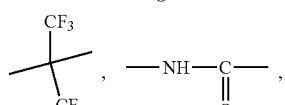

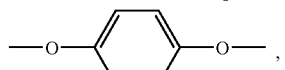

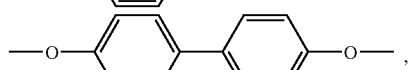

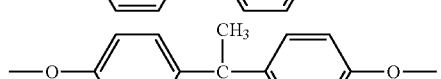

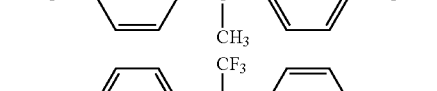

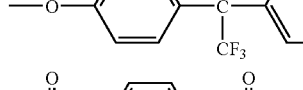

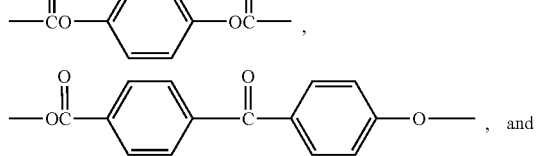

, and

-continued

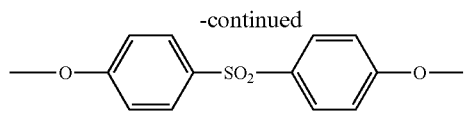

and each $R^5$ in the group is independently any one of —H, —CH$_3$, —OH, —CF$_3$, —SO$_4$, —COOH, —CO—NH$_2$, —Cl, —Br, —F, and —OCH$_3$).

Among the paraphenylene diamines, paraphenylene diamine is particularly preferably used. Whereas, among the diaminodiphenyl ethers, 4,4'-diaminodiphenyl ether is particularly preferably used.

Moreover, it is preferable that the acid dianhydride component includes a pyromellitic dianhydride by 5 to 90 mole %. The film in which the mole % of the pyromellitic dianhydride is less than the above ratio, has a poor modulus of elasticity, whereas the film in which the mole % of the pyromellitic dianhydride is greater than the above ratio, has an excessively high coefficient of hygroscopic expansion. Therefore, it is preferable that the mole % of the pyromellitic dianhydride is within this range. It is more preferable that the pyromellitic dianhydride in the acid dianhydride component is in a range of from 40 mole % to 80 mole %. Further, it is further preferable that the pyromellitic dianhydride in the acid dianhydride component is in a range of from 50 mole % to 75 mole %. An excessively high content of the pyromellitic dianhydride tends to attain a higher tan δ peak. Therefore, in order to produce a heat resistive polyimide film, it is preferable that the content of the pyromellitic dianhydride is high.

On the other hand, it is preferable that the diamine component includes a paraphenylene diamine in a ratio of 25 mole % to 75 mole % per the total diamine component. It is more preferable that the diamine component includes the paraphenylene diamine by 35 mole % to 65 mole % per the total diamine component. It is preferable that the diamine component includes a diaminodiphenyl ether in a ratio of 25 mole % to 75 mole % per the total diamine component. It is more preferable that the diamine component includes the diaminodiphenyl ether in a ratio of 35 mole % to 65 mole % per the total diamine component.

When the paraphenylene diamine and the diaminophenyl ether are contained in the diamine component in ratios falling within the above ranges, the film has a high modulus of elasticity, a low coefficient of linear expansion, and a low coefficient of hygroscopic expansion. Such polyimide film of the present embodiment is very useful as an electronic raw material for flexible printed circuit board, base films for semiconductor packages such as COFs, TAB tapes, base films for high-density recording media, laminate, and the like.

Furthermore, the polyimide film of the present embodiment is preferably arranged such that the acid dianhydride component includes bis(trimellitic monoester anhydride) represented by the following general formula (4) and/or biphenyl tetracarboxylic dianhydride represented by the following general formula (5).

General Formula (4):

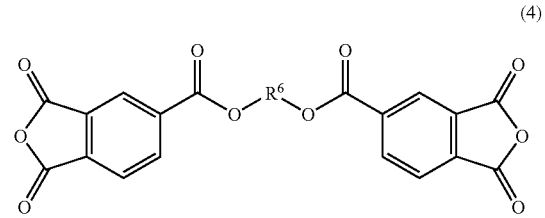

where $R^6$ is a bivalent organic group selected from a group consisting of:

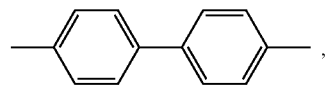

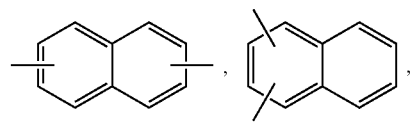

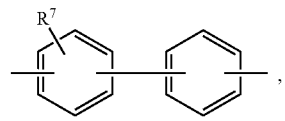

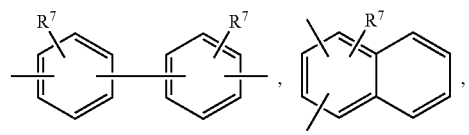

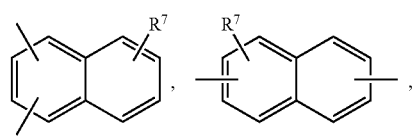

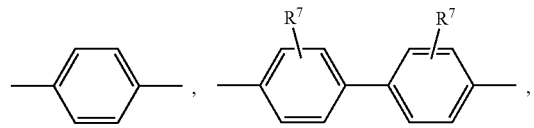

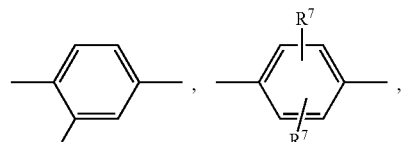

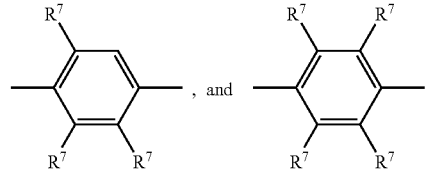

and each $R^7$ is independently any one of —H, —CH$_3$, —OH, —CF$_3$, —SO$_4$, —COOH, and —CO—NH$_2$); and General Formula (5):

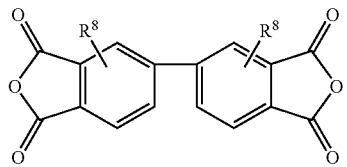

(5)

(where $R^8$ is a residue selected from a group consisting of H—, CH$_3$—, Cl—, Br—, F— and CH$_3$O—, and $R^8$ may be the same residues or the different residues).

With this arrangement in which bis(trimellitic monoester anhydride)s and/or biphenyl tetracarboxylic dianhydrides are used, it is possible to attain a polyimide film having a low coefficient of hygroscopic expansion and a low water absorption percentage. Further, by having such a low coefficient of hygroscopic expansion and a low water absorption percentage, the polyimide film has an improved solder heat resistance (heat resistance in soldering; that is, the polyimide film is improved to be less susceptible to heat in soldering and able to be soldered without significant size changes and water evaporations therefrom).

Note that the coefficient of hygroscopic expansion is determined by using the following calculation method and measuring instrument.

(1) Calculation Method of the Coefficient of Hygroscopic Expansion

Figure 2:
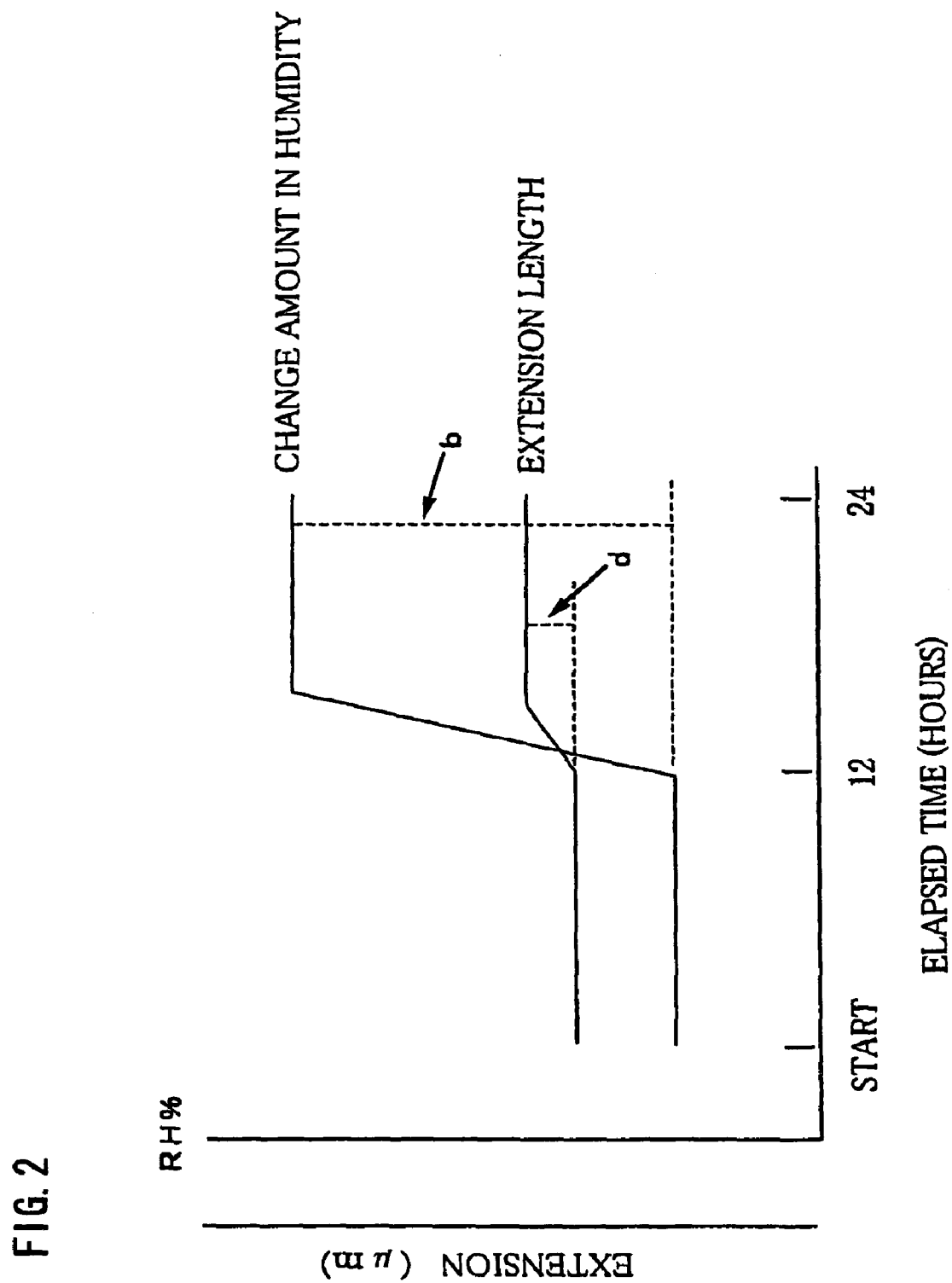
FIG. 2 is a graph for explaining how to measure a coefficient of hygroscopic expansion of the polyimide film of the present invention, the graph showing relationship between a humidity and extension of the polyimide film

To begin with, a humidity extension rate (extension percentage due to humidity) is obtained. Specifically, while humidity is being changed as shown in FIG. 2, an amount of change in humidity (humidity change amount) and extension percentage of the polyimide film are measured at the same time. The humidity extension rate is calculated from the following equation:

Humidity extension rate = {Hygroscopic Extension Amount($d$) ÷

(Initial Sample Length)} ÷

Humidity Change Amount($b$).

From the humidity expansion rate thus calculated out, the coefficient of hygroscopic expansion is calculated by using the following equation:

Coefficient of Hygroscopic Expansion={Humidity extension rate}×10$^6$, where the humidity change amount is 50% RH (lowest humidity is 30% RH, where as highest humidity is 80% RH). Moreover, a 5 mm×20 mm sample is cut out from the polyimide film. An amount of extension of the sample (d) is measured with 3 g weight applied thereon.

Figure 3:
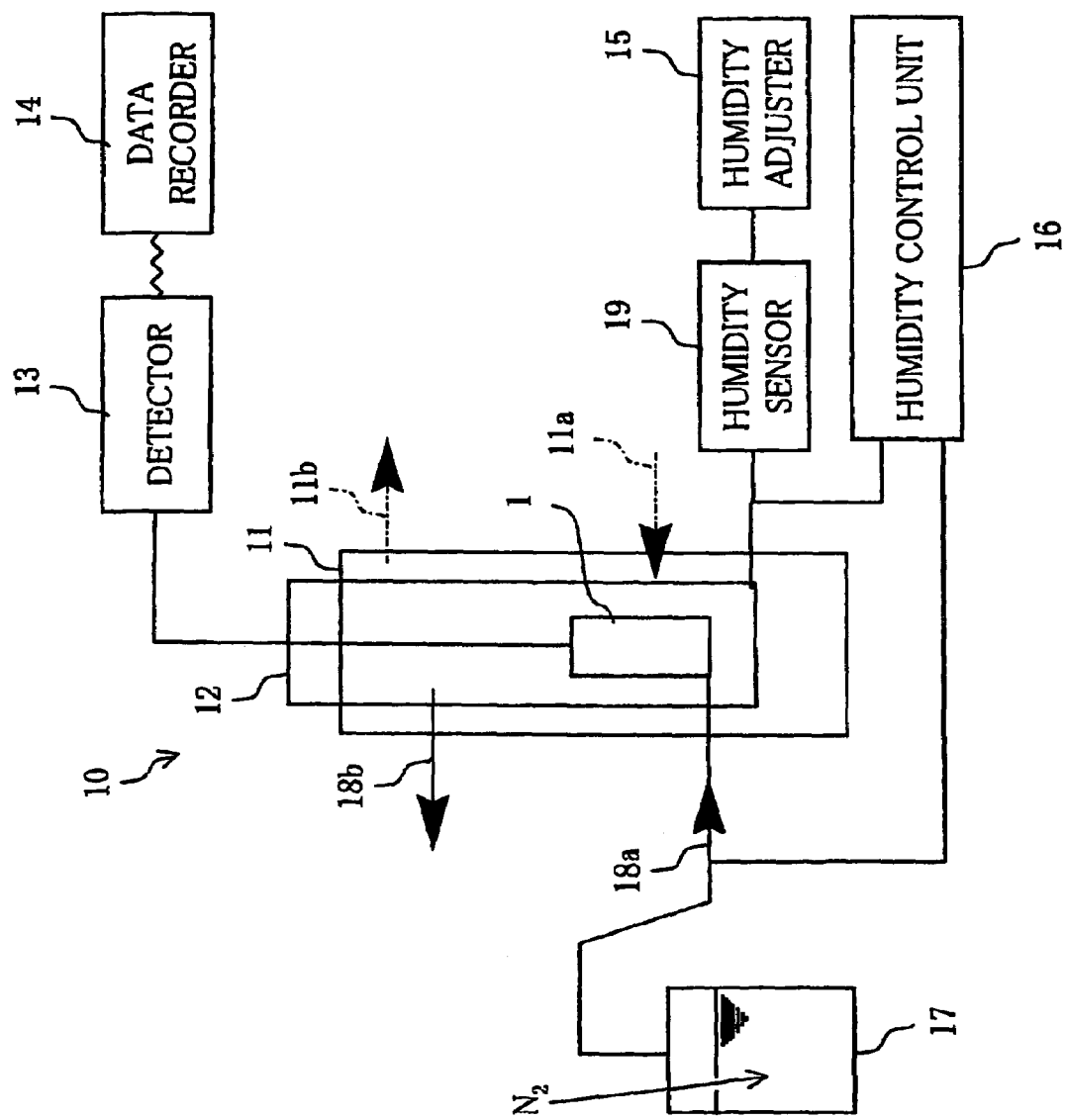
FIG. 3 is a schematic diagram illustrating a measuring instrument for the coefficient of hygroscopic expansion of the polyimide film of the present invention.

(2) Brief Explanation on Measuring Instrument (See FIG. 3)

As schematically shown in FIG. 3, a measuring instrument 10 for measuring the coefficient of hygroscopic expansion is provided with a hot bath 11, hot water tubes 11$a$ and 11$b$, a thermostat 12, a detector 13, a data recorder 14, a humidity adjuster 15, a humidity control unit 16, a water vapor generating apparatus 17, water vapor tubes 18$a$ and 18$b$, and a humidity sensor 19.

The hot water bath 11 controls a temperature in measuring the coefficient of hygroscopic expansion (that is, the hot water bath 11 performs temperature controls during the measurement of the coefficient of hygroscopic expansion). The temperature of the hot water bath 11 is kept at 50° C. The temperature control is carried out by supplying hot water from the hot water tube 11$a$ into the hot water bath 11, and discharging the hot water from the hot water tube 11$b$, as indicated by the chain arrows.

The thermostat 12 is located inside the hot water bath 11. The thermostat 12 is connected with the humidity adjuster 15, the humidity control unit 16, and the humidity sensor 19. Furthermore, the thermostat 12 is connected with the water vapor generating apparatus 17 via the water vapor tubes 18$a$ and 18$b$. With this arrangement, it is possible to add humidity inside the thermostat 12 while a polyimide film of a sample 1 is placed inside the thermostat 12.

The detector 13 detects an extension amounts of the sample 1 (how much the sample 1 is extended). A detector that is well known and publicly used can be used as the detector 13. The data recorder 14 records a result of detection as to how much the sample 1 is extended. A data recorder that is well known and publicly used can be used as the data recorder 14.

With the humidity adjuster 15, the humidity control unit 16, and the humidity sensor 19, a humidity condition inside the thermostat 12 is controlled. Specifically, the humidity condition is controlled by a programmed heating performed by using a mantle heater (which is attached under stream generator 17). A temperature of the humidity sensor 19 is so controlled as to be the same as a temperature of the thermostat 12. The temperature of the humidity sensor 19 is measured at a waist part of the humidity sensor 19, the waist part located outside of the thermostat 12.

The water vapor generating apparatus 17 generates water vapor by nitrogen introduced via a tube indicated by "N$_2$" in FIG. 3. Then, via the water vapor tube 18$a$ indicated by the continuous line arrow, thus generated water vapor is supplied into the thermostat 12 in accordance with the humidity adjuster 15 and the humidity control unit 16, so as to add humidity inside the thermostat 12. Note that the water vapor is discharged through the water vapor tube 18$b$.

There is no particular limitation as to the hot water bath 11, the hot water tubes 11$a$ and 11$b$, the thermostat 12, the detector 13, the data recorder 14, the humidity adjuster 15, the humidity control unit 16, the water vapor generating apparatus 17, the water vapor tubes 18$a$ and 18$b$, the humidity sensor 19, and the like. It is possible to use a bath that is well known and publicly used, as the hot water bath 11. As the detector 13 for measuring the length (extension) of the polyimide film, TMA (Thermo mechanical Analyzer; TMC-140) manufactured by Shimadzu Corporation, may be used.

If the coefficient of hygroscopic expansion of the polyimide film is low, it is possible to suppress the dimensional change of the film in a heating process for manufacturing laminate having the metal layer and the polyimide film, and in an etching/washing/drying process for manufacturing a copper-layered laminated polyimide film. Therefore, it is preferable that the polyimide film has the low coefficient of hygroscopic expansion, (a) for realizing fine line circuit on the polyimide film in order to have finely fabricated and/or highly dense metal wiring and (b) for attaining higher reliability of the fine line circuits.

In the reflow soldering step, a method of soaking a film, which has been subjected to dehumidification or moisture absorption, into a bath of solder is adopted for mounting an IC and the like. Therefore, imperfect connection is reduced by a smaller dimensional change in the polyimide film during the dehumidification and the moisture absorption. Therefore, a polyimide film having a lower coefficient of hygroscopic expansion is desirable. For this reason, the coefficient of hygroscopic expansion is preferably 16 ppm/% RH or less, more preferably 12 ppm/% RH or less, and further preferably 11 ppm/% RH or less.

The water absorption percentage of the polyimide film of the present invention is determined by the following method.

Firstly, the polyimide film is dried at 150° C. for 30 minutes. A weight of the polyimide film thus dried is measured. The weight of the polyimide film thus measured is referred to as W1. Then, the polyimide film is soaked in distilled water for 24 hours. After the soaking, water droplets are wiped off from surfaces of the polyimide film. A weight of the thus treated polyimide film is measured again. The weight thus measured is referred to as W2. From the weights W1 and W2, the water absorption percentage is calculated out by using the following equation:

Water absorption percentage (%)={(W2−W1)/W1}× 100.

A low water absorption percentage favorably affects the soldering heat resistance of the polyimide film, whereby the polyimide film has improved soldering heat resistance in a normal condition and improved soldering heat resistance after the moisture absorption. Specifically, the water absorption percentage is preferably 2.0% or less, more preferably 1.8% or less, and further preferably 1.5% or less.

Note that the polyimide film of the present embodiment is preferably arranged such that an acid dianhydride component includes the bis(trimellitic monoester anhydride) described above in a ratio of from 20 mole % to 40 mole %.

Further, the polyimide film of the present embodiment is particularly preferably arranged such that the bis(trimellitic monoester anhydride) is p-phenylene bis(trimellitic monoester anhydride). In order to attain a low coefficient of hygroscopic expansion, and the tan δ peak in measuring the dynamic viscoelastic behavior is located in a range of not less than 310° C. but not more than 410° C., the bis (trimellitic monoester anhydride) used is preferably in a range between 5 mole % and 50 mole %, more preferably in a range between 10 mole % and 50 mole %, and further preferably in a range between 20 mole % and 40 mole %.

Moreover, in thepolyimide film of the present embodiment, the acid dianhydride component includes the biphenyl tetracarboxylic dianhydride contained preferably in a ratio of from 0 mole % to 50 mole %, more preferably in a ratio of from 0 mole % to 35 mole %, and further preferably in a ratio of 0 mole % to 20 mole %. With this arrangement, it is possible to provide the polyimide film with a low coefficient of hygroscopic expansion and a low water absorption percentage, and a tan δ peak located in a range of not less than 310° C. but not more than 410° C. Further, with this arrangement, it is possible to attain a polyimide film whose thermal shrinkage rate at 300° C. is not more than 0.3%.

Further, the polyimide film of the present embodiment is particularly preferably arranged such that the biphenyl tetracarboxylic dianhydride is 3,3',4,4'-biphenyl tetracarboxylic dianhydride.

Moreover, as long as property of the polyimide film is not deteriorated, it is possible to use, solely or in combination, a compound or compounds belonging to tetracarboxylic dianhydrides, such as 3,3',4,4'-biphenyl tetracarboxylic dianhydride 3,3',4,4'-benzophenontetracarboxylic dianhydride (BTDA), oxydiphthalic dianhydride, diphenyl sulfone-3,4,3',4'-tetracarboxylic dianhydride, 4,4'-(2,2'-hexafluoroisopropyridine)diphthalic dianhydride, m-ter-phenyl-3,4, 3',4'-tetracarboxylic dianhydride, p-ter-phenyl-3,4,3',4'-tetracarboxylic dianhydride, cycloebutan-1,2,3,4-tetracarboxylic dianhydride, 1-carboxymethyl-2,3,5-cyclopentanetricarboxylic-2,6,3,5,-dianhydride, in addition to 3,3',4,4'-biphenyl tetracarboxylic dianhydride.

[Manufacturing Method of Polyimide Film]

Next, a manufacturing method of the polyimide film of the present embodiment is explained.

For producing the polyimide film of the present embodiment, to begin with, the acid dianhydride component and the diamine component are approximately equimolarly reacted in an organic solvent (the acid dianhydride component and the diamine component which are equimolar are reacted), so as to produce a polyamic acid solution, which is a polyimide precursor (a precursor of the polyimide). A catalyst and a dehydrating agent are added in the polyamic acid solution. Then, the polyamic acid solution is flow-cast on a supporter so as to obtain a partially imidized and/or partially dried polyamic acid film (gel film) that is firm enough to support itself. Thereafter, the gel film is held at its edges, and dried and heated, so as to produce the polyimide film. Alternatively, the polyimide film may be produced from flow-casting the polyamic acid on the supporter so as to obtain a gel film, and then drying and heating the gel film held at its edges.

For producing the polyamic acid solution, a mixing ratio of the acid dianhydride component to the diamine component is preferably in a range of from 0.90 to 1.05. If the mixing ratio is less than 0.90, viscosity of the polyamic acid solution will not be increased, thereby making it difficult to form the polyimide film from the polyamic acid solution. If the mixing ratio is higher than 1.05, excess aromatic tetracarboxylic dianhydride, which is the acid dianhydride component, remains in the polyamic acid solution. A polyimide film prepared from such polyamic acid solution in which excess aromatic tetracarboxylic dianhydride remained, has a carboxylic acid-caused problems in using the film.

For example, a large amount of carboxylic acid remains in the polyimide film causes such a problem that hydrolysis of the polyimide film is accelerated, thereby deteriorating stability of the polyimide film. In order to avoid this problem, it is preferable that the acid dianhydride component and the diamine component are approximately equimolar to each other.

Examples of the organic solvent Lo use in polymerization of the polyamic acid arc: (a) ureas such as tetramethyl urea, N,N-dimethylethyl urea, and the like, (b) sulfones such as dimethyl sulfoxide, diphenyl sulfone, tetramethyl sulfone, and the like, (c) amides such as N,N-dimethyl acetamide (DMAc), N,N-dimethyl formamide (DMF), N-methyl-2-pyroridone (NMP), γ-butyl lacton, hexamethyl phosphoric triamide and the like, (d) non-protone solvent of phosphoryl amides, (e) alkyl halides such as chloroform, methylene chloride, and the like, (f) aromatic hydrocarbons, such as benzene, toluene, and the like (g) phenols such as phenol, cresol, and the like, and (h) ethers such as dimethyl ether, diethyl ether, p-cresol methyl ether, and the like.

Those solvents are usually used solely. However, if necessary, it is possible to use two or more of those solvents in combination. Among those, the amides such as DMF, DMAc, NMP and the like are suitably used.

Furthermore, for easy handling, it is preferable that the polyamic acid produced in the organic solvent is dissolved, in the organic solvent, preferably in a ratio of from 5 wt % to 40 wt %, and more preferably in a ratio of from 13 wt % to 25 wt %. Note that it is preferable for better film property that average molecular weight of the polyamic acid is 10000 or more, in terms of PEG (polyethylene glycol) of GPC.

Moreover, the polyamic acid solution has a viscosity preferably of not less than 50 Pa·s but not more than 1000 Pa·s, more preferably of not less than 100 Pa·s but not more than 500 Pa·s, and further preferably of not less than 200 Pa·s but not more than 350 Pa·s. The polyamic acid solution having a viscosity in those ranges, is easy to handle in forming the film. Note that the viscosity is measured for example by using a B-type viscometer. In case the B-type viscometer is used, the measurement of the viscosity is carried out with a roller of No. 7 and a revolution speed of 4 rpm.

For producing the polyamic acid, it is preferable that the polyamic acid solution is produced by a single-step polymerization by using a single reaction apparatus. In order to carry out the single-step polymerization, it is preferable to carry out a step of removing undissolved raw materials derived from the monomer component, and mixed-in foreign materials. The removal of the undissolved raw materials and the mixed-in foreign materials may be carried out by (a) dissolving the monomer in the organic solvent just before adding into the reaction vessel and (b) filtering off the undissolved raw materials and the mixed-in foreign materials by using a filter or the like. By doing this, it is possible to reduce the foreign materials in the film and suppress defects of the film. Moreover, the removal of the foreign material may be carried out by sieving the raw materials in powder form so as to directly removing the mixed-in foreign material, and then performing the polymerization with the mixed-in foreign materials and defects reduced. A mesh size of the filter to use is ½, preferably ⅕, more preferably ⅒ of a thickness of the polyimide film to be produced.

By removing the undissolved raw materials and the mixed-in foreign materials from the monomer component as described above, it is possible to prevent the undissolved raw materials and the mixed-in foreign materials from hindering the film and the metal layer from firmly adhered to each other in the step of forming the metal layer on the polyimide film.

Furthermore, alternatively, the polymerization may be carried out in two steps. In the first step, a polyamic acid solution having low viscosity is polymerized. This polyamic acid solution having low viscosity is called a prepolymer. In the second step, an organic solvent in which the acid dianhydride is dissolved is added into the organic solvent (containing the prepolymer), so as to produce a polyamic acid solution having a high viscosity. By having, between the first and second steps, the step of removing undissolved raw materials and mixed-in foreign materials from the prepolymer by using a filter or the like, it is possible to reduce the foreign materials in the film and the defect in the film. A mesh size of the filter to use is ½, preferably ⅕, more preferably ⅒ of a thickness of the polyimide film to be produced.

In order to obtain the polyimide film of the present invention, it is possible to adopt various methods such as a thermal method in which thermal dehydration is carried out to perform ring closure, a chemical method in which a dehydrating agent is used, and the like. The chemical method is preferable because the polyimide film produced by the chemical method is excellent in mechanical properties such as extension percentage and tensile strength. Moreover, the use of the chemical method has other advantages such that imidification is carried out in a short-time. Note that it is also possible to adopt both the thermal method and the chemical method in combination.

The following chemical ring closure method carried out from steps (1) to (4) is a typical chemical method of chemically producing the polyimide film from the solution in which the polyamic acid is dissolved in the organic solvent.

(1) flow-casting a mixture solution on a supporter by flowing the mixture solution from an outlet having a slit, the mixture solution prepared by mixing, in the organic solution of the polyamic acid, the dehydrating agent and the catalyst, where the supporter is a drum, an endless belt, or the like;

(2) heating and drying (thermally drying) the mixture solution on the supporter at a temperature of 200° C. or less for one to twenty minutes, so as to produce a gel film that is capable of supporting itself, and peeling off the film from the supporter;

(3) after fixedly holding edges of the film, gradually or stepwisely heating the film from 100° C. to 600° C., so as to carry out imidification in the film; and (4) cooling the film gradually, and releasing the holding of the edges of the film, so as to obtain the polyimide film.

The following thermal ring closure method carried out from steps (1) to (4) is a typical thermal method of thermal producing the polyimide film from the solution.

(1) flow-casting a mixture solution on the supporter by flowing the mixture solution from an outlet having a slit.

(2) heating and drying (thermally drying) the mixture solution on the supporter at a temperature of 200° C. or less for one to twenty minutes, so as to produce a gel film that is capable of supporting itself, and peeling off the film from the supporter;

(3) fixedly holding edges of the film, gradually or stepwisely heating the film from 100° C. to 600° C., so as to carry out imidification in the film; and (4) cooling the film gradually, and releasing the edges of the film, so as to obtain the polyimide film.

Note that it is possible to produce the polyimide film by adopting both the chemical ring closure method and the thermal ring closure method in combination.

Moreover, in case of the method in which the film capable of supporting itself, which is peeled off and fixedly held at its both ends, is calcinated inside a furnace and it is rolled up by a film-rolling up section. It is preferable for attaining a low thermal shrinkage rate by controlling a rolling-up tension of from 0 kg/m to 30 kg/m, preferably from 0 kg/m to 20 kg/m, further preferably from 0 kg/m to 15 kg/m.

The dehydrating agent to use in the chemical ring closure method may be (a) aliphatic anhydrides such as acetic anhydride and the like, (b) aromatic anhydrides. The catalyst may be, for example, (i) aliphatic tertiary amines such as triethylamine and the like, (ii) aromatic tertiary amines such as dimethylaniline and the like, (iii) heteroaromatic tertiary amines such as pyridine, isoquinoline, β-picoline, γ-picoline, 3,5-lutidine, and the like.

The present embodiment may be so arranged as to have the step of removing the undissolved raw material and the mixed-in foreign material by using the filter or the like, before mixing the dehydrating agent and the catalyst in the solution in which the polyamic acid is dissolved in the organic solvent, in order to reduce the foreign materials in the film and defects in the film. The mesh size of the filter to use is ½, preferably ⅕, more preferably ¹⁄₁₀ of a thickness of the polyimide film to be produced. By removing the undissolved raw materials and the mixed-in foreign materials from the monomer component as described above, it is possible to prevent the undissolved raw materials and the mixed-in foreign materials from hindering the film and the metal layer from firmly adhered to each other in the step of forming the metal layer on the polyimide film.

As to the contents of the dehydrating agent and the catalyst with respect to the polyamic acid, it is preferable that (mole of the dehydrating agent)/(mole of amide group in the polyamic acid)=10 to 0.01, and (catalyst)/(mole of amide group in the polyamic acid)=10 to 0.01, depending on a constitutional formula of the polyamic acid. Moreover, it is more preferable that (mole of the dehydrating agent)/ (mole of amide group in the polyamic acid)=5 to 0.5, and (catalyst)/(mole of amide group in the polyamic acid)=5 to 0.1. Note that it is possible to additionally use a reaction retardant such as acetylacetone or the like, in this case. Moreover, the content of the dehydrating agent and the catalyst with respect to the polyamic acid may be decided based on a time period (pot life) from (a) when the polyamic acid is mixed with a mixture of the dehydrating agent and the catalyst at 0° C., to (b) when the viscosity starts to increase. Generally, it is preferable that the pot life is in a range of from 0.1 minute to 120 minutes, and it is more preferable that the pot life is in a range of from 0.5 minute to 60 minutes.

Moreover, if necessary, an antioxidant, a light stabilizer, a fire retardant, an antistatic agent, a heat stabilizer, an ultraviolet absorbent, an inorganic filler, a metal fine powder and the like, and various reinforcing agent, may be added into the organic solution of the polyamic acid.

Moreover, in case where the polyimide film of the present invention is used as a central supporting film, properties of the polyimide film are not significantly affected by thinly laminating the polyamic acid solution on the surface of the gel film. For example, it is possible to use a copolymer polyamic acid solution prepared by copolymerizing BPDA and ODA, a copolymer polyamic acid solution prepared by copolymerizing BMDA and PDA, or a copolymer polyamic acid solution prepared by copolymerizing PMDA and ODA. If the film on which one such copolymer polyamic acid solution is applied, become too thick after the application of the copolymer polyamic solution, the properties of the polyimide film are largely affected. Therefore, the copolymer polyamic acid solution should be applied thinly and evenly on the whole surface of the film. As long as no pin hole is produced on the surface, the thickness of the film after the application of the copolymer polyamic acid solution is preferably in a range of from 20 nm to 5 μm, and further preferably in a range of from 50 nm to 1 μm.

Moreover, in order to attain a low thermal shrinkage percentage, it is preferable to subject the polyimide film of the present embodiment to a thermal treatment. One example of thermal treatment methods for polyimide films is explained below. However, it should be noted that the present invention is not limited to this method, and the thermal treatment may be carried out by various methods.

After the polyimide film is produced by the method discussed above, the polyimide film is heated at a temperature in a range of from 200° C. to 400° C., more preferably in a range of from 250° C. to 400° C. By heating the polyimide film again at such a temperature, it is possible to adjust an internal stress. Thereby, it is possible to attain a thermal shrinkage rate at 300° C. of 0.3% or less, or even a thermal shrinkage rate at 300° C. of 0.25% or less. The heating of the film in a furnace heated up to the temperature is carried out preferably for not less than 5 seconds but not more than 60 seconds, and more preferably not less than 5 seconds but not more than 30 seconds.

In order to have such an arrangement, it is preferable to calcinate the film in a heater for a time period (heating time) represented by the following formula:

Heating Time in Furnace(second)=$A/(B \times 60)$, where $A$(m) is a length of the furnace (hereinafter, referred to as a furnace length) in which the heater is provided, and $B$(m/minute) is a speed of film conveyed through the furnace.

Here, any source of heat may be used for the furnace for the thermal treatment of the film. It is possible to adopt various methods such as a method of blowing hot air over the film, a method of radiating infrared light on the film, a method of heating the film by winding the film on a heated-up roller, and the like. Moreover, it is necessary to give the film a tensile stress in order to convey the film through the furnace. The tensile stress is arbitrarily chosen depending on a length of the furnace, a width of the film, a thickness of the film, speed of the process, and the like. A large tensile stress causes a high thermal shrinkage rate and is not preferable. A small tensile stress causes the conveyance of the film to be unstable, and is not preferable, too. For example, with respect to the width of the film, the tensile stress is preferably in a range of from 1 kg/m to 30 kg/m, more preferably in a range of from 1 kg/m to 20 kg/m, and further preferably in a range of from 5 kg/m to 15 kg/m.

Laminate Having a Metal Layer and the Polyimide Film

The polyimide film of the present embodiment may be used to produce laminate having a metal layer and the polyimide film. Therefore, as the laminate of the present invention may be the laminate having a metal layer and the polyimide film of the present embodiment. That is, the laminate of the present invention is produced by using the polyimide film arranged such that the tan δ peak of dynamic viscoelasticity thereof is located in a range of not less than 310° C. but not more than 410° C., and the tan δ value at 300° C. thereof is not more than 0.05.

The laminate shows a remarkable effect when the laminate is produced by directly forming a metal layer by vapor deposition or sputtering of metal. As the adhesive agent for preparing the laminate of the present invention, it is possible to use adhesive agents prepared by mixing, solely or in combination, for example an epoxy resin, a polyimide resin, a phenol resin, an acryl resin, a polyimide resin, a rubber-type resin or the like, in a solvent in various mixing ratios, and, if necessary adding therein an additive such as a hardener, a hardening accelerator and the like. The laminate is suitable for use in an electronic raw material for use in a flexible printed circuit board, a base film for a COF, a TAB tape, a base film for a high density recording medium, and the like.

Second Embodiment

A second embodiment discusses a second polyimide film of the present invention.

Conventionally, there is such a problem that long-term stability against harsh environments cannot be attained in a polyimide film that is so suitable for alkali etching that one side thereof can be etched with a 1N potassium hydroxide solution at an etching speed of 0.1 μm/minute (one side) or higher. It is not exactly known why such polyimide film is poor in long-term stability against harsh environments. However, it is considered that hydrolysis causes both of (a) dissolution in alkali-etching the polyimide film and (b) film deterioration caused in harsh environment (the film deterioration being tested in harsh environmental resistance test that tests the stability of the film against harsh environment), especially, in environment of high temperatures and high humidity. That is, the film suitable for the alkali etching is not stable against harsh environment. As a result, it is considered that the suitability for the alkali etching and the stability against harsh environment are incompatible with each other.

In view of this, the present invention provides polyimide films that have an improved stability against harsh environment, without deteriorating its suitability for alkali etching. The second embodiment discusses a polyimide film whose essential components are a biphenyl tetracarboxylic dianhydride and a pyromellitic dianhydride, as one example of such polyimide films.

The polyimide film of the second embodiment is a polyimide film (a) prepared by copolymerizing an acid dianhydride component and a diamine component, the polyimide film containing, as essential components, a pyromellitic dianhydride and a biphenyl tetracarboxylic dianhydride, which are the acid dianhydride component, and (b) capable of being etched with a 1N potassium hydroxide solution at an etching speed of 0.1 μm/minute (one side) or higher.

Monomers to Constitute Acid Dianhydride Component of Polyimide Film

Described here are pyromellitic dianhydrides and biphenyl tetracarboxylic dianhydrides, which are monomers to constitute the acid dianhydride component of the polyimide film of the present embodiment.

The pyromellitic dianhydrides are aromatic tetracarboxylic dianhydride compounds having a structure containing two dicarboxylic anhydride structures represented by the following general formula (1):

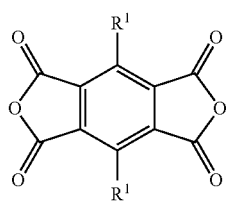

(1)

(where $R^1$ is a residue selected from a group consisting of H—, $CH_3$—, $CF_3$—, Cl—, Br—, F—, and $CH_3O$—, and $R^1$ may be the same residues or different residues).

Moreover, the biphenyl dianhydrides are aromatic tetracarboxylic dianhydride compounds having a structure containing two dicarboxylic anhydride structures represented by the following general formula (5):

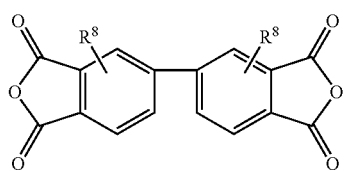

(5)

(where $R^8$ is a residue selected from a group consisting of H—, $CH_3$—, Cl—, Br—, F— and $CH_3O$—, and $R^8$ may be the same residues or the different residues).

As a result of intensive studies on the polyimide film of the present embodiment in order to further improve the stability against harsh environment, it was found that the film has a further improved stability against harsh environment if the film is prepared by copolymerizing a diamine component with an acid dianhydride component including a pyromellitic dianhydride in a range of from 30 mole % to 99.9 mole %, and a biphenyl tetracarboxylic dianhydride in a range of from 0.1 mole % to 50 mole %. In short, it is preferable that the acid dianhydride component including a pyromellitic dianhydride in a range of from 30 mole % to 99.9 mole %, and a biphenyl tetracarboxylic dianhydride in a range of from 0.1 mole % to 50 mole %.

Specifically, it is preferable that pyromellitic dianhydride is chosen as the pyromellitic dianhydride, because supply of the pyromellitic dianhydride is stable in the market.

Moreover, in order that the film may have a better stability against harsh environment and may be more strongly adhered with the metal, the pyromellitic dianhydride is preferably in a range of from 30 mole % to 99.9 mole %, more preferably in a range of from 30 mole % to 80 mole %, and especially preferably in a range of from 30 mole % to 70 mole %, as described above. If the ratio of the pyromellitic dianhydride is less than the range, a harsh environmental resistance test shows that a tear-through resistance of the film tends to be reduced and an adhesive strength of metal with respect to the surface of the film tends to be reduced. On the other hand, if the ratio of the pyromellitic dianhydride is more than the range, the film tends to have a high coefficient of hygroscopic expansion. Therefore, in order to obtain a good-quality polyimide film suitable for use in an electronic raw material, it is preferable that the pyromellitic dianhydride is used in the ratio.

Specific examples of the biphenyl tetracarboxylic dianhydrides are: 2,3,3',4'-biphenyl tetracarboxylic dianhydride, 3,3',4,4'-biphenyl tetracarboxylic dianhydride, and the like. Especially, 3,3',4,4'-biphenyl tetracarboxylic dianhydride is more preferable when the polyimide is made to be a heat resistant film body.

Moreover, in order that the film may be suitable for alkali etching and be able to be strongly adhered with the metal, the biphenyl tetracarboxylic dianhydride is preferably in a range of from 0.1 mole % to 50 mole %, as described above, more preferably in a range of from 0.1 mole % to 40 mole %, and especially preferably in a range of from 1 mole % to 30 mole %.

If the ratio of the biphenyl tetracarboxylic dianhydride is less than the range, a peel strength at an interface of (a) the polyimide film thus obtained by the copolymerization and (b) the metal, is reduced. Furthermore, in this case, the retention rate of the peel strength after temperature aging (retention rate of the peel strength after exposing to a high temperature) is reduced. If the ratio of the biphenyl tetracarboxylic dianhydride is more than the range, alkali etching tends to be performed at a lower speed, and the polyimide film tends to have a high coefficient of hygroscopic expansion. Furthermore, if the ratio of the biphenyl tetracarboxylic dianhydride is high, there is a possibility that a coefficient of linear expansion becomes high in some of the polymerization methods, and the film has a lower modulus of elasticity and a lower heat resistance against high temperature, whereby the film becomes a thermoplastic film.

[Monomers as Diamine Component of Polyimide Film]

Described below are monomers to constitute the diamine component of the polyimide film of the present embodiment. The diamine component of the polyimide film is preferable a diamine including a paraphenylene diamine and/or a diaminodiphenyl ether. That is, the polyimide film preferably contains, as the diamine component, a paraphenylene diamine and/or a diamiophenyl ether.

Here, the paraphenylene diamines are diamine compound having a rigid structure represented by the following general formula (2):

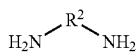
(2)

(where $R^2$ is a bivalent aromatic group selected from a group consisting of:

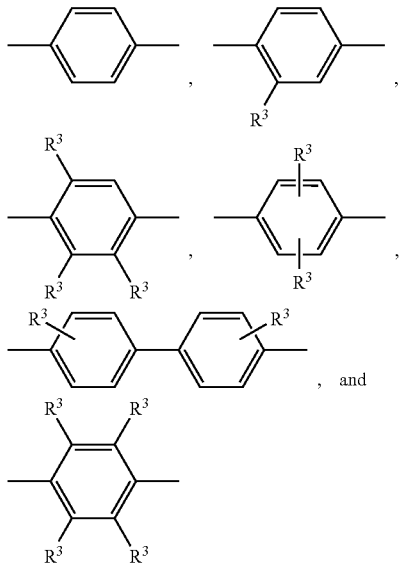

and each $R^3$ in the group is independently any one of —H, —CH$_3$, —OH, —CF$_3$, —SO$_4$, —COOH, —CO—NH$_2$, —Cl, —Br, —F, and —OCHs).

Note that the polyimide film of the present embodiment may be so arranged that only one of the paraphenylene diamines is used, or that two or more of the paraphenylene diamines are used in combination. Especially, it is preferable to use paraphenylene diamine, for attaining a polyimide film having an excellent heat resistance.

Moreover, the diaminodiphenyl ethers are diamine compounds having a soft structure, among the aromatic diamine compounds, the structure represented by the following General Formula (3):

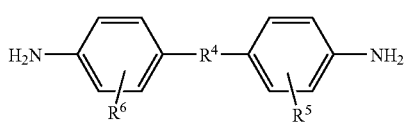
(3)

(where $R^4$ is a bivalent organic group selected from a group consisting of:

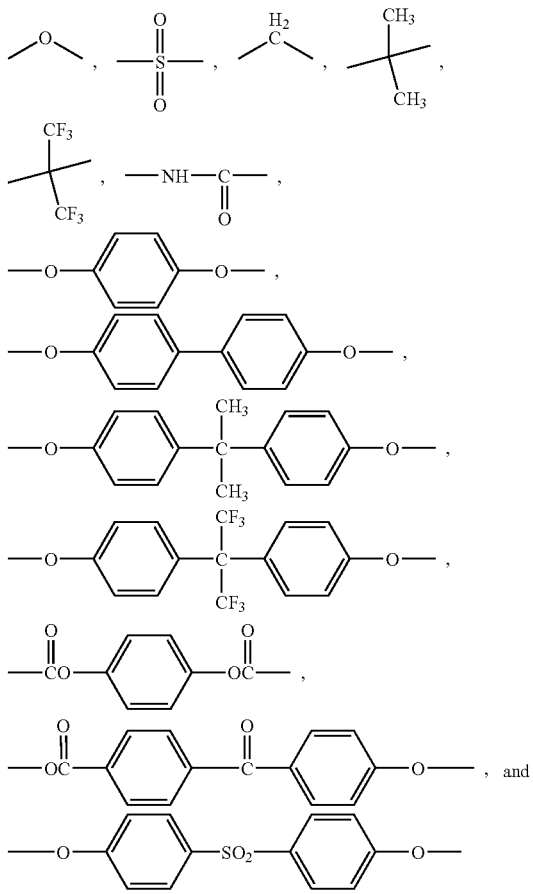

and each $R^5$ in the group is independently any one of —H, —CH$_3$, —OH, —CF$_3$, —SO$_4$, —COOH, —CO—NH$_2$, —Cl, —Br, —F, and —OCH$_3$).

Note that the polyimide film of the present embodiment may be so arranged that only one of the diaminodiphenyl ethers is used or that two or more of the diaminodiphenyl ethers are used in combination. Among the diaminodiphenyl ethers, 4,4'-diaminodiphenyl ether is preferable because it is easy to acquire it in the market.

Moreover, in the polyimide film of the present embodiment, it is preferable that the diamine component includes a paraphenylene diamine of 15 mole % to 85 mole % and a diaminodiphenyl ether of 15 mole % to 85 mole % per the total diamine component. Further, it is more preferable that the diamine component includes a paraphenylene diamine of 25 mole % to 75 mole % and a diaminodiphenyl ether of 25 mole % to 75 mole % per the total diamine component.

If the paraphenylene diamine and the diaminodiphenyl ether are out of those ranges, the film tends to have a modulus of elasticity and a coefficient of linear expansion that are out of desirable ranges. For example, if content of the paraphenylene diamine having the rigid structure is less than the range, and content of the diaminodiphenyl ether having the soft structure is more than the range, the coefficient of linear expansion tends to be high, and the modulus of elasticity tends to be lower. Further, if the content of the diaminodiphenyl ether having the soft structure is less than the range and content of the paraphenylene diamine having the rigid structure is more than the range, the polyimide film becomes fragile, and the tear-through resistance of the film is reduced after harsh environment exposure. Moreover, if the respective diamines are used out of the ranges, such a problem is caused that the coefficient of hygroscopic expansion becomes higher.

That is, it is preferable that the diamine component of the polyimide film of the present embodiment contains a diamine having a soft structure and a diamine having a rigid structure. Further, the content of the respective diamines are in the ranges suitable for the paraphenylene diamine and the diaminodiphenyl ether.

[Other Monomer to be Contained in Polyimide Film]

In the polyimide film of the present embodiment, it is preferable that the acid dianhydride component further contains a bis(trimellitic monoester anhydride). By copolymerizing the bis(trimellitic monoester anhydride), it is possible to improve the suitability for alkali etching. Further copolymerization of bis(trimellitic monoester anhydride) lowers the coefficient of hygroscopic expansion.

Here, bis(trimellitic monoester anhydride)s are aromatic tetracarboxylic dianhydride compounds having a structure including two dicarboxylic anhydrate structures represented by the following General Formula (4):

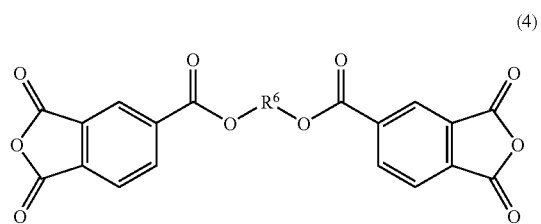

(4)

(where $R^6$ is a bivalent organic group selected from a group consisting of:

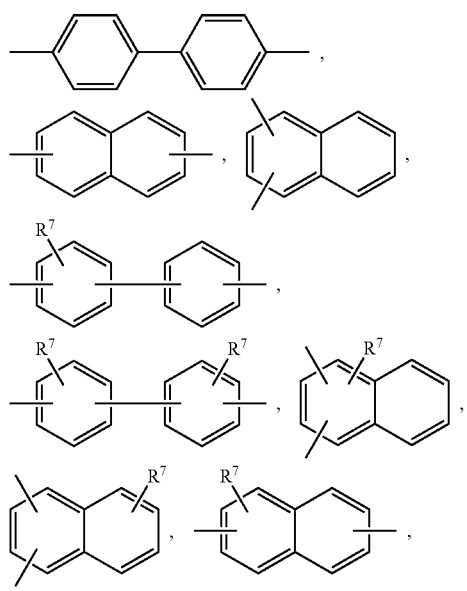

-continued

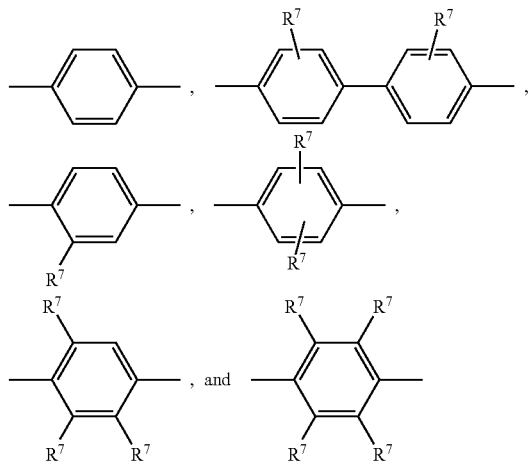

and each $R^7$ is independently any one of —H, —$CH_3$, —OH, —$CF_3$, —$SO_4$, —COOH, and —CO—$NH_2$).

Specific preferable examples of bis(trimellitic monoester anhydride)s are: p-phenylene bis(trimellitic monoester anhydride), p-biphenylene bis(trimellitic monoester anhydride), p-methylphenylene bis(trimellitic monoester anhydride), p-(2,3-dimethylphenylene)bis(trimellitic monoester anhydride), 4,4'-biphenylene bis(trimellitic monoester anhydride), 1,4-naphthalene bis(trimellitic monoester anhydride), 2,6-naphthalene bis(trimellitic monoester anhydride). Especially, p-phenylene bis(trimellitic monoester anhydride) is preferable because it is easy to acquire it in the market.

Moreover, in case where the bis(trimellitic monoester anhydride) s are copolymerized, the bis(trimellitic monoester anhydride)s are preferably in a range of from 10 mole % to 50 mole %, and more preferably in a range of from 20 mole % to 40 mole %, in terms of (a) the coefficient of hygroscopic expansion, (b) compatibility of stability against harsh environment and alkali etching property, and (c) peel strength. If the ratio of the bis(trimellitic monoester anhydride)s is less than those ranges, the film tends to have a high coefficient of hygroscopic expansion. If the ratio of the bis(trimellitic monoester anhydride)s is more than those ranges, it becomes difficult to compatibly have the stability of the film against harsh environment and the alkali etching property, that is, the retention rate of the tear-through resistance of the film is reduced, or the peel strength at the interface between the film and the metal is reduced.

[Manufacturing Method of Polyimide Film]

Described below is a method of manufacturing the polyimide film of the present embodiment.

For producing the polyimide film of the present embodiment, to begin with, the acid dianhydride component and the diamine component are equimolarly reacted with each other in an organic solvent so as to produce a polyamic acid solution. The polyamic acid solution is a precursor of the polyimide (polyimide precursor). The polyimide acid solution is mixed with a catalyst and a dehydrating agent. Next, the polyimide acid solution is flow-cast on a supporter, and then dried and heated, so as to obtain a polyimide film.

Examples of the organic solvent to use in polymerization of the polyamic acid are: (a) ureas such as tetramethyl urea, N,N-dimethylethyl urea, and the like, (b) sulfones such as dimethyl sulfoxide, diphenyl sulfone, tetramethyl sulfone, and the like, (c) amides such as N,N-dimethyl acetaminde (DMAc), N,N-dimethyl formamide (DMF), N-methyl-2-pyroridone (NMP), γ-butyl lacton, hexamethyl phosphoric triamide and the like, (d) non-proton solvent of phosphoric amides, (e) alkyl halides such as chloroform, methylene chloride, and the like, (f) aromatic hydrocarbons such as benzene toluene and the like, (g) phenyls such as phenol, cresol, and the like, and (h) ethers such as dimethyl ether, diethyl ether, p-cresol methyl ether, and the like.

Those solvents are usually used solely, but two or more of the solvents may be used in combination if necessary. Among the solvents, the amides such as DMF, DMAc, NMP, and the like are suitably used.

Here, one example of manufacturing methods of the polyamic acid is explained. Note that the present invention is not limited to the manufacturing method described below, and various methods may be adopted in the present invention.

Into an organic solvent in which a paraphenylene diamine and a diaminodiphenyl ether are dissolved, an acid anhydride is added and reacted (polymerized) with the paraphenylene diamine and the diaminodiphenyl ether so as to produce a polyamic acid solution via the polymerization. The acid anhydride contains a biphenyl tetracarboxylic dianhydride, a pyromellitic dianhydride, and, if necessary, a bis(trimellitic monoester anhydride). It is preferable that the polymerization is carried out in a reactor having a temperature controlling apparatus in order to control a reaction temperature.

For easy handling, concentration of the polyamic acid produced in the organic solvent is preferable in a range of from 5 wt % to 40 wt %, more preferably in a range of from 10 wt % to 30 wt %, further preferably in a range of from 13 wt % to 25 wt %. Note that it is preferable for better film property that average molecular weight of the polyamic acid is 10000 or more, in terms of PEG (polyethylene glycol) of GPC.

Moreover, the polyamic acid solution has a viscosity preferably of not less than 50 Pa·s but not more than 1000 Pa·s, more preferably of not less than 100 Pa·s but not more than 500 Pa·s, further preferably of not less than 200 Pa·s but not more than 400 Pa·s, when the polyamic acid solution is kept for one hour in a water bath at a maintained temperature of 23° C. If the viscosity of the polyamic acid solution is in such ranges, it is easy to handle the polyamic acid solution in forming the film. Note that the viscosity is measured for example by using a B-type viscometer. In case the B-type viscometer is used, the measurement of the viscosity is carried out with a roller of No. 7 and a revolution speed of 4 rpm.

For producing the polyamic acid, it is preferable that the polyamic acid solution is produced by a single-step polymerization by using a single reaction apparatus. In order to carry out the single-step polymerization, it is preferable to carry out a step of removing undissolved raw materials derived from the monomer component, and mixed-in foreign materials. The removal of the undissolved raw materials and the mixed-in foreign materials may be carried out by (a) dissolving the monomer in the organic solvent just before adding into the reaction vessel and (b) filtering off the undissolved raw materials and the mixed-in foreign materials by using a filter or the like. By doing this, it is possible to reduce the foreign materials in the film and suppress defects of the film. Moreover, the removal of the foreign material may be carried out by sieving the raw materials in powder form so as to directly removing the mixed-in foreign material, and then performing the polymerization with the mixed-in foreign materials and defects reduced. A mesh size of the filter to use is ½, preferably ⅕, more preferably ¹⁄₁₀ of a thickness of the polyimide film to be produced.

By removing the undissolved raw materials and the mixed-in foreign materials from the monomer component as described above, it is possible to prevent the undissolved raw materials and the mixed-in foreign materials from hindering the film and the metal layer from firmly adhered to each other in the step of forming the metal layer on the polyimide film.

Furthermore, alternatively, the polymerization may be carried out in two steps. In the first step, a polyamic acid solution having low viscosity is polymerized. This *polyamic acid solution having low viscosity is called a prepolymer. In the second step, an organic solvent in which the acid dianhydride is dissolved is added into the organic solvent (containing the prepolymer), so as to produce a polyamic acid solution having a high viscosity. By carried out, between the first and second steps, the step of removing undissolved raw materials and mixed-in foreign materials from the prepolymer by using a filter or the like, it is possible to reduce the foreign materials in the film and the defect in the film. A mesh size of the filter to use is ½, preferably ⅕, more preferably ¹⁄₁₀ of a thickness of the polyimide film to be produced.

In order to obtain the polyimide film of the present invention, it is possible to adopt various methods such as a thermal method in which thermal dehydration is carried out to close a ring, a chemical method in which a dehydrating agent is used, and the like. The chemical method is preferable because the polyimide film produced by the chemical method is excellent in mechanical properties such as extension percentage and tensile strength. Moreover, the use of the chemical method has other advantages such that imidification is carried out in a short-time. Note that it is also possible to adopt both the thermal method and the chemical method in combination.

A typical example of the thermal methods is the thermal ring closure method described in the first embodiment. A typical example of the chemical methods is the chemical ring closure method described in the firsts embodiment. Those methods can be adopted in the second embodiment as in the first embodiment. Thus, explanation of those methods is omitted here.

Polyimide Film Having Various Excellent Properties

Regarding the polyimide film of the present embodiment, polyamic acids were produced by polymerizing an acid dianhydride component and a diamine component including the above-mentioned monomers in various ratios, and polyimide films prepared from the polyamic acids were evaluated. As a result, with an arrangement in which the monomers are used in specific ratios, it becomes possible to produce a polyimide film having excellent properties, which has been conventionally incompatible. This polyimide film compatibly having those various excellent properties is the third polyimide film discussed above.

The specific mixing ratios are as follows: in the acid dianhydride component of the polyimide film, the pyromellitic dianhydride is in a range of from 40 mole % to 80 mole %, the biphenyl tetracarboxylic dianhydride is in a range of 1 mole % to 40 mole %, and the bis(trimellitic monoester anhydride) is in a range of from 20 mole % to 50 mole %; and in the diamine component of the polyimide film, the paraphenylene diamine is in a range of from 25 mole % to 75 mole %, and the diaminodiphenyl ether is in a range of 25 mole % to 75 mole %.

In other words, the polyimide film having various excellent properties that has been conventionally incompatible, is a polyimide film prepared by copolymerizing the acid dianhydride component and the diamine component, the acid dianhydride component including (a) the pyromellitic dianhydride in a range of from 40 mole % to 80 mole %, (b) the biphenyl tetracarboxylic dianhydride in a range of 1 mole % to 40 mole %, and (c) the bis(trimellitic monoester anhydride) in a range of from 20 mole % to 50 mole %, and the diamine component including (d) the paraphenylene diamine in a range of from 25 mole % to 75 mole % and the diaminodiphenyl ether in a range of 25 mole % to 75 mole %.

Furthermore, it is possible to say that the polyimide film is such a polyimide film that is synthesized from (a) monomer raw materials containing a pyromellitic dianhydride in a mixing ratio ranging from 40 mole % to 80 mole %, a biphenyl tetracarboxylic dianhydride in a mixing ratio ranging from 1 mole % to 40 mole %, and a bis(trimellitic monoester dianhydride) in a mixing ratio ranging from 20 mole % to 50 mole %, putting the total amount of the acid dianhydride component as 100 mole %, and (b) monomer raw materials containing a paraphenylene diamine having a rigid structure in a mixing ratio ranging from 25 mole % to 75 mole %, and a diaminodiphenyl ether having a soft structure in a mixing ratio ranging from 25 mole % to 75 mole %.

As to each polymer, the biphenyl tetracarboxylic dianhydride preferably has a mixing ratio in a range of from 1 mole % to 40 mole %, and more preferably has a mixing ratio in a range of from 1 mole % to 30 mole %. When the biphenyl tetracarboxylic dianhydride has a mixing ratio less than those ranges, the resultant copolymer polyimide undesirably has a lower modulus of elasticity and a peel strength at an interface of the resultant film and metal is lowered. Further, the retention rate of the peel strength after exposing the harsh environmental is reduced undesirably. If biphenyl tetracarboxylic dianhydride has a mixing ratio greater than those ranges, the resultant film has a higher coefficient of hygroscopic expansion and a lower adhesive strength undesirably. Further, if biphenyl tetracarboxylic dianhydride has a mixing ratio greater than those ranges, there is a possibility that a coefficient of linear expansion becomes high in some of the polymerization methods, and the film has a lower modulus of elasticity and a lower heat resistance against high temperature, whereby the film becomes a thermoplastic film.

Furthermore, a mixing ratio of the pyromellitic dianhydride is preferably in a range of from 40 mole % to 80 mole %, and more preferably in a mixing ratio ranging from 50 mole % to 70 mole %. If the mixing ratio of the pyromellitic dianhydride is less than those mixing ratios, the resultant film has a lower modulus of elasticity, and if the mixing ratio of the pyromellitic dianhydride is more than those mixing ratios, the resultant film has a higher coefficient of hygroscopic expansion.

Moreover, a mixing ratio of the paraphenylene diamine having the rigid structure, is preferably in a range of from 25 moles to 75 mole %, and more preferably in a range of from 35 mole % to 65 mole %.

Moreover, a mixing ratio of the diaminodiphenyl ether having the soft structure, is preferably in a range of from 25 mole % to 75 mole %, and more preferably in a range of from 35 mole % to 65 mole %.

The polyimide film prepared from the monomers having those mixing ratios has a low coefficient of hygroscopic expansion, a low coefficient of linear expansion, a low coefficient of linear expansion at a high temperature, a high modulus of elasticity, and an excellent peel strength, which is retained well even after exposing to a harsh environment.

[Property of Polyimide Film]

Next, explained are evaluation methods for each property of the polyimide film (such as, the coefficient of hygroscopic expansion, the coefficient of linear expansion, the modulus of elasticity, retention rate of tear-through resistance after exposing to a harsh environment, the peel strength, the retention rate of the peel strength after aging, the retention rate of the peel strength after harsh environment exposure, alkali etching speed, and the like). Generally, in case where the polyimide film is used in electric/electronic apparatuses-use substrates such as flexible printed circuit boards, tape substrates for TAB, base films for high density recording media, and the like, it is preferable that the polyimide film has heat resistance, appropriate modulus of elasticity, flexibility, appropriate coefficient of linear expansion, appropriate coefficient of hygroscopic expansion, appropriate water absorption percentage, and appropriate extension percentage.

Here, the coefficient of liner expansion is a value measure by using the TMA instrument (Product Code: 120C) manufactured by SEIKO Electronic Co., Ltd, in a flow of nitrogen and at a temperature elevated from 100° C. to 200° C. at a rate of 10° C./minute.

Moreover, the modulus of elasticity is a value measured in conformity of ASTM-D882, by using a tension testing instrument (autograph S-100-C) manufactured by Shimadzu Co.

Moreover, the coefficient of hygroscopic expansion is measured as follows: a 5 mm×20 mm piece of the polyimide film, on which a minimum weight is applied so as not to allow the piece to be slack, is saturated at a relative humidity of 30% RH, then a size of the piece is measured. The same procedure is repeated at a relative humidity of 80% RH. From results of both the measurements, a dimensional change ratio per a 1% difference in relative humidity is obtained. This dimensional change is the coefficient of hygroscopic expansion.

In case where the polyimide film is used in electric/electronic apparatuses-use substrates such as flexible printed circuit boards, tape substrates for TAB, base films for high density recording media, and the like, the polyimide film preferably has properties in the following ranges.

The modulus of elasticity is preferably in a range of from 500 kg/mm$^2$ to 800 kg/mm$^2$, more preferably in a range of from 500 kg/mm$^2$ to 700 kg/mm$^2$, for example, when the film is used in the flexible printed circuit boards.

The coefficient of the linear expansion at temperatures in a range of from 100° C. to 200° C. is preferably 1 to 30×10$^{-6}$ cm/cm/° C., and more preferably 5 to 20×10$^{-6}$ cm/cm/° C. By arranging the polyimide film so as to have the coefficient of linear expansion in such ranges, for example when the alkali etching of the polyimide film of the laminate is carried out at a high temperature, it is possible to prevent misalignment between the polyimide film and an alkali etching mask, the misalignment caused by thermal expansion, and to prevent the etching solution from entering between the film and the metal in performing the alkali etching.

Generally speaking, it is preferable that the coefficient of hygroscopic expansion of the polyimide film is lower. In the present invention, the coefficient of hygroscopic expansion is preferably in a range of from 2 ppm/% RH to 20 ppm/%

RH, and more preferably in a range of form 2 ppm/% RH to 15 ppm/% RH. By so arranging the polyimide film as to have the coefficient in such ranges, it is possible to prevent failure in adhering a metal wire with an IC or an LSI, the metal wire formed on the polyimide.

The properties of the polyimide film out of the ranges would lead to the following problems, for example in case where an IC or an LSI is mounted on a surface of the flexible printed circuit board on which the metal wire is formed: in case the modulus of elasticity is less than the ranges, the high temperature applied thereon causes the film to be slant while the IC or the LSI is mounted on the film; in case the coefficient of linear expansion is greater than the range, the high temperature causes expansion that widens intervals between metal wires, thereby causing the failure in adhering the metal wire with the IC or LSI. If the coefficient of hygroscopic expansion is greater that the range, when the film is soaked in a solder bath, a moisture absorbed in an inside of the film is removed out of the film thereby shrinking the film in accordance with the reduction in an amount of moisture absorbed in the polyimide film. There is a possibility that this phenomenon causes misalignment between metal wires thereby causing short circuit. In order to present this, the humidity is strictly controlled in the current solder bath soaking step. The solder bath soaking step can be simplified by attaining a polyimide film having a lower coefficient of hygroscopic expansion caused by moisture absorption.

In general, in case the polyimide film is used for the flexible printed circuit boards, the tape substrates for TAB, the base films for high density recording media, and the like, it is preferable that the polyimide film has heat resistance, appropriate modulus of elasticity, flexibility, appropriate coefficient of linear expansion, appropriate coefficient of hygroscopic expansion, appropriate water absorption percentage, appropriate tear-through resistance, and appropriate extension percentage. It is desired that the desired properties are retained in a harsh environmental resistance test (performed for 48 hours in harsh environment of a temperature of 150° C., a humidity of 100% RH, and 4 atmospheric pressure, in the present embodiment). As a simple judgmental standard, a retention rate of tear-through resistance can be used. It is possible to judge whether or not the polyimide film is stable against harsh environment, by measuring the retention rate of tear-through resistance. In short, the polyimide film having a higher retention rate of tear-through resistance is more stable against harsh environment. It is preferable that the tear-through resistance is measured in conformity with ASTM D1938.

Here, the retention rate of tear-through resistance after exposing to harsh environment of a temperature of 150° C., a humidity of 100% RH, and 4 atmospheric pressure, for 48 hours, is referred to as a "retention rate of tear-through resistance after harsh environmental resistance test". For use in flexible printed circuit board, tape substrates for TAB, and base films for high density media, and further for use in aero planes and automobile, it is preferable that the retention rate of tear-through resistance after harsh environmental resistance test is not less than 50% (that is, in a range of not less than 50% but not more than 100%), and it is more preferable that the retention rate of tear-through resistance after harsh environmental resistance test is in a range of not less than 70% but not more than 100%.

That is the polyimide film of the present embodiment has a retention rate of tear-through resistance after harsh environmental resistance test not less than 50%, where the film is exposed to environment of a temperature of 150° C., a humidity of 100% RH, and 4 atmospheric pressure, for 48 hours in the harsh environment exposure.

Note that retention rate of tear-through resistance after harsh environmental resistance test is represented by the following equation:

$$\text{Retention Rate of Tear-through resistance}$$
$$\text{After Harsh Environmental Resistance Test} =$$
$$(\text{Tear-through Resistance Before Harsh environmental}$$
$$\text{Resistance Test}) \div (\text{Tear-Through Resistance}$$
$$\text{After Harsh environmental Resistance Test}) \times 100.$$

Next, explained is a method of finding the alkali etching speed of the polyimide film of the present embodiment. One of methods of finding the alkali etching speed is to perform the etching of polyimide film by using the 1N potassium hydroxide etching solution (prepared by dissolving potassium hydroxide in an aqueous solution of ethanol containing ethanol and water in a ratio of 80:20). With this method, it is possible to check how suitable the polyimide film is for the alkali etching. For forming a through hole in a polyimide film by the alkali etching, and for performing desmear process after laser fabrication of the polyimide film, it is preferable that the alkali etching speed is 0. 1 μm/minute (one side) or higher.

The alkali etching speed is calculated from the following equation:

$$\text{Alkali Etching Speed} =$$
$$(\text{Initial Film Thickness} - \text{Film Thickness After Etching}) \div 2 \div$$
$$(\text{Time Period in which Sample is Soaked in Alkali Etching Solution}).$$

Note that the etching speed shows how fact the one side of the film is etched (etching speed for one side of the film). Therefore, in the Specification of the present application, the unit of the etching speed is μm/minute (one side), which is for one side of the film.

Further, in case the polyimide film is used for the flexible printed circuit boards, the tape substrates for TAB, the base films for high density recording media, and the like, the polyimide film is used in laminate prepared by laminating metal on the polyimide film. In this case, it may be so arranged the polyimide film is adhered with a metal foil via an adhesive agent. Moreover, the metal may be so arranged that the metal is directly laminated on the polyimide film layer.

For the laminate that is prepared by vacuum depositing a thin metal layer followed by electroplating to the desired metal thickness on the polyimide film, and that is suitable for use in the flexible printed circuit board, (a) adhesive strength between the metal and the polyimide film, (b) retention rate of peel strength after temperature aging can be judged by the peel strength measured as follows. (the adhesive strength is a value to indicate how strongly the metal and the polyimide film are adhered with each other)

Firstly, a metallized polyimide film having a metal layer and the polyimide film is prepared by vacuum depositing the metal layer on the polyimide film by using a sputtering apparatus (Showa Shinku Co., LTD.: Product Name NSP-6). The metal is such as a noble metal, alkaline earth metal, or transition metal, e.g. copper, cobalt, nickel, chromium, titanium, and the like. The metal layer is to be a background. Then, the metallized polyimide film is subjected to an electroplating method using a sulfuric copper solution so as to obtain a desired metal thickness (about 20 µm) of the metal layer. As a result, a metal plated layer applied onto the vacuum deposited metal layer, in which the polyimide base layer is directly bonded to the vacuum deposited metal layer without the use of an adhesive. It is supposed that an initial peel strength is a peel strength to peel off, from the metallized polyimide film to 90 degrees, a 1 mm-thickness metal wiring pattern formed on the metallized polyimide film. It is preferable that the peel strength is evaluated in accordance with JIS C-6471. By measuring the initial peel strength, it is possible to judge whether or not the polyimide film is suitable for use in flexible printed circuit board. Further, whether or not the polyimide film has a stable adhesive strength as to metal against heating environment (high-temperature environment) is judged by finding a retention rate of the peel strength (how much peel strength is retained) after heating the metal wiring pattern of 1 mm thickness for 60 hours at a temperature of 150° C. The heating environment is, for example, thermal process in mounting an IC or an LSI, thermal process in soaking in a solder bath, and the like thermally severe condition.

For use in flexible printed circuit board, the polyimide film has an initial peel strength preferably of not less than 5N/cm, more preferably of not less than 6N/cm, further preferably of not less than 7N/cm, the initial peel strength being measured in the manner described above. In case the initial peel strength of the laminate is out of the ranges, the polyimide is not suitable for use in a laminate on which a metal wiring is formed, because the metal wiring formed on a flexible part of the board is likely separated from the polyimide.

Further, the retention rate of the peeling strength of the polyimide film after temperature aging (the retention rate of peel strength after temperature ageing) is calculated by the following equation:

Retention Rate of Peel Strength After Temperature Aging =

Peel Strength After Temperature Aging ÷ Peel

Strength Before Temperature Aging × 100.

In case where the polyimide film of the present invention is used in a flexible printed circuit board, the retention rate of the peel strength after temperature aging is preferably not less than 20%, and more preferably not less than 30%. If the retention rate of the peeling strength after temperature aging is less than the values, the heat causes wires come off from the polyimide film when an IC or an LSI is mounted on the metal wiring. Thus, in this case, the IC or LSI cannot be mounted. Furthermore, it is not preferable that the retention rate of the peeling strength after temperature aging is less than the values, because breakdown of the IC and LSI occurs due to short circuit of the metal wiring caused by such low retention rate of the peeling strength after temperature aging.

Moreover, as an reference index to describe the stability against harsh environment of the polyimide film, it is possible to use the retention rate of the peel strength after harsh environment exposure. The retention rate of the peel strength after harsh environment exposure is obtained by measuring the peel strength at an interface of the polyimide film and the metal constituting the laminate after exposing the laminate to a appropriate harsh environment. Herein, "retention rate of peel strength after harsh environment exposure" refers to a retention rate of peel strength of the polyimide film exposed to an environment of a temperature of 121° C. and a humidity of 100% RH, for 12 hours.

The retention rate of the peel strength after harsh environment exposure is obtained by the following equation:

Retention Rate of Peel Strength After Harsh Environment Exposure =

(Peel Strength After Harsh Environment Exposure) ÷

(Peel Strength Before Harsh Environment Exposure) × 100.

The retention rate of the peel strength after harsh environment exposure is preferably not less than 10%, and more preferably not less than 30%. If the retention rate of the peel-strength after harsh environment exposure is lower than the values, the metal wiring likely come off/cause short circuit after long-term use, thereby causing malfunction of the apparatus on which the laminate is mounted.

Note that the thickness of the polyimide film is not particularly limited. For example, it may be so arranged that the polyimide film has a thickness in a range of from 1 µm to 200 µm.

[Laminate Having Metal Layer and Polyimide Film]

The polyimide film of the present embodiment can be fabricated into laminate as described above. Therefore, the laminate of the present invention may be produced by using the polyimide film of the present embodiment. In other words, the laminate of the present invention is produced by using a polyimide film prepared by copolymerizing a diamine component and an acid dianhydride component that contains a pyromellitic dianhydride represented by Equation (1) and a biphenyl tetracarboxylic dianhydride represented by Equation (5), the polyimide film being able to be etched with a 1N potassium hydroxide solution at an etching speed of 0.1 µm/minute (one side) or higher (the polyimide film having an etching speed of 0.1 µm/minute (one side) or higher in etching with a 1N potassium hydroxide solution).

More specifically, the laminate of the present invention is produced by using a polyimide film prepared by copolymerizing a diamine component and an acid dianhydride component, (a) the diamine component including (i) a paraphenylene diamine, represented by Equation (2), in a range of from 25 mole % to 75 mole %, and (ii) a diaminophenyl ether, represented by General Formula (3), in a range of from 25 mole % to 75 mole %, and (b) the acid dianhydride component including (I) a pyromellitic dianhydride, represented by Equation (1), in a range of from 40 mole % to 80 mole %, (II) a biphenyl tetracarboxylic dianhydride, represented by Equation (5), in a range of from 1 mole % to 40 mole %, and (III) bis(trimellitic monoester anhydride), represented by General Formula (4), in a range of from 20 mole % to 50 mole %.

The laminate is especially effective for a case where vapor deposition or sputtering of metal is adopted so as to form the metal directly formed on the film. However, the laminate may be a metal laminated board in which a metal foil is adhered with the film via an adhesive agent. The laminate can be suitably used as an electronic material for a flexible printed circuit board, a base film for use in a COF, a TAB tape, a base film for use in a high density recording medium, and the like

EXAMPLES

The present invention is more specifically explained below, referring to examples and comparative examples. It should be noted that the examples and the comparative examples are not to limit the present invention. In the examples and the comparative examples, names of products after names of manufacturer are product names or produce codes, unless otherwise specified.

Example 1

In the present example, polyamic acid was produced by using a reactor provided with (i) a stainless separable flask as a reaction vessel, (ii) a stirring screw having two puddles (two-blade stirrer) as a stirring apparatus provided inside the separable flask, and (iii) a cooling apparatus having a cooling capacity of 20.9 kJ/min. In order to prevent water from being mixed in the polymerization, polymerization was carried in a nitrogen gas flowing through the reactor at a rate of 0.05 L/min, the nitrogen gas being dehydrated (desiccated) by passing through silica gel before being introduced into the reactor.

Into the separable flask, 501.3 g of N,N-dimethyl formamide (DMF) was poured as a polymerization solvent. Then, 25.0 g of 4,4-diaminodiphenyl ether (ODA) and 13.5 g of paraphenylene diamine (p-PDA) were added in the separable flask. Mixture thereof was stirred at a temperature of 20° C., so as to prepare a diamine solution in which ODA and p-PDA were completely dissolved in DMF.

Into the diamine solution, 40.0 g of p-phenylene bis (trimellitic monoester anhydride) (TMHQ) was gradually added with stirring the diamine solution, and was completely dissolved in the diamine solution with stirring. Then, 32.6 g of PMDA was gradually added into the diamine solution, and completely dissolved with stirring. Thereafter, the diamine solution was stirred for 40 minutes by using the stirring apparatus.

Furthermore, not more than 2.7 g of PMDA was gradually added into the mixture with stirring so as to attain a desired viscosity (here, not less than 200 Pa·s but not more than 400 Pa·s). Hereby, a reaction solution is prepared. Note that the reaction solution has a polyamic acid of 18.5% by weight based on a total weight of the reaction solution. Thereafter, the reaction mixture was cooled with stirring for one hour continuously so as to polymerize the diamine and the acid dianhydride into the polyamic acid, thereby obtaining a polyamic acid solution (polymer varnish).

[Production of Polyimide Film]

The thus obtained polymer varnish was mixed with acetic anhydride (AA) and isoquinoline (IQ). A mixture of the polymer varnish, AA and IQ was flow-cast on an aluminum board, and then dried at a temperature of 100° C. for 5 minutes, so as to obtain a gel film. The thus obtained gel film was peeled off from the aluminum board, and fixed on a supporting frame. Then, the film fixed on the supporting frame was heated at a temperature of 350° C. for 20 seconds, at a temperature of 450° C. for 20 seconds, and then at a temperature of 500° C. for 20 seconds, so as to perform ring-closing dehydration of the polyamic acid by drying the film. Thereby, a polyimide film having a thickness of 25 μm.

Properties of the thus obtained polyimide film were evaluated. Result of the evaluation is shown on Tables 1 and 2. Note that the properties of the polyimide film were evaluated in the following methods.

[Evaluation Methods]
[Dynamic Viscoelastic Behavior]

Measuring Instrument: DMS 200 produced by Seiko Electronic Co. Ltd.
Sample Size: 9 mm width×40 mm height
Measurement mode: Tension Mode
Profile Temperature: from 20° C. to 400° C.(at an increasing rate of 3° C./min)
Frequency: 5 Hz
Lamp.: 20 μm
F base (minimum tension value during the measurement): 0 g
F Ogain 3.0

The dynamic viscoelastic behavior was measured with the above setting. The highest value of inflection points of a curve of tan δ was tan δ peak. That is, a temperature of the tan δ peak was the temperature at the point at which the value of the tan δ is highest, the point shown in FIG. 1.

[Tan δ at 300° C.]

The dynamic viscoelasticity behavior of the polyimide film was measured by the above-described measuring method of the dynamic viscoelasticity. Two tan δ values, namely, a tan δ value at 180° C. and a tan δ value at 300° C., were measured. From the two tan δ values, the "tan δ value at 300° C." was calculated out from the following equation:

"Tan δ value at 300° C."=(Tan δ value measured at 300° C.)−(Tan δ value measured at 180° C.).

[Thermal Shrinkage Percentage]

Firstly, a piece (sample) was cut out of the polyimide film by cutting the polyimide film by 13 cm in the TD direction and 25 cm in the MD direction (here, the direction of the film cut by 13 cm is referred to as the TD direction whereas the direction of the film cut by 25 cm is referred to as the MD direction). Then, the sample was allowed to stand for 24 hours in a room in which a temperature of 20° C. and a relative humidity of 60% RH were maintained. After that, four edges of the film were measured. Among four edges, those two edges in the TD direction were respectively referred to as TD1 and TD2, whereas those two edges in the MD direction were respectively referred to as MD1 and MD2.

After measuring the lengths of the edges, the film was allowed to stand in an oven at a temperature of 300° C. The film was covered with an aluminum foil so that the heat was diffused throughout the whole film. Before heating the film, it was checked that the film was placed without overlapping on itself.

After the heating, the film thus heated was allowed to stand for 30 minutes again in the room in which a temperature of 20° C. and a relative humidity of 60% RH were maintained. Then, the lengths of the four edges were measured. Among the four edges, these two edges in the TD direction were respectively referred to as TD1' and TD2', whereas those two edges in the MD directions were respectively referred to as MD1' and MD2'. The thermal shrinkage rate is obtained by the following equations:

Thermal Shrinkage Rate (%) in the TD Direction= {($TD1-TD1'$)/$TD1$+($TD2-TD2'$)/$TD2$}/2×100, Thermal Shrinkage Rate (%) in the MD Direction= {($MD1-MD1'$)/$MD1$+($MD2-MD2'$)/$MD2$}/2×100.

Soldering Heat Resistance

As preprocess, one surface of the polyimide film (sized 7 cm width×10 cm length) was subjected to plasma treatment using argon ion, so as to remove, from the one surface, unnecessary organic compounds and the like. After the preprocess, nickel was vacuum deposited by using a sputtering machine (NSP-6, produced by Showa Shinku Co., Ltd.). The vacuum deposited nickel layer was a thin layer having a thickness of about 50 Angstroms(Å). Further, copper was vacuum deposited thereon to a thickness of about 2000 Å, thereby preparing a vacuum metallized polyimide film. Further, the metallized polyimide film was subjected to an electroplating method using a sulfuric copper solution so as to obtain a desired metal thickness (about 20 µm) of the metal layer, thereby preparing a laminate (the electroplating method may be performed as follows: the film article to be plated is dipped as the cathod into a solution containing copper ions and an anode is dipped opposite thereto, and then a direct current is passed therebetween to form a metal coated layer, under metal electroplating conditions of a temperature of 20° C. to 25° C. and a current density of 2 A/dm$^2$). In compliance with JIS C-6471 for evaluating soldering heat resistance under a normal condition, a test piece (20 mm×50 mm) of the flexible printed circuit board (that is, the laminate) was floated, for 10 seconds, on a solder bath of a temperature of 260° C., in such a manner that a copper side of the laminate was in contact with solder. Then, the test piece was removed and cooled down to a room temperature. After cooling, the test piece was evaluated whether or not it was swollen, and whether or not color of the test piece was changed and whether or not the metal was peeling off. In Table 2, × indicates that a test piece of the example showed swelling and/or color change. ○ indicates that a test piece of the example showed none of swelling and color change.

[Coefficient of Hygroscopic Expansion]

A coefficient of hygroscopic expansion was measured by the following calculation method and measuring instrument.

(1) Calculation Method: while humidity is being changed as shown in FIG. 2, an amount of change in humidity (humidity change amount) and extension percentage of the polyimide film were measured at the same time. The humidity extension rate was calculated from the following equation:

Humidity extension rate =

{Hygroscopic Extension Amound($d$) ÷ (Initial Sample Length)} ÷

Humidity Change Amount($b$),

Coefficient of Hygroscopic Expansion={Humidity extension rate}×10$^6$, where the humidity change amount is 50% RH (lowest humidity is 30% RH, where as highest humidity is 80% RH).

Moreover, a 5 mm×20 mm sample was cut out from the polyimide film. An amount of extension of the sample (d) was measured with 3 g weight applied thereon.

(2) Brief Explanation on Measuring Instrument (See FIG. 3)

Temperature during the measurement was controlled by using a thermostat (hot bath). Humidification of the thermostat was carried out by introducing $N_2$ into a water vapor generating apparatus. Humidity condition was controlled by a programmed heating by using a mantle beater. A humidity sensor was so controlled that a sensor temperature thereof was the same as a temperature of the thermostat. The temperature control of the humidity sensor was carried out at a waist part of the sensor. The waist part was located out of the thermostat. A length (extension) of the polyimide film was measured by a TMA (Thermo mechanical Analyzer; TMC-140) manufactured by Shimadzu Corporation.

[Water Absorption Percentage]

The polyimide film was dried at 150° C. for 30 minutes. A weight of the polyimide film thus dried was measured. The weight of the polyimide film thus measured was referred to as W1. Then, the polyimide film was soaked in distilled water for 24 hours. After the soaking, water droplets were wiped off from surfaces of the polyimide film. A weight of the thus treated polyimide film was measured again. The weight thus measured was referred to as W2. From the weights W1 and W2, the water absorption percentage was calculated out by using the following equation:

Water absorption percentage (%)={(W2−W1)/W1}× 100.

Example 2

Into the separable flask used in Example 1 discussed above, 506.4 g of N,N-dimethyl formamide (DMF) was poured as a polymerization solvent. Then, 27.5 g of 4,4-diaminodiphenyl ether (ODA) and 12.1 g of paraphenylene diamine (p-PDA) were added in the separable flask. Mixture thereof was stirred at a temperature of 20° C., so as to prepare a diamine solution in which ODA and p-PDA were completely dissolved in DMF.

Into the diamine solution, 40.0 g of p-phenylene bis (trimellitic monoester anhydride) (TMHQ) was gradually added with stirring the diamine solution, and was sufficiently dispersed in the diamine solution with stirring. The stirring was continued until the TMHQ thus dispersed was completely dissolved in the polymerization solvent. Then, 32.6 g of PMDA was gradually added into the diamine solution, and completely dissolved with stirring. Thereafter, the diamine solution was stirred for 40 minutes by using the stirring apparatus.

Furthermore, not more than 2.7 g of PMDA was gradually added into the mixture with stirring so as to attain a desired viscosity (here, not less than 200 Pa·s but not more than 400 Pa·s). Hereby, a reaction solution is prepared. Note that the reaction solution has a polyamic acid of 18.5% by weight based on a total weight of the reaction solution. Thereafter, the reaction mixture was cooled with stirring for one hour continuously so as to polymerize the diamine and the acid dianhydride into the polyamic acid, thereby obtaining a polyamic acid solution.

The polyamic acid solution was treated in the same manner as in Example 1 so as to produce a polyimide film, and the various properties of the polyimide film were evaluated.

Example 3

Into the separable flask used in Example 1 discussed above, 511.4 g of N,N-dimethyl formamide (DMF) was poured as a polymerization solvent. Then, 30.0 g of 4,4-diaminodiphenyl ether (ODA) and 10.8 g of paraphenylene diamine (p-PDA) were added in the separable flask. Mixture thereof was stirred at a temperature of 20° C., so as to prepare a diamine solution in which ODA and p-PDA were completely dissolved in DMF.

Into the diamine solution, 40.0 g of p-phenylene bis (trimellitic monoester anhydride) (TMHQ) was gradually added with stirring the diamine solution, and was sufficiently dispersed in the diamine solution with stirring. The stirring was continued until the TMHQ thus dispersed was completely dissolved in the polymerization solvent. Then, 32.6 g of PMDA was gradually added into the diamine solution, and completely dissolved with stirring. Thereafter, the diamine solution was stirred for 40 minutes by using the stirring apparatus.

Furthermore, not more than 2.7 g of PMDA was gradually added into the mixture with stirring so as to attain a desired viscosity (here, not less than 200 Pa·s but not more than 400 Pa·s). Hereby, a reaction solution is prepared. Note that the reaction solution has a polyamic acid of 18.5% by weight based on a total weight of the reaction solution. Thereafter, the reaction mixture was cooled with stirring for one hour continuously so as to polymerize the diamine and the acid dianhydride into the polyamic acid, thereby obtaining a polyamic acid solution.

The polyamic acid solution was treated in the same manner as in Example 1 so as to produce a polyimide film, and the various properties of the polyimide film were evaluated.

Example 4

Into the separable flask used in Example 1 discussed above, 575.4 g of N,N-dimethyl formamide (DMF) was poured as a polymerization solvent. Then, 32.0 g of 4,4-diaminodiphenyl ether (ODA) and 14.2 g of paraphenylene diamine (p-PDA) were added in the separable flask. Mixture thereof was stirred at a temperature of 20° C., so as to prepare a diamine solution in which ODA and p-PDA were completely dissolved in DMF.

Into the diamine solution, 40.0 g of p-phenylene bis (trimellitic monoester anhydride) (TMHQ) was gradually added with stirring the diamine solution, and was sufficiently dispersed in the diamine solution with stirring. The stirring was continued until the TMHQ thus dispersed was completely dissolved in the polymerization solvent. Then, 41.2 g of PMDA was gradually added into the diamine solution, and completely dissolved with stirring. Thereafter, the diamine solution was stirred for 40 minutes by using the stirring apparatus.

Furthermore, not more than 3.2 g of PMDA was gradually added into the mixture with stirring so as to attain a desired viscosity (here, not less than 200 Pa·s but not more than 400 Pa·s). Hereby, a reaction solution is prepared. Note that the reaction solution has a polyamic acid of 18.5% by weight based on a total weight of the reaction solution. Thereafter, the reaction mixture was cooled with stirring for one hour continuously so as to polymerize the diamine and the acid dianhydride into the polyamic acid, thereby obtaining a polyamic acid solution.

The polyamic acid solution was treated in the same manner as in Example 1 so as to-produce a polyimide film, and the various properties of the polyimide film were evaluated.

Example 5

Into the separable flask used in Example 1 discussed above, 569.5 g of N,N-dimethyl formamide (DMF) was poured as a polymerization solvent. Then, 29.1 g of 4,4-diaminodiphenyl ether (ODA) and 15.7 g of paraphenylene diamine (p-PDA) were added in the separable flask. Mixture thereof was stirred at a temperature of 20° C., so as to prepare a diamine solution in which ODA and p-PDA were completely dissolved in DMF.

Into the diamine solution, 40.0 g of p-phenylene bis (trimellitic monoester anhydride) (TMHQ) was gradually added with stirring the diamine solution, and was sufficiently dispersed in the diamine solution with stirring. The stirring was continued until the TMHQ thus dispersed was completely dissolved in the polymerization solvent. Then, 41.2 g of PMDA was gradually added into the diamine solution, and completely dissolved with stirring. Thereafter, the diamine solution was stirred for 40 minutes by using the stirring apparatus.

Furthermore, not more than 3.2 g of PMDA was gradually added into the mixture with stirring so as to attain a desired viscosity (here, not less than 200 Pa·s but not more than 400 Pa·s). Hereby, a reaction solution is prepared. Note that the reaction solution has a polyamic acid of 18.5% by weight based on a total weight of the reaction solution. Thereafter, the reaction mixture was cooled with stirring for one hour continuously so as to polymerize the diamine and the acid dianhydride into the polyamic acid, thereby obtaining a polyamic acid solution.

The polyamic acid solution was treated in the same manner as in Example 1 so as to produce a polyimide film, and the various properties of the polyimide film were evaluated.

Example 6

Into the separable flask used in Example 1 discussed above, 450.2 g of N,N-dimethyl formamide (DMF) was poured as a polymerization solvent. Then, 21.8 g of 4,4-diaminodiphenyl ether (ODA) and 11.8 g of paraphenylene diamine (p-PDA) were added in the separable flask. Mixture thereof was stirred at a temperature of 20° C., so as to prepare a diamine solution in which ODA and p-PDA were completely dissolved in DMF.

Into the diamine solution, 40.0 g of p-phenylene bis (trimellitic monoester anhydride) (TMHQ) was gradually added with stirring the diamine solution, and was sufficiently dispersed in the diamine solution with stirring. The stirring was continued until the TMHQ thus dispersed was completely dissolved in the polymerization solvent. Then, 26.2 g of PMDA was gradually added into the diamine solution, and completely dissolved with stirring. Thereafter, the diamine solution was stirred for 40 minutes by using the stirring apparatus.

Furthermore, not more than 2.4 g of PMDA was gradually added into the mixture with stirring so as to attain a desired viscosity (here, not less than 200 Pa·s but not more than 400 Pa·s). Hereby, a reaction solution is prepared. Note that the reaction solution has a polyamic acid of 18.5% by weight based on a total weight of the reaction solution. Thereafter, the reaction mixture was cooled with stirring for one hour continuously so as to polymerize the diamine and the acid dianhydride into the polyamic acid, thereby obtaining a polyamic acid solution.

The polyamic acid solution was treated in the same manner as in Example 1 so as to produce a polyimide film, and the various properties of the polyimide film were evaluated.

Example 7

Into the separable flask used in Example 1 discussed above, 496.3 g of N,N-dimethyl formamide (DMF) was poured as a polymerization solvent. Then, 22.5 g of 4,4-diaminodiphenyl ether (ODA) and 14.8 g of paraphenylene diamine (p-PDA) were added in the separable flask. Mixture thereof was stirred at a temperature of 20° C., so as to prepare a diamine solution in which ODA and p-PDA were completely dissolved in DMF.

Into the diamine solution, 40.0 g of p-phenylene bis (trimellitic monoester anhydride) (TMHQ) was gradually added with stirring the diamine solution, and was sufficiently dispersed in the diamine solution with stirring. The stirring was continued until the TMHQ thus dispersed was completely dissolved in the polymerization solvent. Then, 32.6 g of PMDA was gradually added into the diamine solution, and completely dissolved with stirring. Thereafter, the diamine solution was stirred for 40 minutes by using the stirring apparatus.

Furthermore, not more than 2.7 g of PMDA was gradually added into the mixture with stirring so as to attain a desired viscosity (here, not less than 200 Pa·s but not more than 400 Pa·s). Hereby, a reaction solution is prepared. Note that the reaction solution has a polyamic acid of 18.5% by weight based on a total weight of the reaction solution. Thereafter, the reaction mixture was cooled with stirring for one hour continuously so as to polymerize the diamine and the acid dianhydride into the polyamic acid, thereby obtaining a polyamic acid solution.

The polyamic acid solution was treated in the same manner as in Example 1 so as to produce a polyimide film, and the various properties of the polyimide film were evaluated.

Example 8

Into the separable flask used in Example 1 discussed above, 491.2 g of N,N-dimethyl formamide (DMF) was poured as a polymerization solvent. Then, 20.0 g of 4,4-diaminodiphenyl ether (ODA) and 16.2 g of paraphenylene diamine (p-PDA) were added in the separable flask. Mixture thereof was stirred at a temperature of 20° C., so as to prepare a diamine solution in which ODA and p-PDA were completely dissolved in DMF.

Into the diamine solution, 40.0 g of p-phenylene bis (trimellitic monoester anhydride) (TMHQ) was gradually added with stirring the diamine solution, and was sufficiently dispersed in the diamine solution with stirring. The stirring was continued until the TMHQ thus dispersed was completely dissolved in the polymerization solvent. Then, 32.6 g of PMDA was gradually added into the diamine solution, and completely dissolved with stirring. Thereafter, the diamine solution was stirred for 40 minutes by using the stirring apparatus.

Furthermore, not more than 2.7 g of PMDA was gradually added into the mixture with stirring so as to attain a desired viscosity (here, not less than 200 Pa·s but not more than 400 Pa·s). Hereby, a reaction solution is prepared. Note that the reaction solution has a polyamic acid of 18.5% by weight based on a total weight of the reaction solution. Thereafter, the reaction mixture was cooled with stirring for one hour continuously so as to polymerize the diamine and the acid dianhydride into the polyamic acid, thereby obtaining a polyamic acid solution.

The polyamic acid solution was treated in the same manner as in Example 1 so as to produce a polyimide film, and the various properties of the polyimide film were evaluated.

Example 9

Into the separable flask used in Example 1 discussed above, 590.5 g of N,N-dimethyl formamide (DMF) was poured as a polymerization solvent. Then, 31.3 g of 4,4-diaminodiphenyl ether (ODA) and 15.6 g of paraphenylene diamine (p-PDA) were added in the separable flask. Mixture thereof was stirred at a temperature of 20° C., so as to prepare a diamine solution in which ODA and p-PDA were completely dissolved in DMF.

Into the diamine solution, 4.4 g of 3,3',4,4'-biphenyltetracarboxylic dianhydride (BPDA), and 40.0 g of p-phenylene bis(trimellitic monoester anhydride) (TMHQ) were gradually added with stirring the diamine solution, and were completely dissolved in the diamine solution with stirring. The stirring was continued until the PBDA and TMHQ thus dispersed was completely dissolved in the polymerization solvent. Then, 39.4 g of PMDA was gradually added into the diamine solution, and completely dissolved with stirring. Thereafter, the diamine solution was stirred for 40 minutes by using the stirring apparatus.

Furthermore, not more than 3.3 g of PMDA was gradually added into the mixture with stirring so as to attain a desired viscosity (here, not less than 200 Pa·s but not more than 400 Pa·s). Hereby, a reaction solution is prepared. Note that the reaction solution has a polyamic acid of 18.5% by weight based on a total weight of the reaction solution. Thereafter, the reaction mixture was cooled with stirring for one hour continuously so as to polymerize the diamine and the acid dianhydride into the polyamic acid, thereby obtaining a polyamic acid solution.

The polyamic acid solution was treated in the same manner as in Example 1 so as to produce a polyimide film, and the various properties of the polyimide film were evaluated.

Example 10

Into the separable flask used in Example 1 discussed above, 532.7 g of N,N-dimethyl formamide (DMF) was poured as a polymerization solvent. Then, 27.5 g of 4,4-diaminodiphenyl ether (ODA) and 13.7 g of paraphenylene diamine (p-PDA) were added in the separable flask. Mixture thereof was stirred at a temperature of 20° C., so as to prepare a diamine solution in which ODA and p-PDA were completely dissolved in DMF.

Into the diamine solution, 3.9 g of 3,3',4,4'-biphenyltetracarboxylic dianhydride (BPDA), and 40.0 g of p-phenylene bis(trimellitic monoester anhydride) (TMHQ) were gradually added with stirring the diamine solution, and were completely dissolved in the diamine solution with stirring. The stirring was continued until the BPDA and TMHQ thus dispersed was completely dissolved in the polymerization solvent. Then, 32.9 g of PMDA was gradually added into the diamine solution, and completely dissolved with stirring. Thereafter, the diamine solution was stirred for 40 minutes by using the stirring apparatus.

Furthermore, not more than 2.9 g of PMDA was gradually added into the mixture with stirring so as to attain a desired viscosity (here, not less than 200 Pa·s but not more than 400 Pa·s). Hereby, a reaction solution is prepared. Note that the reaction solution has a polyamic acid of 18.5% by weight based on a total weight of the reaction solution. Thereafter, the reaction mixture was cooled with stirring for one hour continuously so as to polymerize the diamine and the acid dianhydride into the polyamic acid, thereby obtaining a polyamic acid solution.

The polyamic acid solution was treated in the same manner as in Example 1 so as to produce a polyimide film, and the various properties of the polyimide film were evaluated.

Example 11

Into the separable flask used in Example 1 discussed above, 528.4 g of N,N-dimethyl formamide (DMF) was poured as a polymerization solvent. Then, 25.4 g of 4,4-diaminodiphenyl ether (ODA) and 14.9 g of paraphenylene diamine (p-PDA) were added in the separable flask. Mixture thereof was stirred at a temperature of 20° C., so as to prepare a diamine solution in which ODA and p-PDA were completely dissolved in DMF.

Into the diamine solution, 3.9 g of 3,3',4,4'-biphenyltetracarboxylic dianhydride (BPDA), and 40.0 g of p-phenylene bis(trimellitic monoester anhydride) (TMHQ) were gradually added with stirring the diamine solution, and were completely dissolved in the diamine solution with stirring. The stirring was continued until the BPDA and TMHQ thus dispersed was completely dissolved in the polymerization solvent. Then, 32.9 g of PMDA was gradually added into the diamine solution, and completely dissolved with stirring. Thereafter, the diamine solution was stirred for 40 minutes by using the stirring apparatus.

Furthermore, not more than 2.9 g of PMDA was gradually added into the mixture with stirring so as to attain a desired viscosity (here, not less than 200 Pa·s but not more than 400 Pa·s). Hereby, a reaction solution is prepared. Note that the reaction solution has a polyamic acid of 18.5% by weight based on a total weight of the reaction solution. Thereafter, the reaction mixture was cooled with stirring for one hour continuously so as to polymerize the diamine and the acid dianhydride into the polyamic acid, thereby obtaining a polyamic acid solution.

The polyamic acid solution was treated in the same manner as in Example 1 so as to produce a polyimide film, and the various properties of the polyimide film were evaluated.

Example 12

Into the separable flask used in Example 1 discussed above, 593.3 g of N,N-dimethyl formamide (DMF) was poured as a polymerization solvent. Then, 25.3 g of 4,4-diaminodiphenyl ether (ODA) and 18.9 g of paraphenylene diamine (p-PDA) were added in the separable flask. Mixture thereof was stirred at a temperature of 20° C., so as to prepare a diamine solution in which ODA and p-PDA were completely dissolved in DMF.

Into the diamine solution, 15.1 g of 3,3',4,4'-biphenyltetracarboxylic dianhydride (BPDA), and 40.0 g of p-phenylene bis(trimellitic monoester anhydride) (TMHQ) were gradually added with stirring the diamine solution, and were completely dissolved in the diamine solution with stirring. The stirring was continued until the BPDA and TMHQ thus dispersed was completely dissolved in the polymerization solvent. Then, 32.2 g of PMDA was gradually added into the diamine solution, and completely dissolved with stirring. Thereafter, the diamine solution was stirred for 40 minutes by using the stirring apparatus.

Furthermore, not more than 3.3 g of PMDA was gradually added into the mixture with stirring so as to attain a desired viscosity (here, not less than 200 Pa·s but not more than 400 Pa·s). Hereby, a reaction solution is prepared. Note that the reaction solution has a polyamic acid of 18.5% by weight based on a total weight of the reaction solution. Thereafter, the reaction mixture was cooled with stirring for one hour continuously so as to polymerize the diamine and the acid dianhydride into the polyamic acid, thereby obtaining a polyamic acid solution.

The polyamic acid solution was treated in the same manner as in Example 1 so as to produce a polyimide film, and the various properties of the polyimide film were evaluated.

Comparative Example 1

Into the separable flask used in Example 1 discussed above, 378.6 g of N,N-dimethyl formamide (DMF) was poured as a polymerization solvent. Then, 17.5 g of ODA and 9.4 g of p-PDA were added in the separable flask. Mixture thereof was stirred at a temperature of 20° C., so as to prepare a diamine solution in which ODA and p-PDA were completely dissolved in DMF.

Into the diamine solution, 40.0 g of p-phenylene bis (trimellitic monoester anhydride) (TMHQ) was gradually added with stirring the diamine solution, and was sufficiently dispersed in the diamine solution with stirring. The stirring was continued until the TMHQ thus dispersed was completely dissolved in the polymerization solvent. Then, 17.1 g of PMDA was gradually added into the diamine solution, and completely dissolved with stirring. Thereafter, the diamine solution was stirred for 40 minutes by using the stirring apparatus.

Furthermore, not more than 1.9 g of PMDA was gradually added into the mixture with stirring so as to attain a desired viscosity (here, not less than 200 Pa·s but not more than 400 Pa·s). Hereby, a reaction solution is prepared. Note that the reaction solution has a polyamic acid of 18.5% by weight based on a total weight of the reaction solution. Thereafter, the reaction mixture was cooled with stirring for one hour continuously so as to polymerize the diamine and the acid dianhydride into the polyamic acid, thereby obtaining a polyamic acid solution (polymer varnish).

[Production of Polyimide Film]

The thus obtained polymer varnish was mixed with acetic anhydride (AA) and isoquinoline (IQ). A mixture of the polymer varnish, AA and IQ was flow-cast on an aluminum board, and then dried at a temperature of 100° C. for 5 minutes, so as to obtain a gel film. The thus obtained gel film was peeled off from the aluminum board, and fixed on a supporting frame. Then, the film fixed on the supporting frame was heated , at a temperature of 350° C. for 20 seconds, at a temperature of 450° C. for 20 seconds, and then at a temperature of 500° C. for 20 seconds, so as to perform ring-closing dehydration of the polyamic acid by drying the film. Thereby, a polyimide film having a thickness of 25 µm.

The thus obtained polyimide film was evaluated for the various properties by using the methods descried in Example 1. Results of the evaluation are shown on Table 1.

TABLE 1

| | Molar Ratio of Monomer added | | | | | Temp. of tan δ peak | tan δ (300° C.) | Thermal Shrinkage Rate | |
|---|---|---|---|---|---|---|---|---|---|
| | TMHQ | PMDA | BPDA | ODA | PDA | | | MD (%) | TD (%) |
| Ex. 1 | 35 | 65 | | 50 | 50 | 345 | 0.018 | 0.16 | 0.10 |
| Ex. 2 | 35 | 65 | | 55 | 45 | 340 | 0.032 | 0.20 | 0.14 |
| Ex. 3 | 35 | 65 | | 60 | 40 | 346 | 0.018 | 0.18 | 0.15 |
| Ex. 4 | 30 | 70 | | 55 | 45 | 350 | 0.017 | 0.16 | 0.13 |
| Ex. 5 | 30 | 70 | | 50 | 50 | 353 | 0.017 | 0.16 | 0.10 |
| Ex. 6 | 40 | 60 | | 50 | 50 | 355 | 0.031 | 0.25 | 0.02 |
| Ex. 7 | 35 | 65 | | 45 | 55 | 353 | 0.021 | 0.20 | 0.09 |
| Ex. 8 | 35 | 65 | | 40 | 60 | 346 | 0.017 | 0.18 | 0.11 |
| Ex. 9 | 29 | 65 | 5 | 52 | 48 | 360 | 0.017 | 0.17 | 0.12 |
| Ex. 10 | 33 | 62 | 5 | 52 | 48 | 345 | 0.025 | 0.21 | 0.07 |
| Ex. 11 | 33 | 62 | 5 | 48 | 52 | 361 | 0.019 | 0.17 | 0.09 |
| Ex. 12 | 29 | 54 | 17 | 42 | 58 | 340 | 0.033 | 0.25 | 0.08 |
| C. Ex. 1 | 50 | 50 | | 50 | 50 | 305 | 0.057 | 0.52 | −0.05 |

Abbreviation: Ex. stands for Example.
C. Ex stands for Comparative Example.

As shown on Table 1, the polyimide film of Comparative Example 1 had a significant problem in terms of the thermal shrinkage percentage.

Comparative Example 2

Into the separable flask used in Example 1 discussed above, 253.5 g of N. N-dimethyl formamide (DMF) was poured as a polymerization solvent. Then, 27.5 g (0.087 mole) of ODA was added in the separable flask. Mixture thereof was stirred at a temperature of 20° C., so as to prepare a diamine solution in which ODA was completely dissolved in DMF. Then, 29.9 g (0.078 mole) of PMDA was added into the diamine solution, and completely dissolved in the diamine solution with stirring. Thereafter, the diamine solution was stirred for 40 minutes by using the stirring apparatus.

Furthermore, not more than 0.2 g of PMDA was gradually added into the mixture with stirring so as to attain a desired viscosity (here, not less than 200 Pa·s but not more than 400 Pa·s). Hereby, a reaction solution is prepared. Note that the reaction solution has a polyamic acid of 18.5% by weight based on a total weight of the reaction solution. Thereafter, the reaction mixture was cooled with stirring for one hour continuously so as to polymerize the diamine and the acid dianhydride into the polyamic acid, thereby obtaining a polyamic acid solution (polymer varnish).

[Production of Polyimide Film]

The thus obtained polymer varnish was mixed with acetic anhydride (AA) and isoquinoline (IQ). A mixture of the polymer varnish, AA and IQ was flow-cast on an aluminum board, and then dried at a temperature of 100° C. for 5 minutes, so as to obtain a gel film. The thus obtained gel film was peeled off from the aluminum board, and fixed on a supporting frame. Then, the film fixed on the supporting frame was heated, at a temperature of 350° C. for 20 seconds, at a temperature of 450° C. for 20 seconds, and then at a temperature of 500° C. for 20 seconds, so as to perform ring-closing dehydration of the polyamic acid by drying the film. Thereby, a-polyimide film having a thickness of 25 μm.

Note that no tan δ peak of the film was detected under 420° C. Property evaluation of the thus obtained polyimide film was carried out by evaluating its coefficient of hygroscopic expansion, water absorption percentage, and soldering heat resistance, discussed in Example 1. Results of the evaluation is shown on Table 2.

TABLE 2

| | Coefficient of Hygroscopic Expansion (ppm) | Water Absorption percentage (%) | Soldering Heat Resistance |
|---|---|---|---|
| Ex. 1 | 6.8 | 1.5 | o |
| Ex. 2 | 7.3 | 1.5 | o |
| Ex. 3 | 7.5 | 1.5 | o |
| Ex. 4 | 6.8 | 1.5 | o |
| Ex. 5 | 6.1 | 1.5 | o |
| Ex. 6 | 6.0 | 1.3 | o |
| Ex. 7 | 7.2 | 1.6 | o |
| Ex. 8 | 11 | 1.7 | o |
| Ex. 9 | 5.8 | 1.3 | o |
| Ex. 10 | 6.3 | 1.4 | o |
| Ex. 11 | 5.6 | 1.3 | o |
| Ex. 12 | 5.8 | 1.4 | o |
| C. Ex. 2 | 20 | 3.0 | x |

Abbreviation:
Ex. stands for Example.
C. Ex. stands for Comparative Example.

As shown on Table 2, the polyimide film of Comparative Example 2 had a high water absorption percentage, and a high coefficient of hygroscopic expansion. Thus, it is a problem that the polyimide film of Comparative Example 2 was poor in the soldering heat resistance.

From the results of Examples 1 to 12, and Comparative Examples 1 and 2, it was confirmed that, compared with other polyimide films, the polyimide film of the present invention has a low thermal shrinkage rate at such a high temperature of 300° C., the polyimide film of the present invention having such a dynamic viscoelasticity that the tan δ value of dynamic viscoelasticity is located in a range of not less than 310° C. but not more than 410° C., and the tanδ value of the dynamic viscoelasticity at 300° C. is not more than 0.05.

Example 13

In the present example, polyamic acid was produced by using a reactor provided with (i) a stainless separable flask as a reaction vessel, (ii) a stirring screw having two puddles (two-blade stirrer) as a stirring apparatus provided inside the separable flask, and (iii) a cooling apparatus having a cooling capacity of 20.9 kJ/min. In order to prevent water from being mixed in the polymerization, polymerization was carried in a nitrogen gas flowing through the reactor at a rate of 0.05 L/min, the nitrogen gas being dehydrated (desiccated) by passing through silica gel before being introduced into the reactor.

Into the separable flask, 527.9 g of N,N-dimethyl formamide (DMF) was poured as a polymerization solvent. Then, 25.2 g (0.126 mole) of 4,4-diaminodiphenyl ether (ODA) and 15.0 g (0.139) of paraphenylene diamine (p-PDA) were added in the separable flask. Then, into the solution, a mixture of (a) 40.0 g (0.087 mole) of p-phenylene bis (trimellitic monoester anhydride) (TMHQ), (b) 3.90 g (0.013 mole) of 3,3',4,4'-biphenyl tetracarboxylic dianhydride (BPDA), and (c) 32.9 g (0.151 mole) of pyromellitic dianhydride (PMDA) was gradually added with stirring the diamine solution. Copolymerization of those compounds was carried out at a temperature of 20° C. with stirring.

Then, not more than 2.9 g (0.013 mole) of PMDA was gradually added into the mixture with stirring so as to attain a desired viscosity (here, not less than 200 Pa·s but not more than 400 Pa·s). Hereby, a reaction solution is prepared. Note that the reaction solution has a polyamic acid of 18.5% by weight based on a total weight of the reaction solution. Thereafter, the reaction mixture was cooled with stirring for one hour continuously so as to polymerize the diamine and the acid dianhydride into the polyamic acid, thereby obtaining a polyamic acid solution (polymer varnish).

The polyamic acid solution in a glass bottle was kept in a water bath for one hour, the water bath having a temperature kept at 23° C. After the one hour time, viscosity of the polyamic acid was measured by using the B-type viscometer. The measurement of the viscosity was carried out with a roller of No. 7 and a revolution speed of 4 rpm. The measurement showed that the polyamic acid solution had a viscosity of 250 Pa·s.

[Production of Polyimide Film]

The thus obtained polymer varnish was mixed with acetic anhydride (AA) and isoquinoline (IQ). A mixture of the polymer varnish, AA and IQ was flow-cast on an aluminum board, and then dried at a temperature of 100° C. for 5 minutes, so as to obtain a gel film. The thus obtained gel film was peeled off from the aluminum board, and fixed on a supporting frame. Then, the film fixed on the supporting frame was heated at a temperature of 350° C. for 20 seconds, at a temperature of 450° C. for 20 seconds, and then at a temperature of 500° C. for 20 seconds, so as to perform ring-closing dehydration of the polyamic acid by drying the film. Thereby, a polyimide film having a thickness of 25 μm.

Properties of the thus obtained polyimide film were evaluated. Result of the evaluation is shown on Table 3. Note that the properties of the polyimide film were evaluated in the following methods.

[Evaluation Methods]

[Coefficient of Linear Expansion]

By using a TMA instrument (Produce Code: 120C) manufactured by Seiko Electronic Co., Ltd., a coefficient of linear expansion was measured at a temperature elevated from 100° C. to 200° C. at a rate of 10° C./minute. The measurement was carried out in a flow of nitrogen gas.

[Modulus of Elasticity]

By using a tension testing instrument (autograph S-100-C) manufactured by Shimadzu Co., a modulus of elasticity was measured in conformity with ASTM-D882.

[Coefficient of Hygroscopic Expansion]

The coefficient of hygroscopic expansion is measured as follows: a 5 mm×20 mm piece of the polyimide film, on which a minimum weight was applied so as not to allow the piece to be slack, was saturated at a relative humidity of 30% RH, then a size of the piece was measured. The same procedure was repeated at a relative humidity of 80% RH. From results of both the measurements, a dimensional change ratio per a 1% difference in relative humidity as the coefficient of hygroscopic expansion.

[Tear-Through Resistance]

Tear-through resistance was measured in accordance with ASTM D1938.

[Harsh Environmental Resistance Test as to Tear-Through Resistance]

The harsh environmental resistance test was carried out for 48 hours by using an environmental testing apparatus conditioned as a temperature of 150° C., a humidity of 100% RH, and 4 atmospheric pressure. After that, thus treated film was measured as to tear-through resistance (X). An initial tear-through resistance (Y) (tear-through resistance before exposing the film to the environment) was also measured. A retention rate (P) of tear-through resistance was calculated from the following equation:

Retention Rate(P) of Tear-through resistance=$X/Y \times 100$.

[Peel Strength Measurement for Laminate Having Metal Layer and the Polyimide Film]

As preprocess, one surface of the polyimide film was subjected to plasma treatment using argon ion, so as to remove, from the one surface, unnecessary organic compounds and the like. After the preprocess, nickel was vacuum deposited thereon by using a sputtering machine (NSP-6, produced by Showa Vacuum Co., Ltd.). The vacuum deposited nickel layer was a thin layer having a thickness of about 50 Angstroms(Å). Further, copper was vacuum deposited thereon to a thickness of about 2000 Å, thereby preparing a metallized polyimide film. Further, Further, the metallized polyimide film was subjected to an electroplating method using a sulfuric copper solution so as to obtain a desired metal thickness (about 20 μm) of the metal layer, thereby preparing a laminate (the electroplating method may be performed as follows: the film article to be plated is dipped as the cathod into a solution containing copper ions and an anode is dipped opposite thereto, and then a direct current is passed therebetween to form a metal coated layer, under metal electroplating conditions of a temperature of 20° C. to 25° C. and a current density of 2 A/dm$^2$). A peel strength of the metal layer of the laminate was measured in conformity of JIS C-6471 as follows: A metal pattern of 1 mm thickness was prepared on the metal layer. The metal pattern was peeled to 90 degrees so as to evaluate the peel strength. The peel strength thus measured was put as PX (N/cm).

Moreover, the peel strength after temperature aging was measured as follows.

The laminate was kept at a temperature of 150° C. for 60 hours. Then, the peel strength of the metal and polyimide film was measured in conformity of JIS C-6471 as follows: A metal pattern of 1 mm thickness was prepared on the metal layer. The metal pattern was peeled to 90 degrees so as to evaluate the peel strength. The peel strength thus measured was put as PZ(N/cm).

The retention rate of the peeling strength after temperature aging was calculated by the following equation:

Retention Rate of Peeling Strength After Temperature Aging=$PZ/PX \times 100$.

[Measurement of Alkali-Etching Speed]

As an etching solution, a 1N potassium hydroxide etching solution was prepared by solving potassium hydroxide in a solution of ethanol and water in a ratio of 80:20. Initial thickness (film thickness before etching) of the polyimide film was measured five times to give five readings. An average of the readings was put as X μm. After measuring its thickness, the polyimide film was soaked for 5 minutes in the etching solution heated up to 36° C. The film was so soaked that both sides of the film were etched. While being soaked, the film was moved up and down at a rate of 30 times/minute, so as to swing the film in the etching solution. Next, the thus etched film (sample) was washed in distilled water, and then dried for 15 minute in an oven heated to 50° C. After drying, thickness of the film was measured by taking five readings at the same portion at which the five reading of the initial thickness were measured. An average of the five readings after drying was put as Y μm.

Accordingly, the etching speed was calculated by the following equation:

Etching Speed={(X−Y)/2}+5.

Note that the etching speed indicates the etching speed of one side of the film (that is, how fast the one side of the film is etched). Thus, unit of the etching speed is μm/minute (one side).

Examples 14 to 20

By following the same procedure as in Example 13, polyamic acid solutions respectively containing a diamine component and an acid dianhydride component in ratios shown on Tables 3 to 5 were obtained in Examples 14 to 20. After that, polyimide films were produced in the same manner as in Example 13. Then, properties of the films and peel strength of laminate respectively using the films were measured. Results of the measurement are shown on Tables 3 to 5.

Comparative Example 3

Into a separable flask, 337.5 g of N,N-dimethyl formamide (DMF) was poured as a polymerization solvent. Then, 36.7 g (0.183 mole) of 4,4-diaminodiphenyl ether (ODA) was added in the separable flask. Mixture thereof was stirred at a temperature of 20° C., so as to prepare a diamine solution in which ODA was completely dissolved in DMF.

Into the diamine solution, 36.0 g (0.165 mole) of PMDA was gradually added with stirring the diamine solution, and was sufficiently dispersed in the diamine solution with stirring. The stirring was continued until the PMDA thus dispersed was completely dissolved in the polymerization solvent. Thereafter, the diamine solution was stirred for 40 minutes by using the stirring apparatus.

Furthermore, not more than 3.9 g (0.018 mole) of PMDA was gradually added into the mixture with stirring so as to attain a desired viscosity (here, not less than 200 Pa·s but not more than 400 Pa·s). Hereby, a reaction solution is prepared. Note that the reaction solution has a polyamic acid of 18.5% by weight based on a total weight of the reaction solution. Thereafter, the reaction mixture was cooled with stirring for one hour continuously so as to polymerize the diamine and the acid dianhydride into the polyamic acid, thereby obtaining a polyamic acid solution (polymer varnish).

The polyamic acid solution in a glass bottle was kept in a water bath for one hour, the water bath having a temperature kept at 23° C. After the one hour time, viscosity of the polyamic acid was measured by using the B-type viscometer. The measurement of the viscosity was carried out with a roller of No. 7 and a revolution speed of 4 rpm. The measurement showed that the polyamic acid solution had a viscosity of 240 Pa·s.

[Production of Polyimide Film]

The thus obtained polymer varnish was mixed with acetic anhydride (AA) and isoquinoline (IQ). A mixture of the polymer varnish, AA and IQ was flow-cast on an aluminum board, and then dried at a temperature of 100° C. for 5 minutes, so as to obtain a gel film. The thus obtained gel film was peeled off from the aluminum board, and fixed on a supporting frame. Then, the film fixed on the supporting frame was heated, at a temperature of 350° C. for 20 seconds, at a temperature of 450° C. for 20 seconds, and then at a temperature of 500° C. for 20 seconds, so as to perform ring-closing dehydration of the polyamic acid by drying the film. Thereby, a polyimide film having a thickness of 25 μm.

Properties of the polyimide film was evaluated in the same manner as in Example 13.

It was confirmed that the polyimide film of Comparative Example 3 had a significant problem in the coefficient of hygroscopic expansion, and further had such a problem that its modulus of elasticity was so low and its coefficient of linear expansion was so high.

Comparative Example 4

Into a separable flask, 319.4 g of DMF was poured as a polymerization solvent. Then, 27.5 g (0.137) of ODA, and 5.0 g (0.046 mole) of p-PDA were added in the separable flask. Mixture thereof was stirred at a temperature of 20° C., so as to prepare a diamine solution in which ODA and p-PDA were completely dissolved in DMF.

Into the diamine solution, 35.0 g (0.160 mole) of PMDA was gradually added with stirring the diamine solution, and was sufficiently dispersed in the diamine solution with stirring. The stirring was continued until the TMHQ thus dispersed was completely dissolved in the polymerization solvent. Thereafter, the diamine solution was stirred for 40 minutes by using the stirring apparatus.

Furthermore, not more than 5.0 g (0.023 mole) of PMDA was gradually added into the mixture with stirring so as to attain a desired viscosity (here, not less than 200 Pa·s but not more than 400 Pa·s). Hereby, a reaction solution is prepared. Note that the reaction solution has a polyamic acid of 18.5% by weight based on a total weight of the reaction solution. Thereafter, the reaction mixture was cooled with stirring for one hour continuously so as to polymerize the diamine and the acid dianhydride into the polyamic acid, thereby obtaining a polyamic acid solution (polymer varnish).

The polyamic acid solution in a glass bottle was kept in a water bath for one hour, the water bath having a temperature kept at 23° C. After the one hour time, viscosity of the polyamic acid was measured by using the B-type viscometer. The measurement of the viscosity was carried out with a roller of No. 7 and a revolution speed of 4 rpm. The measurement showed that the polyamic acid solution had a viscosity of 240 Pa·s.

[Production of Polyimide Film]

The thus obtained polymer varnish was mixed with acetic anhydride (AA) and isoquinoline (IQ). A mixture of the polymer varnish, AA and IQ was flow-cast on an aluminum board, and then dried at a temperature of 100° C. for 5 minutes, so as to obtain a gel film. The thus obtained gel film was peeled off from the aluminum board, and fixed on a supporting frame. Then, the film fixed on the supporting frame was heated, at a temperature of 350° C. for 20 seconds, at a temperature of 450° C. for 20 seconds, and then at a temperature of 500° C. for 20 seconds, so as to perform ring-closing dehydration of the polyamic acid by drying the film. Thereby, a polyimide film having a thickness of 25μm.

Properties of the thus obtained polyimide film were evaluated. Results of the evaluation are shown on Table 6. Note that the evaluation of the properties of the polyimide film was carried out in the same manner as in Example 13. It was confirmed that the polyimide film of Comparative Example 4 had such a problem that its modulus of elasticity was low and its stability against harsh environment was low.

Comparative Example 5

Into a separable flask, 378.9 g of N,N-dimethyl formamide (DMF) was poured as a polymerization solvent. Then, 17.5 g (0.087 mole) of 4,4-diaminodiphenyl ether (ODA) and 9.4 g (0.087 mole) of p-PDA were added in the separable flask. Mixture thereof was stirred at a temperature of 20° C., so as to prepare a diamine solution in which ODA and p-PDA were completely dissolved in DMF.

Into the diamine solution, 40.0 g (0.087 mole) of TMHQ was gradually added with stirring the diamine solution, and was sufficiently dispersed in the diamine solution with stirring. The stirring was continued until the TMHQ thus dispersed was completely dissolved in the polymerization solvent. Then, 17.1 g (0.078 mole) of PMDA was gradually added into the diamine solution, and completely dissolved with stirring. Thereafter, the diamine solution was stirred for 40 minutes by using the stirring apparatus.

Furthermore, not more than 2.0 g (0.009 mole) of PMDA was gradually added into the mixture with stirring so as to attain a desired viscosity (here, not less than 200 Pa·s but not more than 400 Pa·s). Hereby, a reaction solution is prepared. Note that the reaction solution has a polyamic acid of 18.5% by weight based on a total weight of the reaction solution. Thereafter, the reaction mixture was cooled with stirring for one hour continuously so as to polymerize the diamine and the acid dianhydride into the polyamic acid, thereby obtaining a polyamic acid solution (polymer varnish).

The polyamic acid solution was kept in a water bath for one hour, the water bath having a temperature kept at 23° C. After the one hour time, viscosity of the polyamic acid was measured by using the B-type viscometer. The measurement of the viscosity was carried out with a roller of No. 7 and a revolution speed of 4 rpm. The measurement showed that the polyamic acid solution had a viscosity of 250 Pa·s.

[Production of Polyimide Film]

The thus obtained polymer varnish was mixed with acetic anhydride (AA) and isoquinoline (IQ). A mixture of the polymer varnish, AA and IQ was flow-cast on an aluminum board, and then dried at a temperature of 100° C. for 5 minutes, so as to obtain a gel film. The thus obtained gel film was peeled off from the aluminum board, and fixed on a supporting frame. Then, the film fixed on the supporting frame was heated, at a temperature of 350° C. for 20 seconds, at a temperature of 450° C. for 20 seconds, and then at a temperature of 500° C. for 20 seconds, so as to perform ring-closing dehydration of the polyamic acid by drying the film. Thereby, a polyimide film having a thickness of 25 μm.

Properties of the thus obtained polyimide film were evaluated. Results of the evaluation are shown on Table 6. Note that the evaluation of the properties of the polyimide film was carried out in the same manner as in Example 13.

The polyimide film of Comparative Example 5 had such a problem that its stability against harsh environment was low and its retention rates of adhesive strength (peel strength) after exposing to harsh environment and after aging were low. Thus, the polyimide film of Comparative Example 5 was not suitable for use in laminate having a metal layer and the polyimide film.

Comparative Example 6

Into a separable flask, 361.5 g of N-methyl-2-pyrrolidone (NMP) was poured as a polymerization solvent. Then, 22.1 g (0.204 mole) of p-PDA was added in the separable flask. Mixture thereof was stirred at a temperature of 20° C., so as to prepare a diamine solution in which p-PDA was completely dissolved in DMF. BPDA was gradually added with stirring the diamine solution, and was completely dissolved in the diamine solution with stirring.

Furthermore, not more than 3.0 g (0.010 mole) of powder of BPDA was gradually added into the mixture with stirring so as to attain a desired viscosity (here, not less than 200 Pa·s but not more than 400 Pa·s). Hereby, a reaction solution is prepared. Note that the reaction solution has a polyamic acid of 18.5% by weight based on a total weight of the reaction solution. Thereafter, the reaction mixture was cooled with stirring for one hour continuously so as to polymerize the diamine and the acid dianhydride into the polyamic acid, thereby obtaining a polyamic acid solution (polymer varnish).

The polyamic acid solution in a glass bottle was kept in a water bath for one hour, the water bath having a temperature kept at 23° C. After the one hour time, viscosity of the polyamic acid was measured by using the B-type viscometer. The measurement of the viscosity was carried out with a roller of No. 7 and a revolution speed of 4 rpm. The measurement showed that the polyamic acid solution had a viscosity of 250 Pa·s.

[Production of Polyimide Film]

The thus obtained polymer varnish was mixed with acetic anhydride (AA) and isoquinoline (IQ). A mixture of the polymer varnish, AA and IQ was flow-cast on an aluminum board, and then dried at a temperature of 100° C. for 5 minutes, so as to obtain a gel film. The thus obtained gel film was peeled off from the aluminum board, and fixed on a supporting frame. Then, the film fixed on the supporting frame was heated, at a temperature of 350° C. for 20 seconds, at a temperature of 450° C. for 20 seconds, and then at a temperature of 500° C. for 20 seconds, so as to perform ring-closing dehydration of the polyamic acid by drying the film. Thereby, a polyimide film having a thickness of 25 μm.

Properties of the thus obtained polyimide film were evaluated. Result of the evaluation is shown on Table 6. The evaluation of the properties of the polyimide film was carried out in the same manner as in Example 13.

It was confirmed that the polyimide film of Comparative Example 6 had a low initial adhesive strength (peel strength), and was not suitable for use as a substrate of laminate. Further, it was found that the polyimide film of Comparative Example 6 had a low etching speed and was not suitable for alkali etching.

Comparative Example 7

Into a separable flask, 770.1 g of DMF was poured as a polymerization solvent. Then, 36.3 g (0.181 mole) of ODA and 29.4 g (0.272 mole) of p-PDA were added in the separable flask. Mixture thereof was stirred at a temperature of 20° C., so as to prepare a diamine solution in which ODA and p-PDA were completely dissolved in DMF.

Into the diamine solution, 40.0 g (0.136) of BPDA was gradually added with stirring the diamine solution, and was completely dissolved in the diamine solution with stirring. Then, 64.3 g (0.295) of PMDA was gradually added into the diamine solution, and completely dissolved with stirring. Thereafter, the diamine solution was stirred for 40 minutes by using the stirring apparatus.

Furthermore, not more than 4.8 g (0.022 mole) of PMDA was gradually added into the mixture with stirring so as to attain a desired viscosity (here, not less than 200 Pa·s but not more than 400 Pa·s). Hereby, a reaction solution is prepared. Note that the reaction solution has a polyamic acid of 18.5% by weight based on a total weight of the reaction solution. Thereafter, the reaction mixture was cooled with stirring for one hour continuously so as to polymerize the diamine and the acid dianhydride into the polyamic acid, thereby obtaining a polyamic acid solution (polymer varnish).

The polyamic acid solution in a glass bottle was kept in a water bath for one hour, the water bath having a temperature kept at 23° C. After the one hour time, viscosity of the polyamic acid was measured by using the B-type viscometer. The measurement of the viscosity was carried out with a roller of No. 7 and a revolution speed of 4 rpm. The measurement showed that the polyamic acid solution had a viscosity of 250 Pa·s.

[Production of Polyimide Film]

The thus obtained polymer varnish was mixed with acetic anhydride (AA) and isoquinoline (IQ). A mixture of the polymer varnish, AA and IQ was flow-cast on an aluminum board, and then dried at a temperature of 100° C. for 5 minutes, so as to obtain a gel film. The thus obtained gel film was peeled off from the aluminum board, and fixed on a supporting frame. Then, the film fixed on the supporting frame was heated, at a temperature of 350° C. for 20 seconds, at a temperature of 450° C. for 20 seconds, and then at a temperature of 500° C. for 20 seconds, so as to perform ring-closing dehydration of the polyamic acid by drying the film. Thereby, a polyimide film having a thickness of 25 μm.

Properties of the thus obtained polyimide film were evaluated. Result of the evaluation is shown on Table 7. The evaluation of the properties of the polyimide film was carried out in the same manner as in Example 13. It was found that the polyimide film of Comparative Example 7 had a slow etching speed in performing alkali etching.

From the results of Examples 13 to 20, and Comparative Examples 3 to 7, it was confirmed that the polyimide film of the present invention is highly stable against harsh environment and has a fast alkali etching speed.

TABLE 3

|  | Ex. 13 | Ex. 14 | Ex. 15 | Ex. 16 |
|---|---|---|---|---|
| Mixing Ratio (Ratio in Mole %) | ODA 47.5 PDA 52.5 TMHQ 33.0 BPDA 5.0 PMDA 62.0 | ODA 42.9 PDA 57.1 TMHQ 33.0 BPDA 14.2 PMDA 55.8 | ODA 57.1 PDA 42.9 TMHQ 30.0 BPDA 14.2 PMDA 55.8 | ODA 40.0 PDA 60.0 TMHQ 40.0 BPDA 20.0 PMDA 40.0 |
| Modulus of Elasticity (kg/mm$^2$) | 616 | 648 | 577 | 580 |
| Coefficient of Linear Expansion (× 10-6 cm/cm/° C.) | 13 | 13 | 19 | 18 |
| Coefficient of Hygroscopic Expansion (ppm/% RH) | 6.4 | 6.3 | 8.7 | 5.0 |

TABLE 3-continued

|  | Ex. 13 | Ex. 14 | Ex. 15 | Ex. 16 |
|---|---|---|---|---|
| Retention Rate of Film after Harsh Environment Resistance Test (%) | 79 | 92 | 96 | 80 |
| Initial Peel Strength (N/cm) | 7.0 | 7.5 | 7.0 | 7.4 |
| Retention Rate of Peel Strength after Temp. Aging (%) | 35 | 64 | 37 | 60 |
| Alkali Etching Speed (μm/one side/min) | 0.16 | 0.13 | 0.12 | 0.20 |

Abbreviation:
Ex. stands for Example.
Temp. stands for Temperature.

TABLE 4

|  | Ex. 17 | Ex. 18 |
|---|---|---|
| Mixing Ratio (Ratio in Mole %) | ODA 42.8 PDA 57.2 TMHQ 30.0 BPDA 14.2 PMDA 55.8 | ODA 50.0 PDA 50.0 TMHQ 33.0 BPDA 5.0 PMDA 62.0 |
| Modulus of Elasticity (kg/mm$^2$) | 649 | 590 |
| Coefficient of Linear Expansion (× 10-6 cm/cm/° C.) | 11 | 15 |
| Coefficient of Hygroscopic Expansion (ppm/% RH) | 6.4 | 5.9 |
| Retention Rate of Film after Harsh Environment Resistance Test (%) | 82 | 73 |
| Initial Peel Strength (N/cm) | 7.6 | 7.8 |
| Retention Rate of Peel Strength after Temp. Aging (%) | 49 | 42 |
| Alkali Etching Speed (μm/one side/min) | 0.15 | 0.2 |

Abbreviation:
Ex. stands for Example.
Temp. stands for Temperature.

TABLE 5

|  | Ex. 19 | Ex. 20 |
|---|---|---|
| Mixing Ratio (Ratio in Mole %) | ODA 50.0 PDA 50.0 TMHQ 29.0 BPDA 17.0 PMDA 54.0 | ODA 41.7 PDA 58.3 TMHQ 29.2 BPDA 16.6 PMDA 54.2 |
| Modulus of Elasticity (kg/mm$^2$) | 560 | 635 |
| Coefficient of Linear Expansion (× 10-6 cm/cm/° C.) | 20 | 12 |
| Coefficient of Hygroscopic Expansion (ppm/% RH) | 6.3 | 5.8 |

TABLE 5-continued

|  | Ex. 19 | Ex. 20 |
| --- | --- | --- |
| Retention Rate of Film after Harsh Environment Resistance Test (%) | 92 | 85 |
| Initial Peel Strength (N/cm) | 8.2 | 7.3 |
| Retention Rate of Peel Strength after Temp. Aging (%) | 62 | 62 |
| Alkali Etching Speed (μm/one side/min) | 0.17 | 0.31 |

Abbreviation:
Ex. stands for Example.
Temp. stands for Temperature.

TABLE 6

|  | C. Ex. 3 | C. Ex. 4 | C. Ex. 5 | C. Ex. 6 |
| --- | --- | --- | --- | --- |
| Mixing Ratio (Ratio in Mole %) | ODA 50.0 PMDA 50.0 | ODA 75.0 PDA 25.0 PMDA 100 | ODA 50.0 PDA 50.0 TMHQ 50.0 PMDA 50.0 | PDA 50.0 BPDA 50.0 |
| Modulus of Elasticity (kg/mm$^2$) | 320 | 450 | 610 | 890 |
| Coefficient of Linear Expansion (× 10-6 cm/cm/° C.) | 31 | 16 | 14 | 12 |
| Coefficient of Hygroscopic Expansion (ppm/% RH) | 17 | 14 | 7 | 9 |
| Retention Rate of Film after Harsh Environment Resistance Test (%) | 40 | 10 | 30 | 80 |
| Initial Peel Strength (N/cm) | 10.2 | 9 | 7.1 | 5 |
| Retention Rate of Peel Strength after Temp. Aging (%) | 51 | 44 | 6 | 65 |
| Alkali Etching Speed (μm/one side/min) | 0.71 | −0.63 | 0.20 | 0.01 |

Abbreviation:
C. Ex stands for Comparative Example.
Temp. stands for Temperature.

TABLE 7

|  | C. Ex. 7 |
| --- | --- |
| Mixing Ratio (Ratio in Mole %) | ODA 40.0 PDA 60.0 BPDA 30.0 PMDA 70.0 |
| Modulus of Elasticity (kg/mm$^2$) | 590 |
| Coefficient of Linear Expansion (× 10-6 cm/cm/° C.) | 14.5 |
| Coefficient of Hygroscopic Expansion (ppm/% RH) | 16 |
| Retention Rate of Film after Harsh Environment Resistance Test (%) | 85 |
| Initial Peel Strength (N/cm) | 9.4 |
| Retention Rate of Peel Strength after Temp. Aging (%) | 59 |
| Alkali Etching Speed (μm/one side/min) | 0.03 |

Abbreviation:
C. Ex stands for Comparative Example.
Temp. stands for Temperature.

Example 21

In the present example, polyimide acid was produced by using a reactor provided with (i) a stainless separable flask as a reaction vessel, (ii) a stirring screw having two puddles (two-blade stirrer) as a stirring apparatus provided inside the separable flask, and (iii) a cooling apparatus having a cooling capacity of 20.9 kJ/min. In order to prevent water from being mixed in the polymerization, polymerization was carried in a nitrogen gas flowing through the reactor at a rate of 0.05 L/min, the nitrogen gas being dehydrated (desiccated) by passing through silica gel before being introduced into the reactor.

Into the separable flask, 533.2 g of N,N-dimethyl formamide (DMF) was poured as a polymerization solvent. Then, 27.80 g (0.139 mole) of 4,4-diaminodiphenyl ether (ODA) and 13.58 g (0.126 mole) of paraphenylene diamine (p-PDA) were added in the separable flask. Mixture thereof was stirred at a temperature of 20° C., so as to prepare a diamine solution in which ODA and p-PDA were completely dissolved in DMF.

Into the diamine solution, 40.0 g (0.087 mole) of p-phenylene bis(trimellitic monoester anhydride) (TMHQ) was gradually added with stirring the diamine solution, and was sufficiently dispersed in the diamine solution with stirring. The stirring was continued until the TMHQ thus dispersed was completely dissolved in the polymerization solvent.

Next, 3.9 g (0.013 mole) of 3,3',4,4'-biphenyl tetracarboxylic dianhydride (BPDA) was added therein, and stirred until BPDA was completely dissolved therein. Further, 34.00 g (0.156 mole) of PMDA was gradually added therein. Mixture was stirred until PMDA was completely dissolved therein, so as to obtain a polyamic acid solution. Thereafter, the mixture was mixed for 40 minutes by using a stirring apparatus.

Furthermore, not more than 1.76 g (0.008 mole) of PMDA was gradually added into the mixture with stirring so as to attain a desired viscosity (here, not less than 200 Pa·s but not more than 400 Pa·s). Hereby, a reaction solution is prepared. Note that the reaction solution has a polyamic acid of 18.5% by weight based on a total weight of the reaction solution. Thereafter, the reaction mixture was cooled with stirring for one hour continuously so as to polymerize the diamine and the acid dianhydride into the polyamic acid, thereby obtaining a polyamic acid solution (polymer varnish).

The polyamic acid solution in a glass bottle was kept in a water bath for one hour, the water bath having a temperature kept at 23° C. After the one hour time, viscosity of the polyamic acid was measured by using the B-type viscometer. The measurement of the viscosity was carried out with a roller of No. 7 and a revolution speed of 4 rpm. The measurement showed that the polyamic acid solution had a viscosity of 250 Pa·s.

[Production of Polyimide Film]

The thus obtained polymer varnish was mixed with acetic anhydride (AA) and isoquinoline (IQ). A mixture of the polymer varnish, AA and IQ was flow-cast on an aluminum board, and then dried at a temperature of 100° C. for 5 minutes, so as to obtain a gel film. The thus obtained gel film was peeled off from the aluminum board, and fixed on a supporting frame. Then, the film fixed on the supporting frame was heated at a temperature of 350° C. for 20 seconds, at a temperature of 450° C. for 20 seconds, and then at a temperature of 500° C. for 20 seconds, so as to perform ring-closing dehydration of the polyamic acid by drying the film. Thereby, a polyimide film having a thickness of 25 μm.

Properties of the thus obtained polyimide film were evaluated. Results of the evaluation are shown on Table 8. Note that the properties of the polyimide film were evaluated as follows.

[Coefficient of Linear Expansion]

By using a TMA instrument (Produce Code: 120C) manufactured by Seiko Electronic Co., Ltd., a coefficient of linear expansion was measured at a temperature elevated from 100° C. to 200° C. at a rate of 10° C./minute. The measurement was carried out in a flow of nitrogen gas.

[Modulus of Elasticity]

By using a tension testing instrument (autograph S-100-C) manufactured by Shimadzu Co., a modulus of elasticity was measured in conformity with ASTM-D882.

[Coefficient of Hygroscopic Expansion]

The coefficient of hygroscopic expansion is measured as follows: a 5 mm×20 mm piece of the polyimide film, on which a minimum weight was applied so as not to allow the piece to be slack, was saturated at a relative humidity of 30% RH, then a size of the piece was measured. The same procedure was repeated at a relative humidity of 80% RH. From results of both the measurements, a dimensional change ratio per a 1% difference in relative humidity as the coefficient of hygroscopic expansion.

[Peel Strength Measurement for Laminate Having a Metal Layer and the Polyimide Film]

As preprocess, one surface of the polyimide film was subjected to plasma treatment using argon ion, so as to remove, from the one surface, unnecessary organic compounds and the like. After the preprocess, nickel was vacuum deposited thereon by using a sputtering machine (NSP-6, produced by Showa Vacuum Co., Ltd.). The vacuum deposited nickel layer was a thin layer having a thickness of about 50 Angstroms(Å). Further, copper was vacuum deposited thereon to a thickness of about 2000 Å, thereby preparing a metallized polyimide film. Further, the metallized polyimide film was subjected to an electroplating method using a sulfuric copper solution so as to obtain a desired metal thickness (about 20 μm) of the metal layer, thereby preparing a laminate (the electroplating method may be performed as follows: the film article to be plated is dipped as the cathod into a solution containing copper ions and an anode is dipped opposite thereto, and then a direct current is passed therebetween to form a metal coated layer, under metal electroplating conditions of a temperature of 20° C. to 25° C. and a current density of 2 A/dm$^2$). A peel strength of the metal layer of the laminate was measured in conformity of JIS C-6471 as follows: A metal pattern of 1 mm thickness was prepared on the metal layer. The metal pattern was peeled to 90 degrees so as to evaluate the peel strength. The peel strength thus measured was put as PX (N/cm).

Moreover, the peel strength after harsh environment exposure was measured as follows.

(1) Peel Strength After Harsh Environment Exposure

The laminate was exposed to an environmental condition having a humidity of 100% RH and a temperature of 121° C. for 12 hours. Then, the peel strength of the metal and polyimide film was measured in conformity of JIS C-6471 as follows: A metal pattern of 1 mm thickness was prepared on the metal layer. The metal pattern was peeled to 90 degrees so as to evaluate the peel strength. The peel strength thus measured was put as PY(N/cm).

The retention rate of the peeling strength after harsh environment exposure was calculated by the following equation:

Retention Rate of Peeling Strength After Harsh Environment Exposure=$PY/PX\times 100$.

Examples 22 to 25

By following the same procedure as in Example 21, polyamic acid solutions respectively containing a diamine component and an acid dianhydride component in ratios shown on Tables 8 and 9 were obtained in Examples 22 to 25. After that, polyimide films were produced in the same manner as in Example 21. Then, properties of the films and peel strength of the laminate respectively using the films were evaluated. Results of the measurement are shown on Tables 8 and 9.

Comparative Example 8

Into a separable flask, 378.6 g of N,N-dimethyl formamide (DMF) was poured as a polymerization solvent. Then, 17.48 g (0.087 mole) of 4,4-diaminodiphenyl ether (ODA) and 9.44 g (0.087 mole) of p-PDA were added in the separable flask. Mixture thereof was stirred at a temperature of 20° C., so as to prepare a diamine solution in which ODA and p-PDA were completely dissolved in DMF.

Into the diamine solution, 40.0 g (0.087 mole) of TMHQ was gradually added with stirring the diamine solution, and was sufficiently dispersed in the diamine solution with stirring. The stirring was continued until the TMHQ thus dispersed was completely dissolved in the polymerization solvent. Then, 17.1 g (0.078 mole) of PMDA was gradually added into the diamine solution, and completely dissolved with stirring. Thereafter, the diamine solution was stirred for 40 minutes by using the stirring apparatus.

Furthermore, not more than 1.94 g (0.009 mole) of PMDA was gradually added into the mixture with stirring so as to attain a desired viscosity (here, not less than 200 Pa·s but not more than 400 Pa·s). Hereby, a reaction solution is prepared. Note that the reaction solution has a polyamic acid of 18.5% by weight and an acid dianhydride of 18.5% by weight based on a total weight of the reaction solution. Thereafter, the reaction mixture was cooled with stirring for one hour continuously so as to polymerize the diamine and the acid dianhydride into the polyamic acid, thereby obtaining a polyamic acid solution (polymer varnish).

Thereafter, the reaction mixture was cooled with stirring for one hour continuously so as to polymerize the diamine and the acid dianhydride into the polyamic acid, thereby obtaining a polyamic acid solution (polymer varnish).

The polyamic acid solution in a glass bottle was kept in a water bath for one hour, the water bath having a temperature kept at 23° C. After the one hour time, viscosity of the polyamic acid was measured by using the B-type viscometer. The measurement of the viscosity was carried out with a roller of No. 7 and a revolution speed of 4 rpm. The measurement showed that the polyamic acid solution had a viscosity of 250 Pa·s.

[Production of Polyimide Film]

The thus obtained polymer varnish was mixed with acetic anhydride (AA) and isoquinoline (IQ). A mixture of the polymer varnish, AA and IQ was flow-cast on an aluminum board, and then dried at a temperature of 100° C. for 5 minutes, so as to obtain a gel film. The thus obtained gel film was peeled off from the aluminum board, and fixed on a supporting frame. Then, the film fixed on the supporting frame was heated at a temperature of 350° C. for 20 seconds, at a temperature of 450° C. for 20 seconds, and then at a temperature of 500° C. for 20 seconds, so as to perform ring-closing dehydration of the polyamic acid by drying the film. Thereby, a polyimide film having a thickness of 25 μm.

Properties of the thus obtained polyimide film were evaluated. Result of the evaluation is shown on Table 10. The evaluation of the properties of the polyimide film was carried out in the same manner as in Example 21.

It was found that the polyimide film of Comparative Example 8 had a low stability against harsh environment. Further, it was also found that the polyimide film of Comparative Example 8 had a low retention rate of adhesive strength (peel strength) after harsh environment exposure, and was not suitable for use in a laminate.

The results of those Examples and Comparative Examples explain that it is difficult to produce a film that is satisfactory in terms of the various properties without using TMHQ, BPDA, PMDA, ODA, and PDA in the mixing ratio of the present invention.

TABLE 8

| | Ex. 21 | Ex. 22 | Ex. 23 |
|---|---|---|---|
| Mixing Ratio (Ratio in Mole %) | ODA 52.5 PDA 47.5 TMHQ 33.0 BPDA 5.0 PMDA 62.0 | ODA 52.8 PDA 47.2 TMHQ 30.0 BPDA 14.2 PMDA 55.8 | ODA 38.4 PDA 61.6 TMHQ 26.9 BPDA 23.1 PMDA 50.0 |
| Modulus of Elasticity (kg/mm$^2$) | 580 | 588 | 655 |
| Coefficient of Linear Expansion (× 10-6 cm/cm/° C.) | 14 | 17 | 15 |
| Coefficient of Hygroscopic Expansion (ppm/% RH) | 6.0 | 7.0 | 6.1 |
| Initial Peel Strength (N/cm) | 7.4 | 7.1 | 7.1 |
| Retention Rate of Peel Strength after Harsh Environment Exposure (%) | 31 | 37 | 53 |

Abbreviation:
Ex. stands for Example.

TABLE 9

| | Ex. 24 | Ex. 25 |
|---|---|---|
| Mixing Ratio (Ratio in Mole %) | ODA 52.4 PDA 47.6 TMHQ 28.6 BPDA 4.8 PMDA 66.6 | ODA 58.3 PDA 41.7 TMHQ 29.2 BPDA 16.6 PMDA 54.2 |
| Modulus of Elasticity (kg/mm$^2$) | 550 | 590 |
| Coefficient of Linear Expansion (× 10-6 cm/cm/° C.) | 15 | 17 |
| Coefficient of Hygroscopic Expansion (ppm/% RH) | 5.6 | 7.1 |
| Initial Peel Strength (N/cm) | 7.5 | 7.1 |
| Retention Rate of Peel Strength after Harsh Environment Exposure (%) | 40 | 32 |

Abbreviation:
Ex. stands for Example.

TABLE 10

| | C. Ex. 8 |
|---|---|
| Mixing Ratio (Ratio in Mole %) | ODA 50.0 PDA 50.0 TMHQ 50.0 PMDA 50.0 |
| Modulus of Elasticity (Kg/mm$^2$) | 610 |
| Coefficient of Linear Expansion (× 10-6 cm/cm/° C.) | 14 |
| Coefficient of Hygroscopic Expansion (ppm/% RH) | 7 |
| Initial Peel Strength (N/cm) | 7.1 |
| Retention Rate of Peel Strength after Harsh Environment Exposure (%) | 6 |

Abbreviation:
Ex. stands for Example.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A laminate comprising a metal layer and a polyimide film, the metal layer being directly formed on the polyimide film having a dynamic viscoelasticity whose tan δ peak is located in a range of not less than 310° C. but not more than 410° C., and whose tan δ value at 300° C. is not more than 0.05, the polyimide film prepared by copolymerizing an acid dianhydride component and a diamine component, the acid dianhydride component including a pyromellitic dianhydride represented by Equation (1):

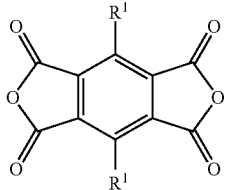
(1)

where $R^1$ is a residue selected from a group consisting of H—, $CH_3$—, $CF_3$, Cl—, Br—, F—, and $CH_3O$—, and $R^1$ may be the same residues or different residues, and the diamine component including a paraphenylene diamine and a diaminodiphenyl ether, the paraphenylene diamine being represented by Equation (2):

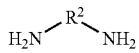
(2)

where $R^2$ is a bivalent aromatic group selected from a group consisting of:

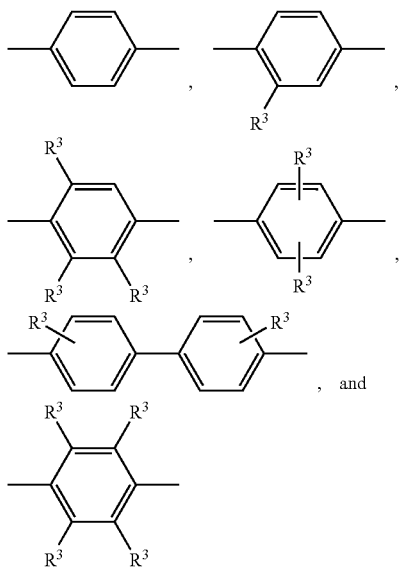

and each $R^3$ in the group is independently any one of —H, —$CH_3$, —OH, —$CF_3$, —$SO_4$, —COOH, —CO—$NH_2$, —Cl, —Br, —F, and —$OCH_3$, and the diaminodiphenyl ether being represented by General Formula (3):

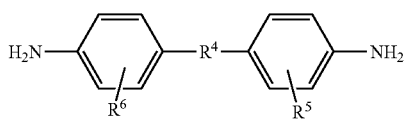
(3)

where $R^4$ is a bivalent organic group selected from a group consisting of:

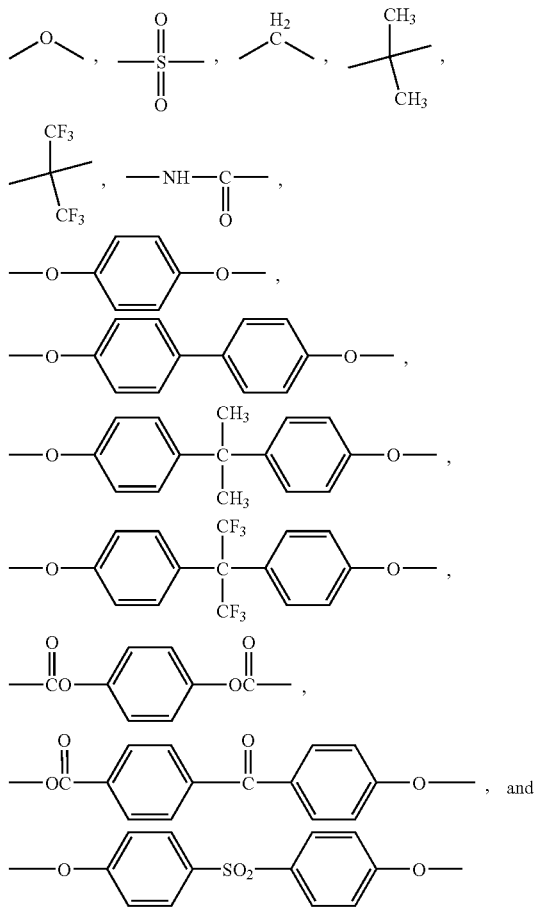

and each $R^5$ in the group is independently any one of —H, —$CH_3$, —OH, —$CF_3$, —$SO_4$, —COOH, —CO—$NH_2$, —Cl, —Br, —F, and —$OCH_3$, wherein:

the acid dianhydride component further includes a bis (trimellitic monoester anhydride)

being represented by General Formula (4):

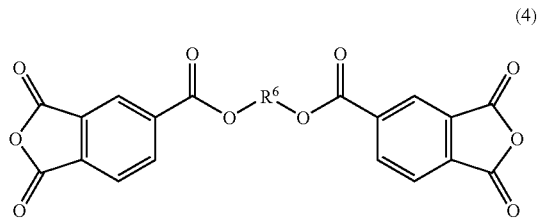
(4)

where $R^6$ is a bivalent organic group selected from a group consisting of:

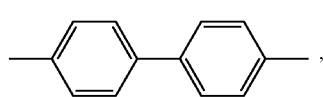

-continued

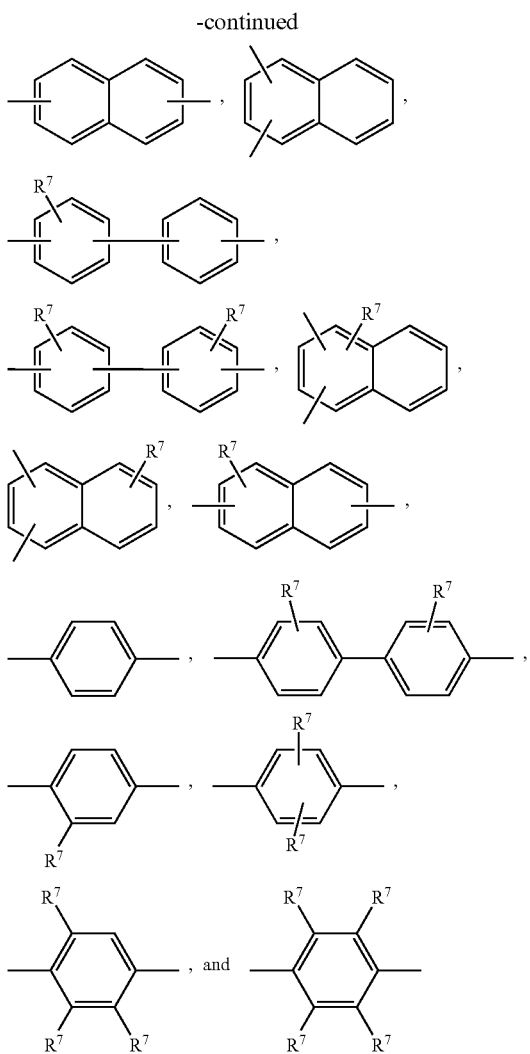

and each R⁷ is independently any one of —H, —CH₃, —OH, —CF₃, —SO₄, —COOH, and —CO—NH₂.

2. The laminate as set forth in claim 1, wherein:
the acid dianhydride component includes the pyromellitic dianhydride in a range of from 5 mole % to 90 mole %.

3. The laminate as set forth in claim 1, wherein:
the diamine component includes the paraphenylene diamine in a range of from 25 mole % to 75 mole %, and diaminodiphenyl ether in a range of from 25 mole % to 75 mole %.

4. The laminate as set forth in claim 1, wherein the acid dianhydride component includes the bis(trimellitic monoester anhydride) in a range of from 20 mole % to 40 mole %.

5. The laminate as set forth in claim 1, wherein:
the polyimide film has a coefficient of hygroscopic expansion is 16 ppm/% RH or less, and a water absorption percentage is 2.0% or less.

6. The laminate as set forth in claim 1, wherein the acid dianhydride component includes a biphenyl tetracarboxylic dianhydride represented by General Formula (5)

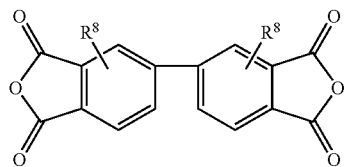

(5)

where R⁸ is a residue selected from a group consisting of H—, CH₃—, Cl—, Br—, F— and CH₃O—, and R⁸ may be the same residues or the different residues.

7. The laminate as set forth in claim 6, wherein
the acid dianhydride component includes the biphenyl tetracarboxylic dianhydride in a range of from 0 mole % to 50 mole %.

8. A polyimide film prepared by copolymerizing an acid dianhydride component and a diamine component,
the acid dianhydride component including a pyromellitic dianhydride represented by General Formula (1), a bis(trimellitic monoester anhydride) represented by General Formula (4), and a biphenyl tetracarboxylic dianhydride represented by General Formula (5),

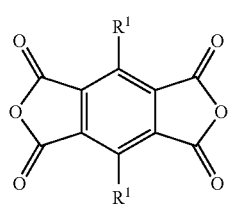

(1)

where R¹ is a residue selected from a group consisting of H—, CH₃—, CF₃, Cl—, Br—, F—, and CH₃O—, and R¹ may be the same residues or different residues,

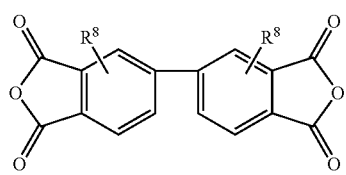

(5)

where R⁸ is a residue selected from a group consisting of H—, CH₃—, Cl—, Br—, F— and CH₃O—, and R⁸ may be the same residues or the different residues,

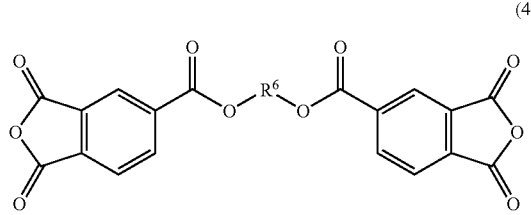

(4)

where $R^6$ is a bivalent organic group selected from a group consisting of:

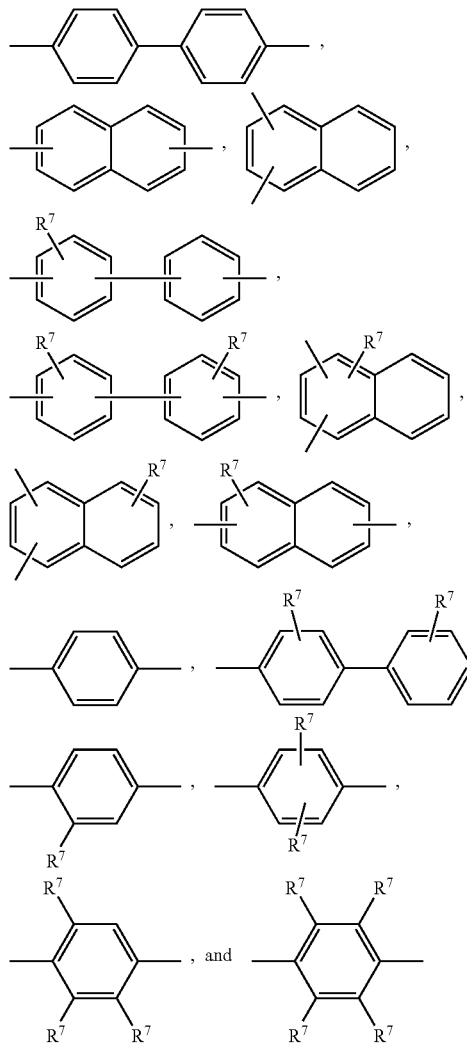

and each $R^7$ is independently any one of —H, —CH$_3$, —OH, —CF$_3$, —SO$_4$, —COOH, and —CO—NH$_2$, the diamine component including a paraphenylene diamine represented by General Formula (2) and a diaminodiphenyl ether represented by General Formula (3), and

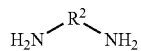 (2)

where $R^2$ is a bivalent aromatic group selected from a group consisting of:

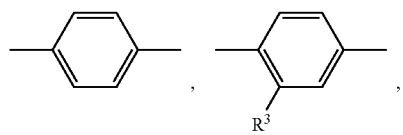

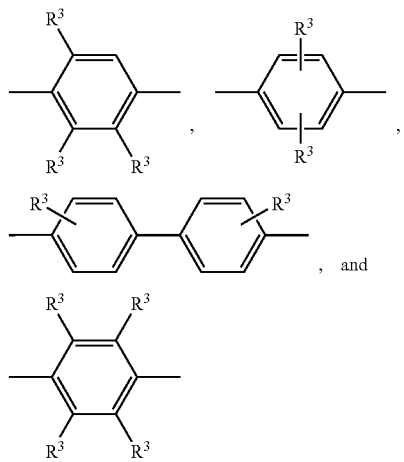

and each $R^3$ in the group is independently any one of —H, —CH$_3$, —OH, —CF$_3$, —SO$_4$, —COOH, —CO—NH$_2$, —Cl, —Br, —F, and —OCH$_3$, and the diaminodiphenyl ether being represented by General Formula (3):

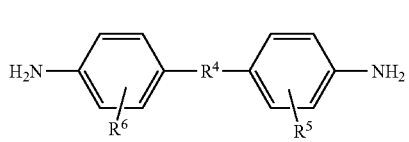 (3)

where $R^4$ is a bivalent organic group selected from a group consisting of:

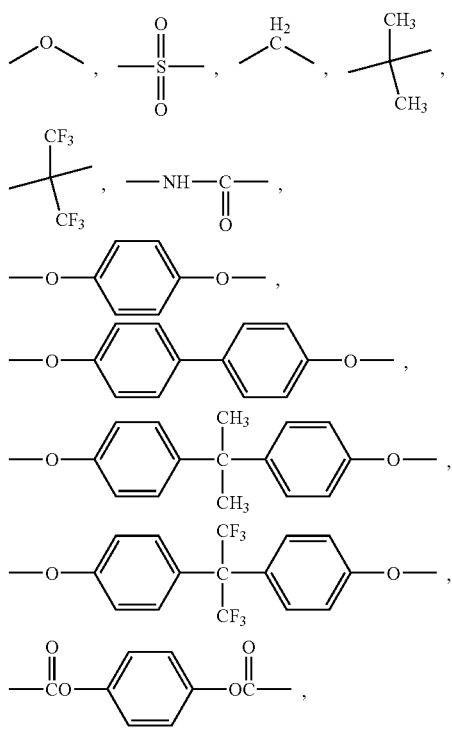

-continued

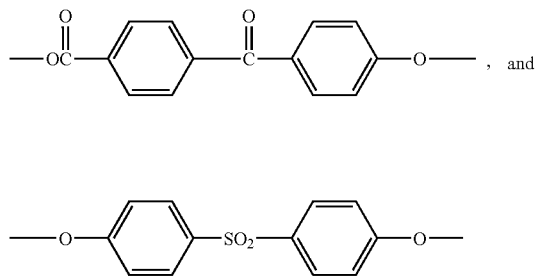
, and and each $R^5$ in the group is independently any one of —H, —CH$_3$, —OH, —CF$_3$, —SO$_4$, —COOH, —CO—NH$_2$, —Cl, —Br, —F, and —OCH$_3$,
the polyimide film having such an etching speed that one side thereof is etched with a 1N potassium hydroxide solution at an etching speed of 0.1 μm/minute (one aide) or higher.

9. The polyimide film as set forth in claim 8, wherein:
the acid dianhydride component includes the pyromellitic dianhydride in a range of from 30 mole % to 99.9 mole %, and the biphenyl tetracarboxylic dianhydride in a range of from 0.1 mole % to 50 mole %.

10. The polyimide film as set forth in claim 8, wherein:
the diamine component includes the paraphenylene diamine in a range of from 15 mole % to 85 mole %, and diaminodiphenyl ether in a range of from 15 mole % to 85 mole %.

11. The polyimide film as set forth in claim 8, wherein:
The acid dianhydride component includes the bis(trimellitic monoester anhydride) in a range of from 10 mole % to 50 mole %.

12. The polyimide film as set forth in claim 8, wherein:
a retention percent of tear-through resistance of the polyimide film after exposing the polyimide film to environment of a temperature of 150° C., a humidity of 100% RH, and 4 atmospheric pressure for 48 hours is not less than 50%.

13. A laminate comprising: a metal layer; and a polyimide that is manufactured with
a polyimide film that is prepared by copolymerizing an acid dianhydride component and a diamine component,
the acid dianhydride component including a pyromellitic dianhydride and a biphenyl tetracarboxylic dianhydride, the pyromellitic dianhydride being represented by General Formula (1):

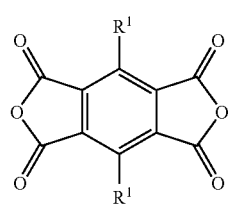 (1)

where $R^1$ is a residue selected from a group consisting of H—, CH$_3$—, CF$_3$, Cl—, Br—, F—, and CH$_3$O—, and $R^1$ may be the same residues or different residues, and a biphenyl tetracarboxylic dianhydride being represented by General Formula (5):

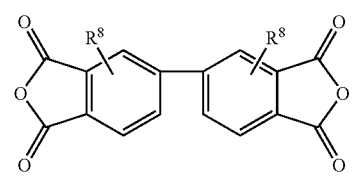 (5)

where $R^8$ is a residue selected from a group consisting of H—, CH$_3$—, Cl—, Br—, F— and CH$_3$O—, and $R^8$ may be the same residues or the different residues,
the diamine component including a paraphenylene diamine represented by General Formula (2)

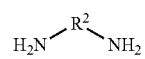 (2)

where $R^2$ is a bivalent aromatic group selected front a group consisting of:

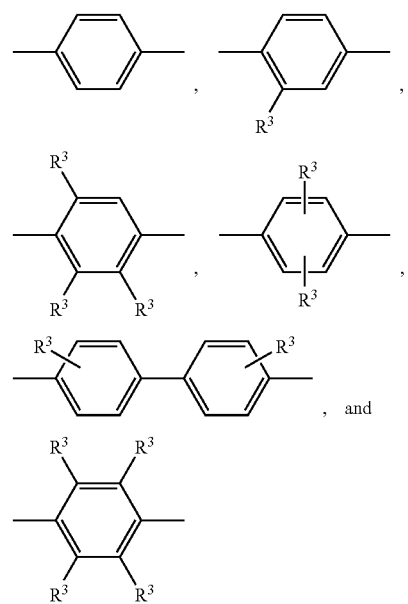
, and and each $R^3$ in the group is independently any one of —H, —CH$_3$, —OH, —CF$_3$, —SO$_4$, —COOH, —CO—NH$_2$, —Cl, —Br, —F, and —OCH$_3$, and a diaminodiphenyl ether represented by General Formula (3),

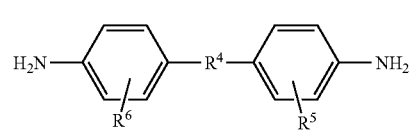 (3)

where $R^4$ is a bivalent organic group selected from a group consisting of:

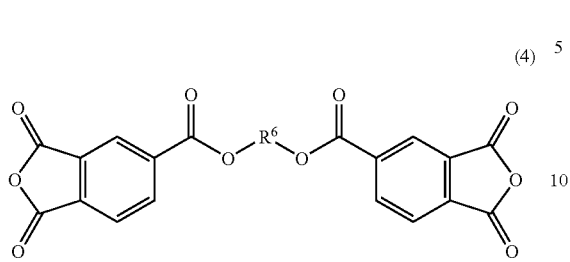
(4)

where $R^6$ is a bivalent organic group selected from a group consisting of:

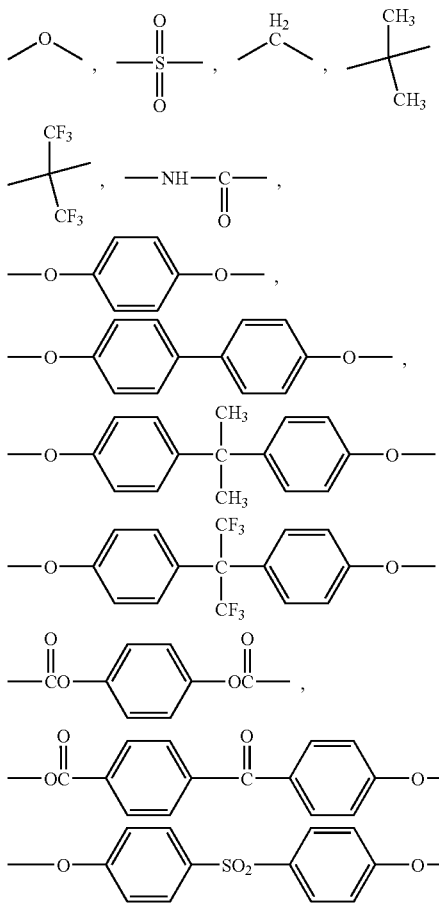

and each $R^5$ in the group is independently any one of —H, —CH$_3$, —OH, —CF$_3$, —SO$_4$, —COOH, —CO—NH$_2$, —Cl, —Br, —F, and —OCH$_3$, wherein:

the acid dianhydride component further including a bis (trimellitic monoester anhydride) represented by General Formula (4),

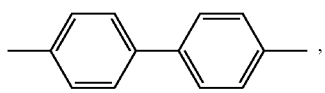

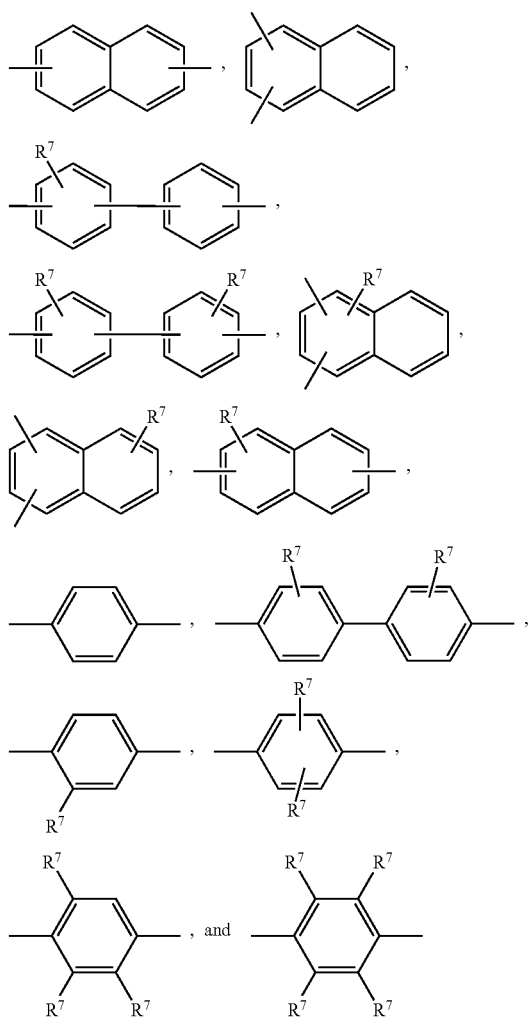

and each $R^7$ is independently any one of —H, —CH$_3$, —OH, —CF$_3$, —SO$_4$, —COOH, and —CO—NH$_2$, the polyimide film having such an etching speed that one side thereof is etched with a 1N potassium hydroxide solution at an etching speed of 0.1 μm/minute (one side) or higher.

14. A polyimide film prepared by copolymerizing an acid dianhydride component and a diamine component, the acid dianhydride component including the pyromellitic dianhydride, represented by General Formula (1), in a range of from 50 mole % to 70 mole %, the biphenyl tetracarboxylic dianhydride, represented by General Formula (5) in a range of from 1 mole % to 40 mole %, and the bis(trimellitic monoester anhydride, represented by General Formula (4), in a range of from 20 mole % to 50 mole %, and the diamine component including the paraphenylene diamine, represented by General Formula (2), in a range of 25 mole % to 75 mole %, and the diaminediphenyl ether, represented by General Formula (3), in a range of 25 mole % to 75 mole %, where General Formula (1) is:

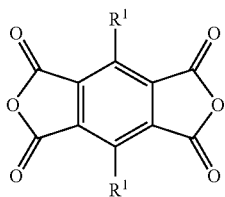
(1)

where $R^1$ is a residue selected from a group consisting of H—, $CH_3$—, $CF_3$, Cl—, Br—, F—, and $CH_3O$—, and $R^1$ may be the same residues or different residues;

General Formula (5) is:

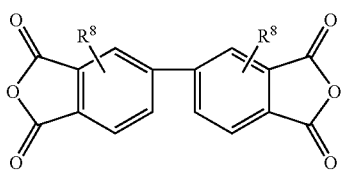
(5)

where $R^8$ is a residue selected from a group consisting of H—, $CH_3$—, Cl—, Br—, F— and $CH_3O$—, and $R^8$ may be the same residues or the different residues;

General Formula (4) is:

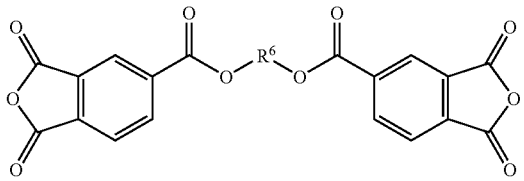
(4)

where $R^6$ is a bivalent organic group selected from a group consisting of:

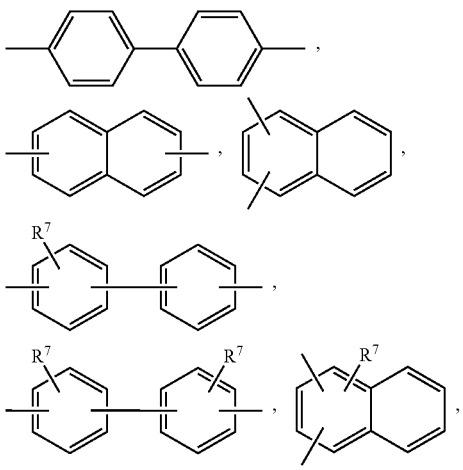

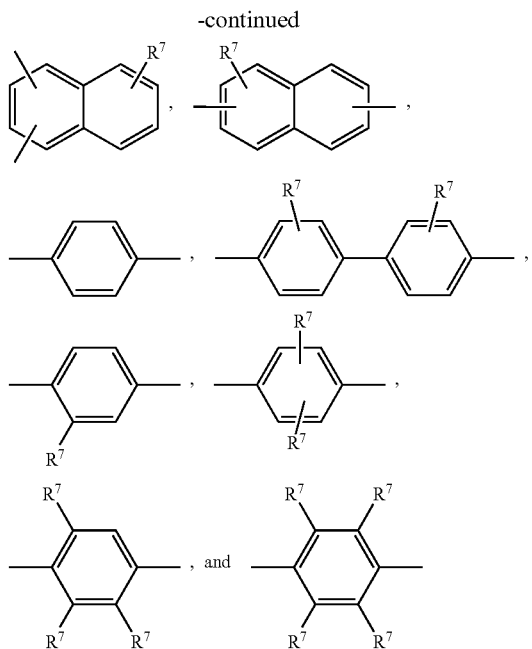

and each $R^7$ is independently any one of —H, —$CH_3$, —OH, —$CF_3$, —$SO_4$, —COOH, and —CO—$NH_2$;

General Formula (2) is:

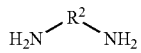
(2)

where $R^2$ is a bivalent aromatic group selected from a group consisting of:

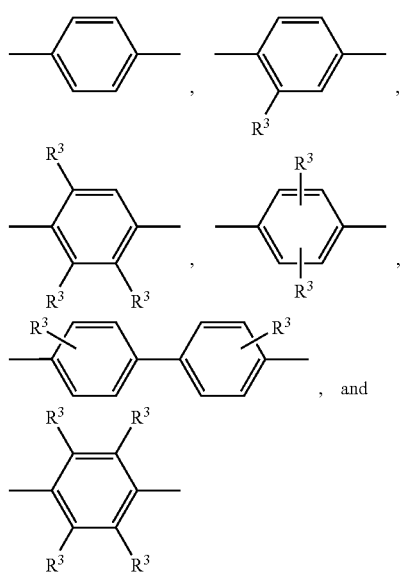

and each $R^3$ in the group is independently any one of —H, —$CH_3$, —OH, —$CF_3$, —$SO_4$, —COOH, —CO—$NH_2$, —Cl, —Br, —F, and —$OCH_3$; and General Formula (3) is:

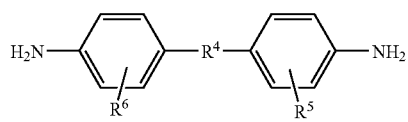

where R⁴ is a bivalent organic group selected from a group consisting of:

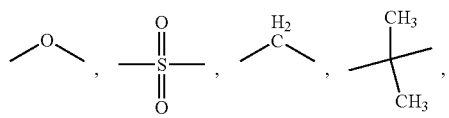

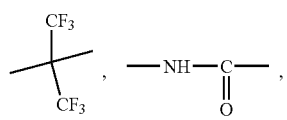

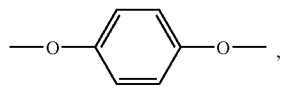

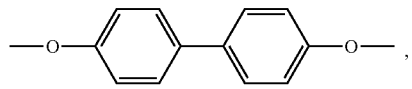

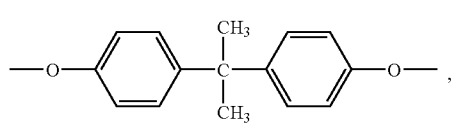

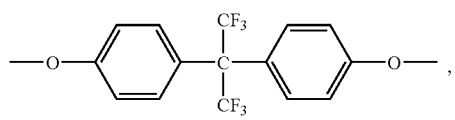

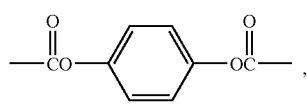

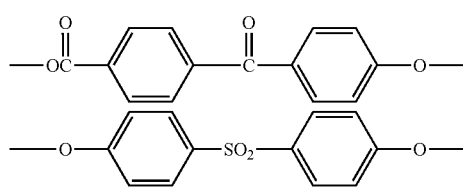

and each $R^5$ in the group is independently any one of —H, —CH₃, —OH, —CF₃, —SO₄, —COOH, —CO—NH₂, —Cl, —Br, —F, and —OCH₃.

15. The polyimide film as set forth in claim 14, the polyimide film having a thickness in a range of from 1 μm to 200 μm.

16. The polyimide film as set forth in claim 14, the polyimide film having a modulus of elasticity in a range of from 500 kg/mm² to 800 kg/mm².

17. The polyimide film as set forth in claim 14, the polyimide film having a coefficient of hygroscopic expansion in a range of from 2 ppm/% RH to 20 ppm/% RH.

18. The polyimide film as set forth in claim 14, the polyimide film having a coefficient of liner expansion in a range of 1 to 30×10⁻⁶ cm/cm/° C. at a temperature of from 100° C. to 200° C.

19. The polyimide film as set forth in claim 14, wherein:

a peel strength at an interface between the polyimide film and a metal layer of laminate is not less than 5N/cm, the laminate having the polyimide film and the metal layer that is formed on the polyimide film by vacuum depositing and electroplating; and a retention rate of the peel strength is not less than 10% after exposing the laminate to environment of a temperature of 121° C. and a humidity of 100% RH for 12 hours.

20. Laminate comprising:

a metal layer; and a polyimide film prepared by copolymerizing an acid dianhydride component and a diamine component, the acid dianhydride component including the pyromellitic dianhydride, represented by General Formula (1), in a range of from 40 mole % to 80 mole %, the biphenyl tetracarboxylic dianhydride, represented by General Formula (5) in a range of from 1 mole % to 40 mole %, and the bis(trimellitic monoester anhydride), represented by General Formula (4), in a range of from 20 mole % to 50 mole %, and the diamine component including the paraphenylene diamine, represented by General Formula (2), in a range of 25 mole % to 75 mole %, and the diamine-diphenyl ether, represented by General Formula (3), in a range of 25 mole % to 75 mole %, where General Formula (1) is:

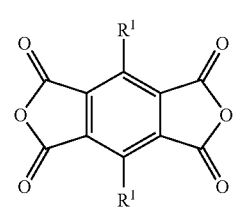

where $R^1$ is a residue selected from a group consisting of H—, CH₃—, CF₃, Cl—, Br—, F—, and CH₃O—, and $R^1$ may be the same residues or different residues;

General Formula (5) is:

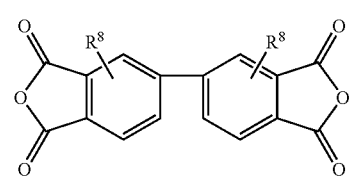

where $R^8$ is a residue selected from a group consisting of H—, CH₃—, Cl—, Br—, F— and CH₃O—, and $R^8$ may be the same residues or the different residues;

General Formula (4) is:

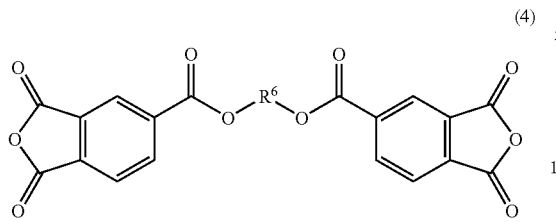
(4)

where R⁶ is a bivalent organic group selected from a group consisting of:

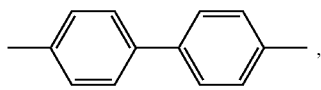

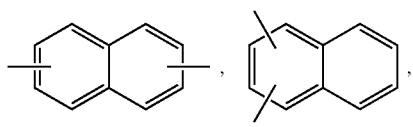

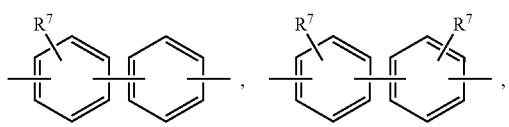

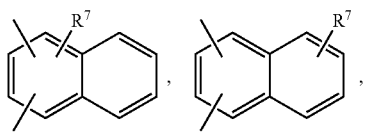

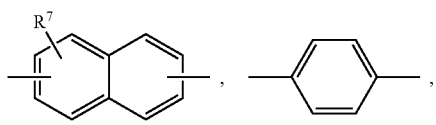

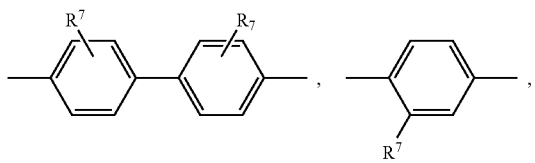

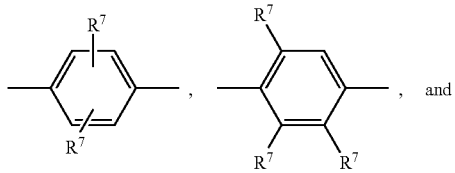

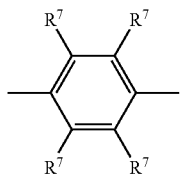

and each $R^7$ is independently any one of —H, —CH₃, —OH, —CF₃, —SO₄, —COOH, and —CO—NH₂;

General Formula (2) is:

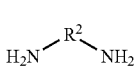
(2)

where $R^2$ is a bivalent aromatic group selected from a group consisting of:

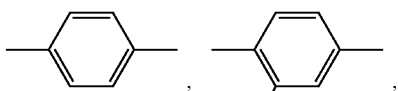

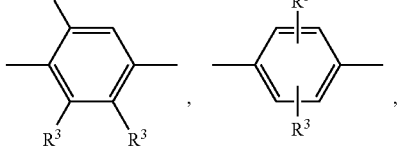

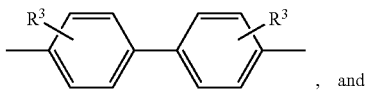

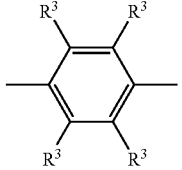

and each $R^3$ in the group is independently any one of —H, —CH₃, —OH, —CF₃, —SO₄, —COOH, —CO—NH₂, —Cl, —Br, —F, and —OCH₃; and General Formula (3) is:

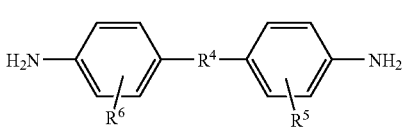
(3)

where $R^4$ is a bivalent organic group selected from a group consisting of:

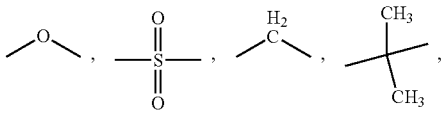

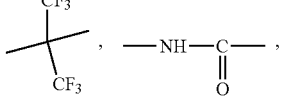

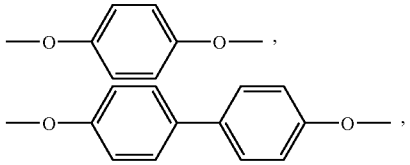

-continued

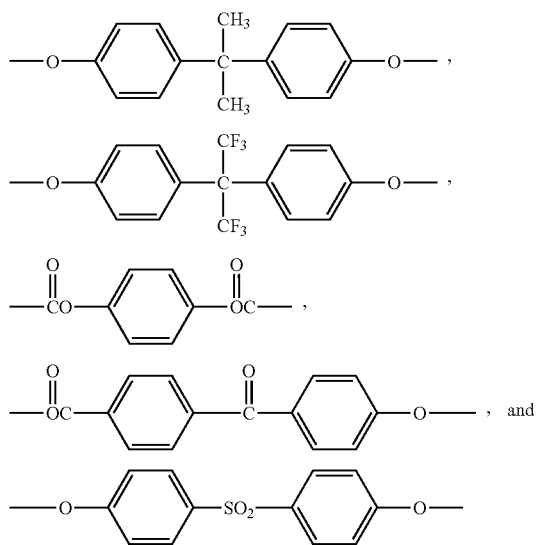

and each R⁵ in the group is independently any one of —H, —CH₃, —OH, —CF₃, —SO₄, —COOH, —CO—NH₂, —Cl, —Br, —F, and —OCH₃.

21. A polyimide film prepared by copolymerizing an acid dianhydride component and a diamine component, the acid dianhydride component including a pyromellitic dianhydride represented by General Formula (1),

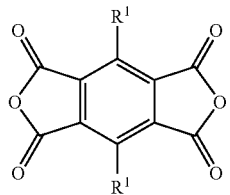 (1)

where R¹ is a residue selected from a group consisting of H—, CH₃—, CF₃, Cl—, Br—, F—, and CH₃O—, and R¹ may be the same residues or different residues, and the diamine component including a paraphenylene diamine represented by General Formula (2)

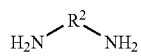 (2)

where R² is a bivalent aromatic group selected from a group consisting of:

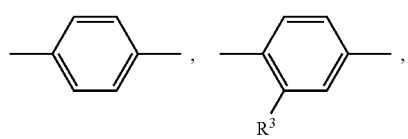

-continued

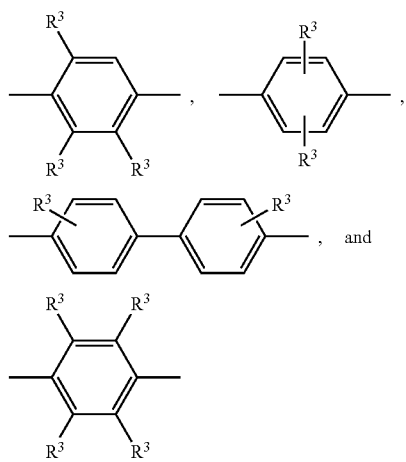

and each R³ in the group is independently any one of —H, —CH₃, —OH, —CF₃, —SO₄, —COOH, —CO—NH₂, —Cl, —Br, —F, and —OCH₃, and a diaminodiphenyl ether represented by General Formula (3),

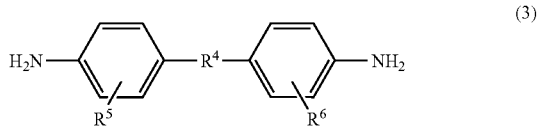 (3)

where R⁴ is a bivalent organic group selected from a group consisting of:

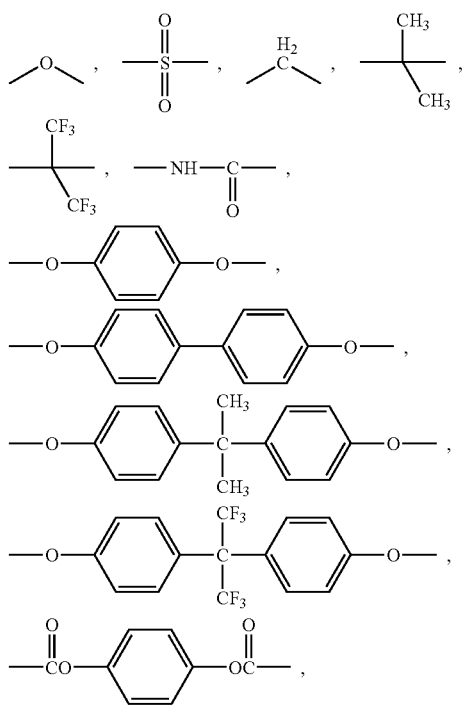

-continued

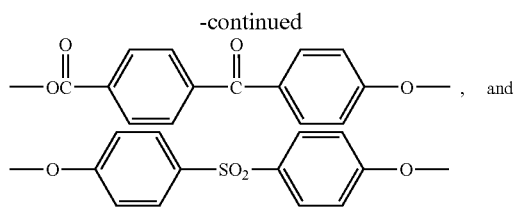
and

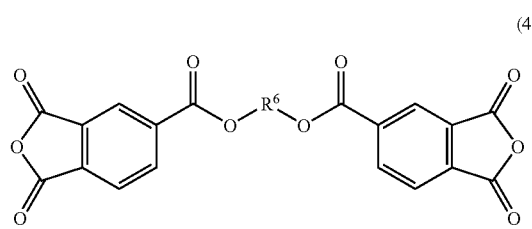

and each R⁵ in the group is independently any one of —H, —CH₃, —OH, —CF₃, —SO₄, —COOH, —CO—NH₂, —Cl, —Br, —F, and —OCH₃, wherein:
the acid dianhydride component further including a bis (trimellitic monoester anhydride) represented by General Formula (4), (4)

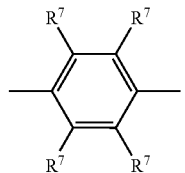

where R⁶ is a bivalent organic group selected from a group consisting of:

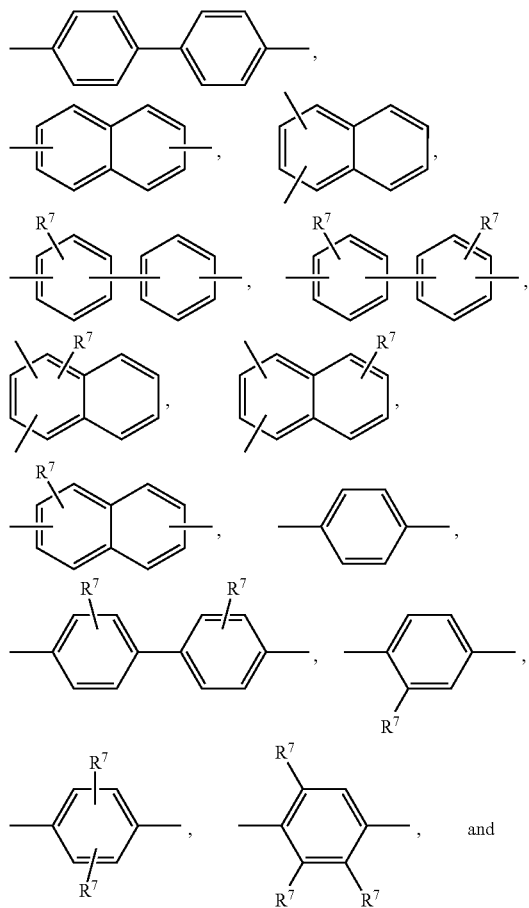

-continued

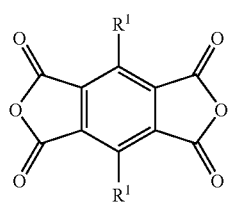

and each R⁷ is independently any one of —H, —CH₃, —OH, —CF₃, —SO₄, —COOH, and —CO—NH₂,
the polyimide film having a dynamic viscoelasticity whose tan δ peak is located in a range of not less than 310° C. but not more than 410° C., and whose tan δ value at 300° C. is not more than 0.05.

22. A polyimide film prepared by copolymerizing an acid dianhydride component and a diamine component,
the acid dianhydride component including a pyromellitic dianhydride represented by General Formula (1), (1)

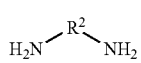

where R¹ is a residue selected from a group consisting of H—, CH₃—, CF₃, Cl—, Br—, F—, and CH₃O—, and R¹ may be the same residues or different residues, and
the diamine component including a paraphenylene diamine represented by General Formula (2)

(2)

H₂N—R²—NH₂ where R² is a bivalent aromatic group selected from a group consisting of:

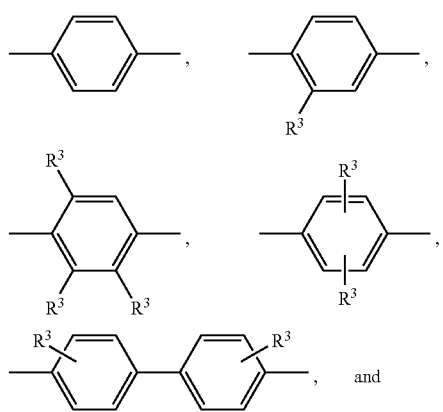

-continued

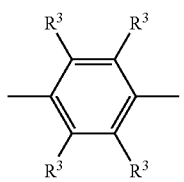

and each R³ in the group is independently any one of —H, —CH₃, —OH, —CF₃, —SO₄, —COOH, —CO—NH₂, —Cl, —Br, —F, and —OCH₃, and a diaminodiphenyl ether represented by General Formula (3),

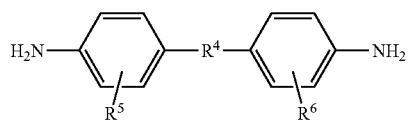

where R⁴ is a bivalent organic group selected from a group consisting of:

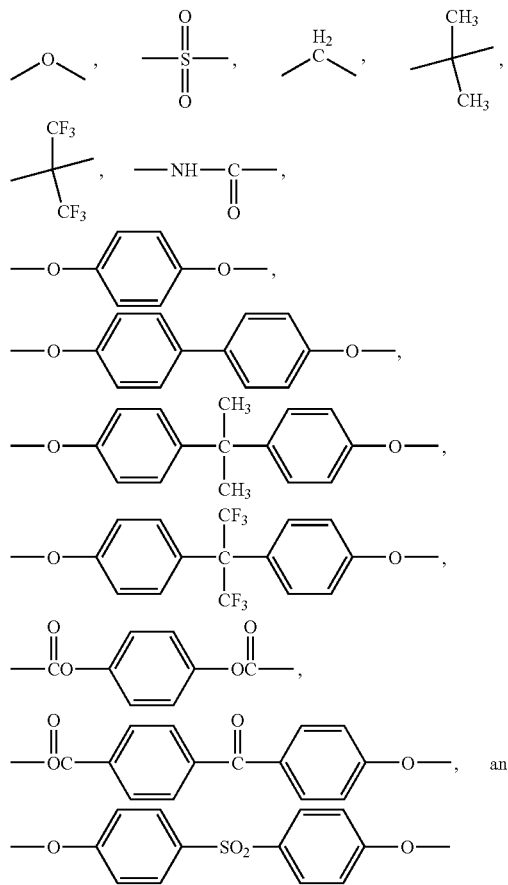

and each R⁵ in the group is independently any one of —H, —CH₃, —OH, —CF₃, —SO₄, —COOH, —CO—NH₂, —Cl, —Br, —F, and —OCH₃, wherein:

the acid dianhydride component further including a bis(trimellitic monoester anhydride) represented by General Formula (4),

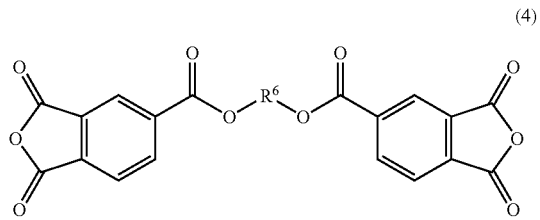

where R⁶ is a bivalent organic group selected from a group consisting of:

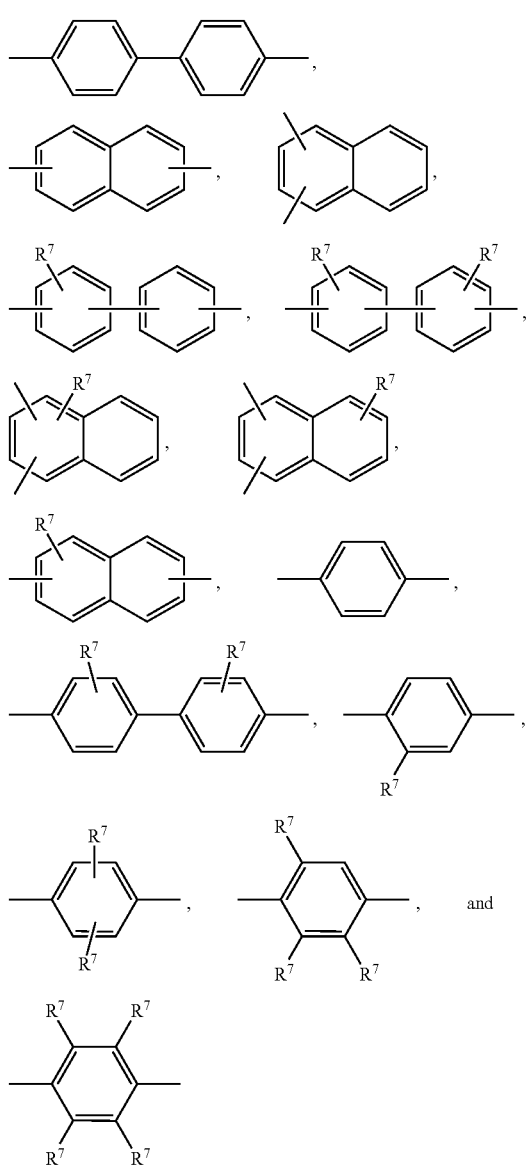

and each R⁷ is independently any one of —H, —CH₃, —OH, —CF₃, —SO₄, —COOH, and —CO—NH₂, and a biphenyl tetracarboxylic dianhydride represented by General Formula (5),

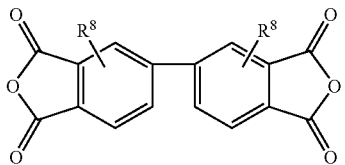
(5)

where $R^8$ is a residue selected from a group consisting of H—, $CH_3$—, Cl—, Br—, F— and $CH_3O$—, and $R^8$ may be the same residues or the different residues, the polyimide film having a dynamic viscoelasticity whose tan δ peak is located in a range of not less than 310° C. but not more than 410° C., and whose tan δ value at 300° C. is not more than 0.05.

23. A polyimide film in which a pyromellitic dianhydride represented by General Formula (1),

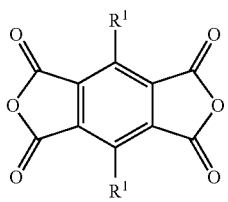
(1)

where $R^1$ is a residue selected from a group consisting of H—, $CH_3$—, $CF_3$, Cl—, Br—, F—, and $CH_3O$—, and $R^1$ may be the same residues or different residues, a paraphenylene diamine represented by General Formula (2)

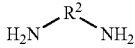
(2)

where $R^2$ is a bivalent aromatic group selected from a group consisting of:

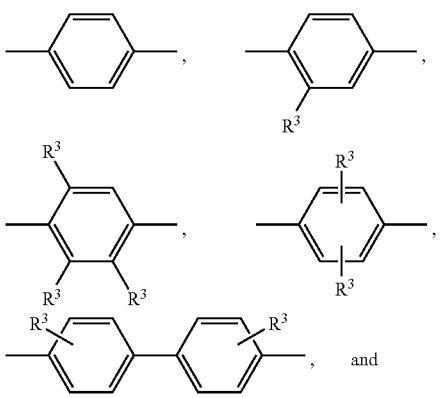

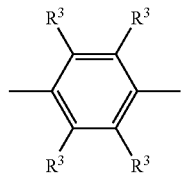

and each $R^3$ in the group is independently any one of —H, —$CH_3$, —OH, —$CF_3$, —$SO_4$, —COOH, —CO—$NH_2$, —Cl, —Br, —F, and —$OCH_3$, and a diaminodiphenyl ether represented by General Formula (3),

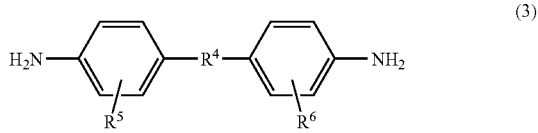
(3)

where $R^4$ is a bivalent organic group selected from a group consisting of:

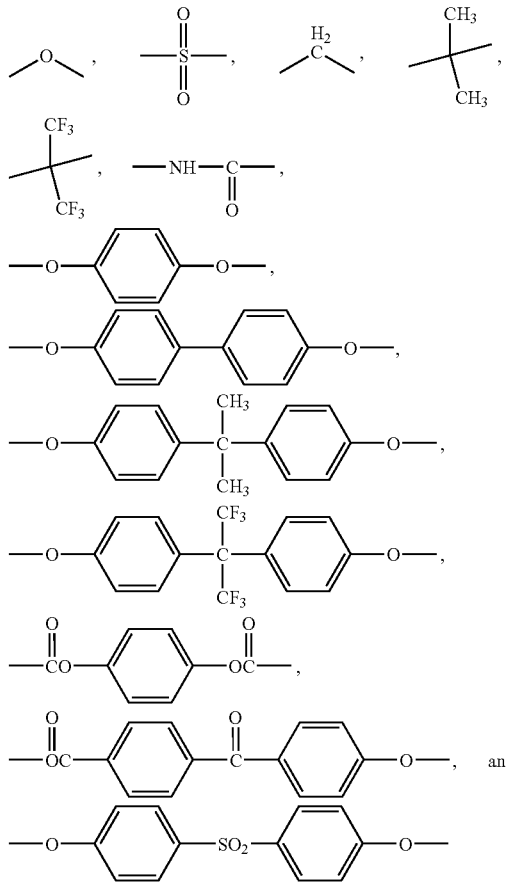

and each $R^5$ in the group is independently any one of —H, —$CH_3$, —OH, —$CF_3$, —$SO_4$, —COOH, —CO—$NH_2$, —Cl, —Br, —F, and —$OCH_3$, are co-polymerized as necessary components, the polyimide from being manufactured by a method in which 5 mole % to 50 mole % of p-phenylene bis(trimellitic monoester anhydride) is used as an acid dianhydride component, and in which a peak of tan δ in measuring dynamic viscoelasticity of the polyimide film is controlled in a range of 310° C. to 410° C.

* * * * *